US008734904B2

(12) United States Patent
Cheng et al.

(10) Patent No.: US 8,734,904 B2
(45) Date of Patent: May 27, 2014

(54) METHODS OF FORMING TOPOGRAPHICAL FEATURES USING SEGREGATING POLYMER MIXTURES

(75) Inventors: Joy Cheng, San Jose, CA (US); Hayato Namai, San Jose, CA (US); Charles Thomas Rettner, San Jose, CA (US); Daniel Paul Sanders, San Jose, CA (US); Ratnam Sooriyakumaran, San Jose, CA (US)

(73) Assignees: International Business Machines Corporation, Armonk, NY (US); JSR Corporation, Tokyo (JP)

( * ) Notice: Subject to any disclaimer, the term of this patent is extended or adjusted under 35 U.S.C. 154(b) by 848 days.

(21) Appl. No.: 12/957,008

(22) Filed: Nov. 30, 2010

(65) Prior Publication Data

US 2012/0135146 A1    May 31, 2012

(51) Int. Cl.
*B81C 1/00* (2006.01)
*B82Y 40/00* (2011.01)
*H01L 21/027* (2006.01)

(52) U.S. Cl.
USPC ........... 427/272; 427/256; 427/271; 427/275; 427/282; 427/58; 427/96.1; 427/98.4; 977/840; 977/882

(58) Field of Classification Search
CPC .............................................. B81V 2201/0149
See application file for complete search history.

(56) References Cited

U.S. PATENT DOCUMENTS

| | | | |
|---|---|---|---|
| 6,746,825 B2 | 6/2004 | Nealey et al. | |
| 6,860,956 B2 | 3/2005 | Bao et al. | |
| 6,926,953 B2 | 8/2005 | Nealey et al. | |
| 7,605,081 B2 | 10/2009 | Yang et al. | |
| 2008/0193658 A1 | 8/2008 | Millward | |
| 2008/0299774 A1 | 12/2008 | Sandhu | |
| 2009/0212016 A1 | 8/2009 | Cheng et al. | |
| 2009/0214823 A1 | 8/2009 | Cheng et al. | |
| 2009/0260750 A1 | 10/2009 | Nealey et al. | |
| 2010/0009132 A1 | 1/2010 | Cheng et al. | |
| 2010/0165512 A1 | 7/2010 | Albrecht et al. | |

OTHER PUBLICATIONS

Li et al., "Spatially Controlled Fabrication of Nanoporous Block Copolymers" Chem. Mater. 2004, 16, p. 3800-3808.
Sanders et al., "Fluoroalcohol Materials with Tailored Interfacial Properties for Immersion Lithography" Advances in Resist Materials and Processing Technology XXIV, Proceedings of SPIE (2007) v6519 p651904.

*Primary Examiner* — Michael Cleveland
*Assistant Examiner* — Lisha Jiang
(74) *Attorney, Agent, or Firm* — Michael R. Roberts

(57) ABSTRACT

Methods are disclosed for forming topographical features. In one method, a pre-patterned structure is provided which comprises i) a support member having a surface and ii) an element for topographically guiding segregation of a polymer mixture including a first polymer and a second polymer, the element comprising a feature having a sidewall adjoined to the surface. The polymer mixture is disposed on the pre-patterned structure, wherein the disposed polymer mixture has contact with the sidewall and the surface. The first polymer and the second polymer are segregated in a plane parallel to the surface, thereby forming a segregated structure comprising a first polymer domain and a second polymer domain. The first polymer domain and/or the second polymer domain are lithographically patterned, thereby forming topographical features comprising at least one of i) a first feature comprising a lithographically patterned first polymer domain and ii) a second feature comprising a lithographically patterned second polymer domain.

36 Claims, 25 Drawing Sheets

Apply Polymer Mixture

Segregation

Patternwise Exposure

First Development

Optional Second Development

1. Transfer
2. Strip

First Development

Patternwise Exposure

Second Development

Optional Third Development

↓ First Development

↓ Second Development

Patternwise Exposure

Third Development

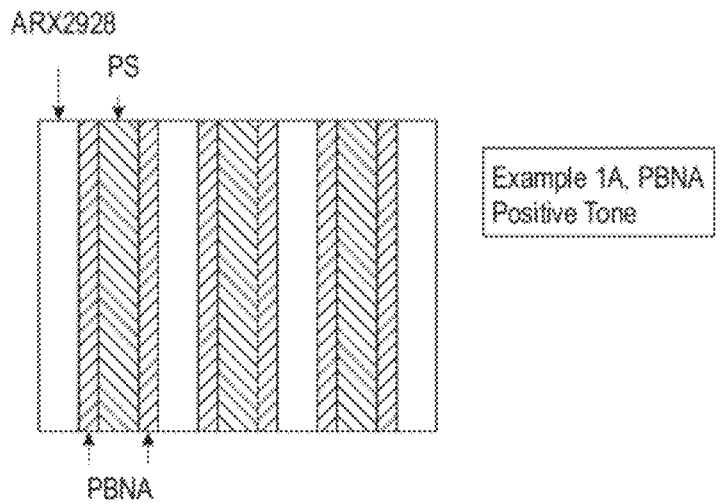
FIG. 5A
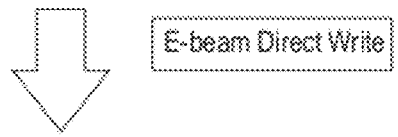
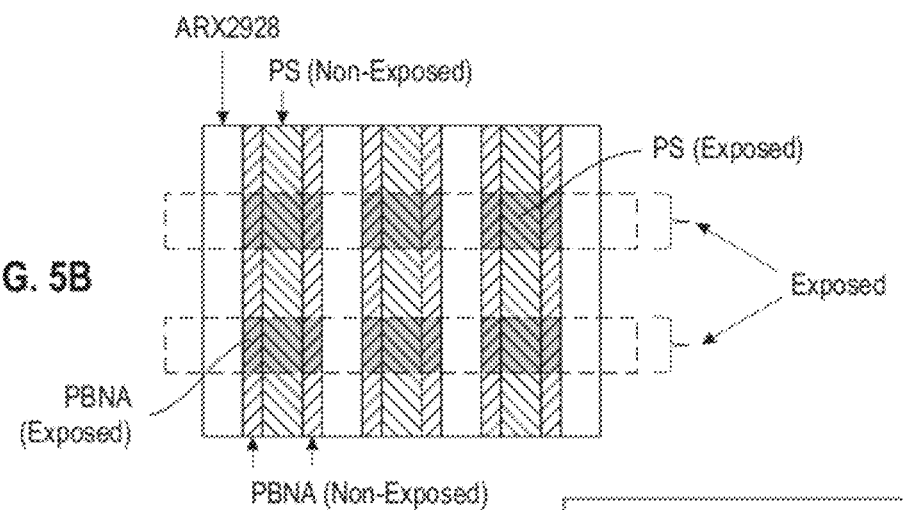
FIG. 5B
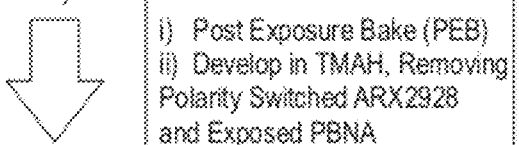

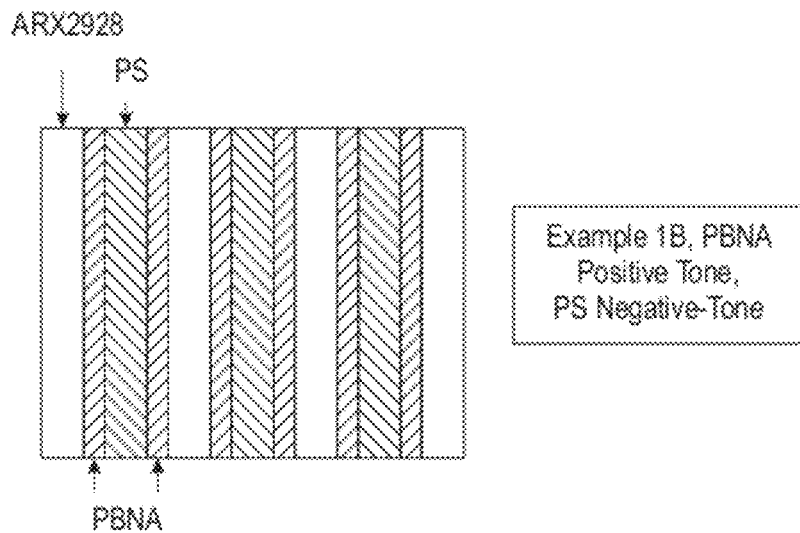
FIG. 6A
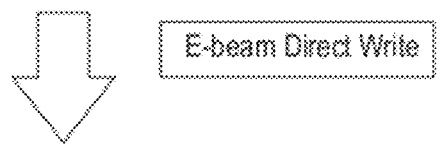
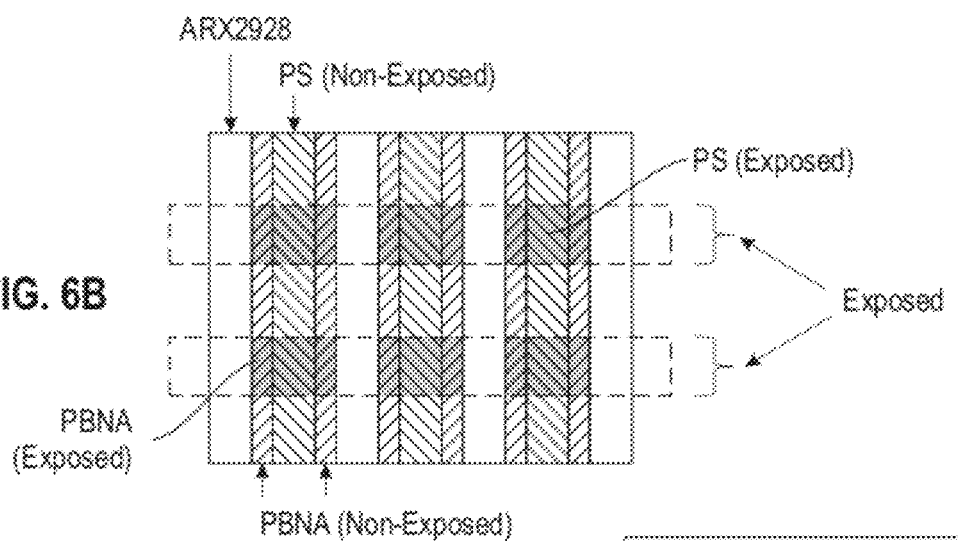
FIG. 6B
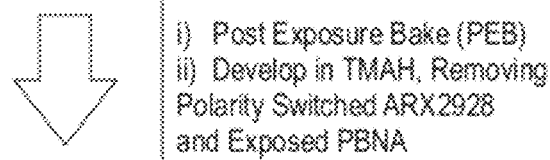

Example 2B, PBNA Positive Tone

Development in TMAH Removes ARX2928

E-beam Direct Write

PBNA (Non-Exposed)

PBNA Positive Tone

Example:
P1 = Pitch$_{guiding\ pattern}$ = 220 nm
P2 = Pitch$_{2nd\ pattern}$ = 100 nm

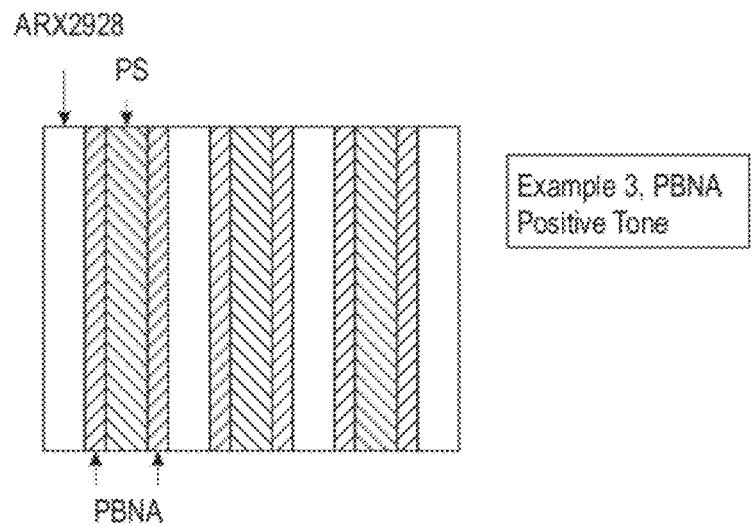
FIG. 9A
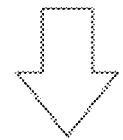
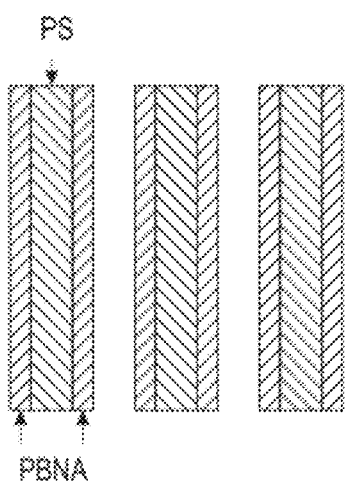
FIG. 9B
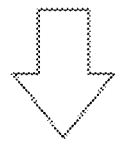

PBNA

E-beam Exposure

PBNA (Exposed)

PBNA (Non-Exposed)

Exposed i) Post Exposure Bake
ii) Development in TMAH, Removes Exposed PBNA

PBNA (Non-Exposed)

Non-Exposed Region
Spacers Directed by Guiding Patterns
P1 = Pitch$_{guiding\ pattern}$ =220 nm Exposed Region
Patterned Self-Assembled Spacers
PBNA Positive Tone
Example:
P1 = Pitch$_{guiding\ pattern}$ =220 nm
P2 = Pitch$_{2nd\ pattern}$ =120 nm

METHODS OF FORMING TOPOGRAPHICAL FEATURES USING SEGREGATING POLYMER MIXTURES

BACKGROUND

The present invention relates to methods of forming topographical features using segregating polymer mixtures, and more specifically to methods of forming topographical features utilizing lithographically patternable segregated polymers.

In the manufacture of integrated circuits, fabrication of patterns with smaller critical dimensions allows denser circuitry to be created. Self-segregating polymers provide a route to generate polymer features as described in US Patent Publication No. 20090212016 A1 to Cheng et al. and US Patent Publication No. 20090214823 A1, also to Cheng et al. The segregation process generates two or more compositionally distinct polymer domains. The methods have been used to produce wider lines having the same pitch (space shrinkage between lines) or double the number of lines per unit length (pattern doubling) compared to the pattern of features in the pre-patterned structure.

Despite these gains, many useful layouts for integrated circuits require more complicated patterns of features. Methods and materials are sought to extend the use of self-segregating polymers for the preparation of smaller critical dimension features.

SUMMARY

Accordingly, in an embodiment, a method is disclosed, comprising:

providing a pre-patterned structure comprising i) a support member having a surface, and ii) an element for topographically guiding segregation of a polymer mixture including a first polymer and a second polymer, the element comprising a feature having a sidewall adjoined to the surface;

disposing the polymer mixture on the pre-patterned structure, wherein the disposed polymer mixture has contact with the sidewall and the surface;

segregating, in a plane parallel to the surface, the first polymer and the second polymer, thereby forming a segregated structure comprising a first polymer domain and a second polymer domain; and lithographically patterning the first polymer domain and/or the second polymer domain, thereby forming topographical features comprising at least one of i) a first feature comprising a lithographically patterned first polymer domain and ii) a second feature comprising a lithographically patterned second polymer domain.

Another method comprises:

providing a pre-patterned structure comprising i) a support member having a surface and ii) a photoresist element for topographically guiding segregation of a polymer mixture, the polymer mixture comprising a first polymer and a second polymer, wherein a) the photoresist element is disposed on a portion of the support member, b) the photoresist element comprises a feature having a sidewall, and c) the sidewall adjoins the surface;

disposing the polymer mixture on the pre-patterned structure, wherein the polymer mixture has contact with the sidewall and the surface;

segregating, in a plane parallel to the surface, the first polymer and the second polymer, thereby forming a segregated structure comprising a first polymer domain and a second polymer domain;

selectively removing at least one of the photoresist element, the first polymer domain, and the second polymer domain, thereby forming a modified segregated structure, wherein the modified segregated structure comprises the first polymer domain and/or the second polymer domain; and lithographically patterning the first polymer domain and/or the second polymer domain, thereby forming topographical features comprising at least one of i) a first feature comprising a lithographically patterned first polymer domain and ii) a second feature comprising a lithographically patterned second polymer domain.

Another method comprises:

disposing on a pre-patterned structure a polymer mixture comprising a first polymer and a second polymer, wherein the pre-patterned structure comprises i) a support member having a surface and ii) a photoresist element for topographically guiding segregation of the polymer mixture, wherein a) the element is disposed on a portion of the support member, b) the element comprises a feature having a sidewall, c) the sidewall is adjoined to the surface, d) the sidewall comprises a first material, and e) a selective chemical affinity of the first polymer for the first material is greater than a selective chemical affinity of the second polymer for the first material;

segregating, in a plane parallel to the surface, the first polymer and the second polymer, thereby forming a segregated structure, wherein i) the segregated structure comprises a first polymer domain and a second polymer domain, ii) the sidewall contacts the first polymer domain, and iii) the sidewall has substantially no contact with the second polymer domain;

selectively removing the photoresist element;

lithographically patterning the first polymer domain and/or the second polymer domain, thereby forming topographical features comprising at least one of i) a first feature comprising a lithographically patterned first polymer domain and ii) a second feature comprising a lithographically patterned second polymer domain; and transferring a pattern formed by the topographical features to the support member.

Another method comprises:

disposing on a pre-patterned structure a polymer mixture comprising a first polymer and a second polymer, wherein the pre-patterned structure comprises i) a support member having a surface and ii) a photoresist element for topographically guiding segregation of the polymer mixture, wherein a) the element is disposed on a portion of the support member, b) the element comprises a feature having a sidewall, c) the sidewall is adjoined to the surface d) the sidewall comprises a first material, and e) a selective chemical affinity of the first polymer for the first material is greater than a selective chemical affinity of the second polymer for the first material;

segregating, in a plane parallel to the surface, the first polymer and the second polymer, thereby forming a segregated structure, wherein i) the segregated structure comprises a first polymer domain and a second polymer domain, ii) the sidewall contacts the first polymer domain, and iii) the sidewall has substantially no contact with the second polymer domain;

selectively removing in a first development process the photoresist element;

selectively removing in a second development process the first polymer domain or the second polymer domain;

lithographically patterning the first polymer domain and/or the second polymer domain, thereby forming topographical features comprising at least one of i) a first feature comprising a lithographically patterned first polymer domain and ii) a second feature comprising a lithographically patterned second polymer domain; and transferring a pattern formed by the topographical features to the support member.

The above-described and other features and advantages of the present invention will be appreciated and understood by those skilled in the art from the following detailed description, drawings, and appended claims.

BRIEF DESCRIPTION OF THE SEVERAL VIEWS OF THE DRAWINGS

FIG. 1A is an example of a pre-patterned structure comprising an element for topographically guiding polymer segregation. In this example, the element is a set of line features that are substantially parallel to each other, which are disposed on a support member (e.g., silicon wafer or silicon wafer having an antireflection layer). FIG. 1B shows the polymer mixture, including the first polymer and the second polymer, disposed on the pre-patterned structure before polymer segregation. The polymer mixture is located substantially in the trench areas of the line features. FIG. 1C shows a segregated structure formed by segregation of the first polymer and the second polymer. In this example, the segregated structure comprises two compositionally different polymer domains. One of the polymer domains has a higher affinity for the sidewall of the line features.

FIG. 2A is a perspective view of a schematic layer diagram of segregated structure 30 of FIG. 1C. The segregated structure is patternwise exposed by electron beam, x-ray, extreme ultraviolet, and/or other photon wavelengths. FIG. 2B is an overhead view of an exemplary e-beam bar pattern exposure given to the segregated structure 30, producing an exposed structure. FIG. 2C is a perspective view of a structure comprising a pattern of topographical features formed after one post-exposure development of the exposed structure. In this example, the exposed regions of the first polymer domain and the element are removed by the first development. FIG. 2D is a perspective view of a second structure comprising a second pattern of topographical features after an optional second post-exposure development. In this example, the non-exposed regions of the second polymer domain are selectively removed by the second post-exposure development.

" FIG. 3A is a perspective view of segregated structure 30 of FIG. 1C. FIG. 3B is a perspective view of a first developed structure obtained by developing the segregated structure in a first development process prior to a first patternwise exposure following segregation, thereby forming a modified segregated structure. In this example, the features of the element are selectively removed by the first development. The modified segregated structure is then lithographically patterned to form topographical features comprising a lithographically patterned polymer domain. FIG. 3C is an overhead view showing an exemplary e-beam bar pattern exposure given to the modified segregated structure, producing an exposed structure. FIG. 3D is a perspective view of a first structure formed by developing the exposed structure in a first post-exposure development process. In this example, the exposed regions of the first polymer domain are removed in the first post-exposure development process. FIG. 3E is a perspective view of a second structure obtained after optionally developing the first structure in a second post-exposure development process. In this example, the non-exposed regions of the second polymer domain are selectively removed in the second post-exposure development process.

" FIG. 4A is a perspective view of the segregated structure 30 of FIG. 1C. FIG. 4B is a perspective view of a first developed structure, obtained by developing the segregated structure in a first development process before the first patternwise exposure following segregation. In this example, the features of the element are selectively removed by the first development. FIG. 4C is a perspective view of a modified segregated structure obtained by developing the first developed structure in a second development process before the first patternwise exposure following segregation. In this example, the second polymer domain is selectively removed by the second development process, resulting in a line-space pattern of features comprising the first polymer domain of FIG. 4C. The features forming the line-space pattern of the modified segregated structure are then lithographically patterned to form topographical features. FIG. 4D is an overhead view showing an exemplary e-beam bar pattern exposure given to the line-space pattern of features of the modified segregated structure. FIG. 4E is a perspective view of the patterned structure obtained after developing the exposed structure in a first post-exposure development process. In this example, the exposed regions of the first polymer domain are selectively removed by the first post-exposure development.

FIGS. 5A to 5C are schematic overhead views of the structures formed in Example 1A, as one example of "patterning after segregation." FIG. 5A is the segregated structure. The photoresist element (line pattern) comprises ARX2928 (a methacrylate-type positive-tone 193 nm photoresist) from JSR. FIG. 5B shows the e-beam bar pattern exposure. FIG. 5C shows the topographical pattern formed after a single post-exposure development using aqueous tetramethylammonium hydroxide (TMAH), which contains non-exposed poly(bis [trimethylsilyl]methyl methacrylate-co-5-methacryloyloxy-2,6-norbornanecarbolactone-co-gamma-methacryloxy-gamma-methyl-gamma-butyrolactone) random copolymer (PBNA) domain, and exposed and non-exposed poly(styrene) PS domain. The photoresist element was removed in the development. The PBNA copolymer domain displays positive tone behavior. That is, the regions of exposed PBNA copolymer domain are selectively removed in the development process. The poly(styrene) (PS) domain was not crosslinked by the e-beam dosage used in Example 1A.

FIGS. 6A to 6D are schematic overhead views of the structures formed in Example 1B, another example of "patterning after segregation," this time at higher e-beam dosage. FIG. 6A is the segregated structure. The photoresist element (line pattern) comprises polarity-switched (i.e., deprotected) ARX2928 from JSR. FIG. 6B shows the e-beam bar pattern exposure applied to the segregated structure. The exposure step is followed by two post-exposure development processes. FIG. 6C shows the pattern of topographical features formed by a first post-exposure development process of the exposed structure using TMAH, which selectively removes the exposed regions of the PBNA domain (positive tone behavior) and the photoresist element. In this example, the exposed regions of the PS domain are crosslinked by the high dose e-beam exposure. FIG. 6D shows the pattern of topographical features resulting from a second post-exposure development process in cyclohexane, which selectively removes the non-exposed (non-crosslinked) regions of the PS domain (negative tone behavior).

" FIG. 7A is the segregated structure. The photoresist element (line pattern) comprises polarity-switched (i.e., deprotected) ARX2928 from JSR. The segregated structure of FIG. 7A is developed in a first development step using aqueous TMAH developer, which selectively removes the ARX2928 photoresist element to form a modified segregated structure. FIG. 7B shows the modified segregated structure comprising a pattern of alternating PBNA and PS lines separated by a space formerly occupied by the photoresist. The modified segregated structure is then patternwise exposed to e-beam. FIG. 7C shows the bar pattern exposure applied to the modified segregated structure. FIG. 7D shows the pattern of topographical features obtained after developing the exposed structure in a first post-exposure development process (using aqueous TMAH developer) that selectively removes the exposed regions of PBNA domain (positive tone behavior). The pattern of topographical features contains features comprising the non-exposed regions of PBNA domain, and features comprising the exposed and non-exposed regions of the PS domain. The exposed regions of the PS domain are not crosslinked by the e-beam exposure, and do not develop imagewise in the second development.

" FIG. 8A is the segregated structure. The photoresist element (line pattern) comprises polarity-switched (i.e., deprotected) ARX2928 from JSR. The segregated structure is developed in a first development step using aqueous TMAH developer, which selectively removes the ARX2928 photoresist element to form a modified segregated structure. FIG. 8B shows the modified segregated structure. The modified segregated structure is then patternwise exposed to e-beam. FIG. 8C shows the bar pattern exposure applied to the modified segregated structure. FIG. 8D shows a first patterned structure comprising a first pattern of topographical features obtained after a first post-exposure development (using aqueous TMAH developer) that selectively removes the exposed regions of the PBNA domain (positive tone). FIG. 8E shows a second patterned structure comprising a second pattern of topographical features formed after an optional second post-exposure development in cyclohexane, which removes both the exposed and the non-exposed regions of the PS domain (the exposed regions of the PS domain are not crosslinked by the e-beam exposure).

FIGS. 9A to 9E are schematic overhead views of the structures formed in Example 3, as an example of "patterning on spacers after second selective removal." FIG. 9A is the segregated structure. The photoresist element (line pattern) comprises polarity-switched (i.e., deprotected) ARX2928 from JSR. The segregated structure is developed in a first development process before the first patternwise exposure following segregation using aqueous TMAH developer. The first development selectively removes the ARX2928 photoresist element. FIG. 9B shows the first developed structure. The first developed structure is then given a second development before the first patternwise exposure following segregation, forming a modified segregated structure. The second development process is in cyclohexane, which removes the non-exposed regions of the PS domain forming a line-space pattern of features comprising PBNA. FIG. 9C shows the line-space pattern obtained after the second development. The modified segregated structure is then patternwise exposed to e-beam. FIG. 9D shows the e-beam bar pattern exposure applied to the line-space pattern. FIG. 9E shows the pattern of topographical features formed after developing the exposed structure in a first post-exposure development process using aqueous TMAH developer, which selectively removes the exposed regions of the PBNA domain (positive tone).

DETAILED DESCRIPTION

Figure 1A:
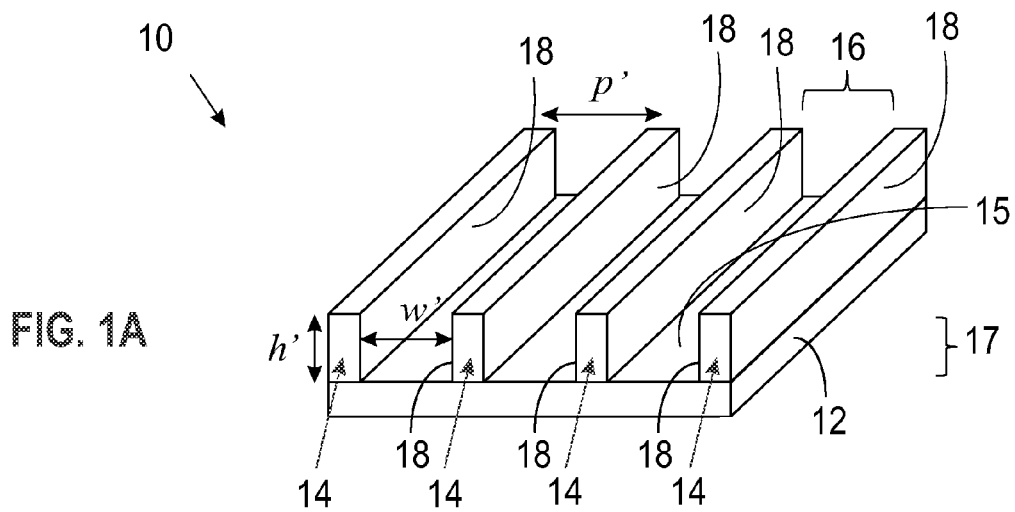
FIGS. 1A to 1C are perspective views of schematic layer diagrams showing a process of forming a segregated structure.

Methods are disclosed for generating topographical features having smaller critical dimensions using a polymer mixture that includes a first polymer and a second polymer, which are capable of segregating into two or more polymer domains. The first polymer and the second polymer are independent, non-covalently bound macromolecules. The polymer mixture is disposed on a pre-patterned structure comprising i) a support member (e.g., a silicon wafer) having a surface, and ii) an element for topographically guiding segregation of the polymer mixture (e.g., a lithographically patterned photoresist layer disposed on the support member), which is referred to as "element" or "photoresist element" in the following description. The disposed polymer mixture self-segregates and/or is induced to segregate, thereby forming a segregated structure comprising a first polymer domain and a second polymer domain. One or more of the polymer domains can be lithographically patterned. In an embodiment, the first polymer domain and the second polymer domain are independently lithographically patternable. The element can also be lithographically patternable. Alternatively, the element can be removed from the segregated structure in a development process before or after patternwise exposing the segregated structure. The segregated structure can be exposed one or more times and can be developed one or more times in any suitable order to generate topographical features comprising one or more lithographically patterned polymer domains.

The term "polymer domain" as used herein refers to a polymer composition that has laterally segregated from the disposed polymer mixture. Depending on the topography of the guiding element, lateral segregation can result in contiguous and/or non-contiguous regions of a segregated polymer composition. Herein, the term "polymer domain" includes all contiguous and noncontiguous regions of a laterally segregated polymer composition. These contiguous and non-contiguous regions of a laterally segregated polymer composition can be in the form of a regular pattern; for example, an alternating line pattern of features formed by two compositionally different polymer domains, wherein a first set of line features comprises the first segregated polymer composition, and the second set of line features comprises the second segregated polymer composition, as illustrated below in FIG. 1C. Using the line pattern example, the first polymer domain includes all the line features comprising the segregated first polymer.

At least two polymer domains, referred to as the first polymer domain and the second polymer domain, are formed by lateral segregation of immiscible polymer compositions from the polymer mixture. Intermixing of the polymer domains at the boundaries and/or imperfect segregation is acceptable providing the intermixing does not interfere with lithographic patterning of one or more of the polymer domains, and useful topographical features can be formed. For example, a domain composition can vary in a vertical direction relative to the surface of the support member. As another example, a thin wetting layer of the first polymer domain can reside between the second polymer domain and the surface of the support member, or vice versa. As another example, a thin wetting layer of the first polymer domain can reside between the second polymer domain and the air interface, or vice versa.

The term "photoresist" as used herein refers to a material used to prepare a photoresist element of the pre-patterned structure. A photoresist element can be prepared using conventional photoresist materials and lithographic methods. In general the photoresists are organic materials capable of polymerizing or undergoing a transformation upon exposure to electromagnetic radiation, such that the solubility characteristics of the photoresist material (e.g., its dissolution rate in a developing solvent) are changed relative to the non-exposed photoresist material. Examples of such photoresponsive materials include, but are not limited to, diazonaphthoquinone (DNQ)-based photoresists, such as cresol novolac resin (from Shipley), OZATEC PK 14 (from Hoechst), as well as other possible polymers including, inter alia, epoxy resins, polyanilines, polymethyl methacrylate, polystyrenes, and polydienes. More modern photoresists with higher resolution and higher sensitivity employ chemical amplification. Typically, these photoresists employ a photoacid generator (PAG) from which an acid molecule is photochemically generated as a result of exposure. In one example, this acid catalyzes a reaction such as the acidolysis of acid-labile protecting groups to generate polymer-bound carboxylic acid groups. The carboxylic acid groups facilitate dissolution of the deprotected photoresist polymer in an aqueous base developer. In another example, this acid can catalyze chemical reactions which result in crosslinking of the photoresist polymers, thereby rendering the exposed photoresist material insoluble in a developing solvent. The development of chemically amplified photoresists and many suitable examples thereof are detailed by H. Ito in "Chemical Amplification Resists for Microlithography," *Prog. Polym. Sci.* 2005, 172, 37-245. A particular photoresist material is ARX2928 from JSR, a commercial positive tone, methacrylate-type chemically-amplified 193 nm photoresist.

A lithographically patterned photoresist layer can be used directly as the element for guiding segregation provided it has sufficient solvent and thermal stability. That is, the patterned photoresist layer should not dissolve in the casting solvent used to apply the polymer mixture nor should it undergo substantial reflow during subsequent baking steps. For example, features comprising crosslinked negative-tone photoresist materials generally have high solvent resistance and thermal stability. Non-crosslinked photoresist materials typically display poorer solvent and thermal stability. Therefore, structures comprising typical positive-tone photoresists (which are not crosslinked) can be 'hardened' by chemical, photochemical, or thermal treatments to increase their solvent resistance and/or thermal stability.

Alternatively, the features of the lithographically patterned photoresist layer can be transferred into a more robust underlying layer such as a crosslinked anti-reflective coating (ARC) or an inorganic hardmask. After stripping the photoresist features, the more robust ARC or hardmask features would serve as the element to guide the segregation of the polymer mixture.

Herein, a given material (e.g., a polymer domain, and optionally the element) is lithographically patternable if patternwise exposing the material by electron beam, x-ray, ion beam, extreme ultraviolet and/or other wavelengths of photon radiation, and optionally baking the exposed material, causes a chemical change in the material such that a given development process selectively removes an exposed or a non-exposed region of the material. The chemical change can be a direct or an indirect result of the exposure. For example, an exposure can photochemically generate an acid molecule from a photoacid generator and this acid can be responsible for the chemical change. In another example, the exposure can directly result in the cleavage of chemical bonds in a segregated polymer resulting in a decrease in average molecular weight of the polymer. Alternatively, the exposure can result in crosslinking reactions of a segregated polymer (either directly or indirectly). Herein, development processes include solution processes (e.g., developing with aqueous tetramethylammonium hydroxide solution or an organic solvent) and plasma etch processes.

Herein, a "modified segregated structure" is a segregated structure that has been altered by a development process before any polymer domain formed by segregation is lithographically patterned. For example, the element, the first polymer domain, the second polymer domain, or combinations thereof, can be selectively removed from the segregated structure using one or more development processes. The modified segregated structure comprises at least one of the polymer domains formed by segregation. That is, the modified segregated structure comprises the first polymer domain and/or the second polymer domain.

Lithographic patterning comprises i) patternwise exposing a segregated structure or a modified segregated structure to electron beam, x-ray, ion beam, extreme ultraviolet and/or other wavelengths of photon radiation, thereby producing an exposed structure; and ii) imagewise developing the exposed structure (e.g., in aqueous base, organic solvent, and/or by plasma etching) in one or more development processes to form topographical features comprising a segregated polymer composition. The patternwise exposure can be performed using direct irradiation of a single beam (e.g., direct write e-beam lithography), direct irradiation using multiple beams (e.g., massively parallel e-beam lithography), direct irradiation of a shaped beam (e.g., projection e-beam lithography), irradiation through a mask (e.g., optical lithography using a photomask), irradiation using reflective optics (e.g., EUV lithography), interference lithography, holographic lithography, and other lithographic techniques known in the art. The patternwise exposure can be performed using contact, proximity, or projection lithography. The patternwise exposure can utilize an ultraviolet exposure at a wavelength from 450 nm to 120 nm using immersion lithography. In particular, immersion lithography can employ an immersion fluid comprising water or a saturated hydrocarbon.

Lithographic patterning of the first polymer domain and/or the second polymer domain of the segregated structure produces topographical features disposed on the support member surface that include at least one of i) a first feature comprising a lithographically patterned first polymer domain and ii) a second feature comprising a lithographically patterned second polymer domain. These topographical features are components of a multi-layered structure that further comprises the support member, and optionally the element, a portion of the element, or a modified element. The first feature can comprise exposed regions or non-exposed regions of the first polymer domain, and the second feature can comprise exposed regions or non-exposed regions of the second polymer domain. Thus, the multi-layered structure comprises at least one polymer, or a derivative thereof, of the disposed polymer mixture.

The pattern formed by the topographical features obtained by lithographic patterning of one or more of the polymer domains is not restricted to any particular pattern. Exemplary patterns include a grating of lines, an array of line segments, an array of circles, an array of multi-sided polygons, and combinations thereof. The pattern can include contiguous and/or non-contiguous geometric shapes. The pattern can include a combination of different patterns of topographical features on different areas of the support member surface. Moreover, an area of the support member surface can have disposed thereon none or all of the following compositions after lithographic patterning: i) exposed element, ii) non-exposed element, iii) exposed first polymer domain, iv) non-exposed first polymer domain, v) exposed second polymer domain, and vi) non-exposed second polymer domain, providing at least one other area of the support member surface has disposed thereon at least one feature comprising a lithographically patterned first polymer domain or a lithographically patterned second polymer domain.

The entire set of features overlying the support member after lithographically patterning one or more of the polymer domains forms a pattern that can optionally be transferred to the support member. The transfer pattern includes the pattern formed by the topographical features obtained by lithographic patterning of the first polymer domain and/or the second polymer domain, and optionally the pattern produced by the features of the element that guide polymer segregation.

A "modified element" refers to an element that has been altered as a result of a lithographic patterning process or some other treatment, which changes the composition, dimensions, surface properties and/or other characteristics of the element. The treatment can include a development process, a different chemical treatment, a thermal treatment, an exposure process, or a combination of any of the foregoing treatments. In an embodiment, the process of lithographic patterning removes the element from the segregated structure.

"Imagewise development" means the development process selectively removes an exposed or a non-exposed region of a given material. As a non-limiting example, imagewise development can selectively remove the exposed regions of a first polymer domain without removing the exposed regions or the non-exposed regions of a second polymer domain. As another example, imagewise development can selectively remove the exposed regions of a first polymer domain and the non-exposed regions of a second polymer domain.

"Imagewise developing in one or more development processes" means that at least one of the development processes selectively removes an exposed or a non-exposed region of a given material. A second of the one or more development processes can, for example, remove non-imagewise, the element or a different polymer domain.

An exemplary pre-patterned structure 10 is shown in FIG. 1A. Pre-patterned structure 10 comprises i) support member 12 having surface 15 and ii) element 17 comprising a set of features 14 for topographically guiding segregation of a polymer mixture that includes a first polymer and a second polymer. Element 17 is disposed on a portion of support member 12. Surface 15 can extend between support member 12 and element 17. Alternatively, element 17 can be disposed on a surface of support member 12 having a different composition than surface 15. Features 14 have sidewalls 18 adjoined to surface 15. In an embodiment, the element comprises a grating disposed on the support member, the grating comprising line features that are substantially parallel to each other, as exemplified by features 14 of FIG. 1A. Features 14 have pitch p', and sidewalls 18 have height h'. Features 14 can comprise an inorganic material and or an organic material, such as a photoresist. Sidewalls 18 guide polymer segregation. Sidewalls 18 comprise a first material, which can be the same material as that of features 14, or a material applied to features 14 to modify the surface properties of features 14. For example, features 14 can comprise a photoresist, and the first material can be the photoresist or another material applied to the photoresist to alter the surface properties. The first polymer of the polymer mixture has a higher affinity for the first material than the second polymer of the polymer mixture. As shown, each of the linear guiding features 14 comprise two sidewalls 18. Trench areas 16 have width w', bounded by sidewalls 18 and surface 15. Surface 15 can be essentially perpendicular to sidewalls 18. Element 17 comprises at least one feature 14, and at least one sidewall 18.

Sidewalls 18 can have a height h' (i.e., vertical thickness) of 5 nm to 500 nm, more particularly 10 nm to 250 nm. Trench areas 16 can be any width w' suitable for the intended pattern of topographical features. More particularly, w' can be 5 nm to 1000 nm, and even more particularly 10 nm to 500 nm. Pitch p' of features 14 can be a value greater than w'.

Pre-patterned structure 10 can comprise many other topographical features, for example, holes, trenches, vias, posts, lines, or a combination of these, not shown. Moreover, the surfaces that guide polymer segregation can extend into the support member 12. The element 17 can comprise one or more layers of inorganic materials, organic materials, or combinations thereof. For example, sidewalls 18 can comprise one or more surfaces of one or more layers of organic materials. Likewise, the support member 12 can comprise one or more layers of inorganic materials, organic materials, or combinations thereof. The segregation guiding features of the element can be contiguous or non-contiguous as necessary in order to form a pattern of topographical features that include holes, posts, islands, lines, and trenches, etc., any of which can be isolated or nested. Features 14 of the element 17 can be formed by a process such as patterning a photoresist, patterning an inorganic material, etching, chemical vapor deposition, sputtering, atomic layer deposition, coating, chemical attachment, or combinations thereof. Chemical attachment can comprise the use of chemical shrink materials, chemical freeze materials, surface curing agents, and reactive gases (such as silylation agents) to deposit layers onto the support member.

Element 17 can be treated photolytically and/or thermally to minimize the interaction of element 17 with a solvent used to cast the polymer mixture. For example, element 17 can comprise a photoresist material that can be flood exposed by ultraviolet radiation at a dose of about 10 $mJ/cm^2$ to 500 mJ/cm$^2$ and then baked at 80° C. to 130° C. for 10 sec to 180 seconds, thereby crosslinking the photoresist material and/or switching the polarity of the photoresist material to lower the solubility of the photoresist material in a casting solvent. A second baking step at higher temperatures of 150° C. to 250° C. for 10 seconds to 600 seconds can further increase solvent resistance of the photoresist material.

Element 17 can be treated chemically to minimize the interaction of element 17 with a solvent used to cast the polymer mixture and/or to tune interactions with the polymer mixture. For example, chemical freeze materials or surface curing agents can be employed to increase the thermal or solvent stability of a photoresist structure. In another example, a chemical shrink material, chemical freeze material, surface curing agent, vapor phase silylation agent, and the like can be used to alter the surface chemistry of the element and/or support member in order to tune interactions with components of the polymer mixture.

Sidewalls 18 of element 17 have different surface properties than surface 15, such that sidewalls 18 are capable of guiding segregation of the polymer mixture. Segregation occurs substantially in a plane parallel to a plane of the surface of the support member, as exemplified in FIG. 1C. That is, segregation occurs in a lateral (horizontal) direction relative to a plane of the surface, as opposed to vertical segregation, which occurs substantially in a direction orthogonal to the plane of the surface. In an embodiment, segregation occurs exclusively in a lateral direction parallel to a plane of the surface of the support member.

Figure 1B:
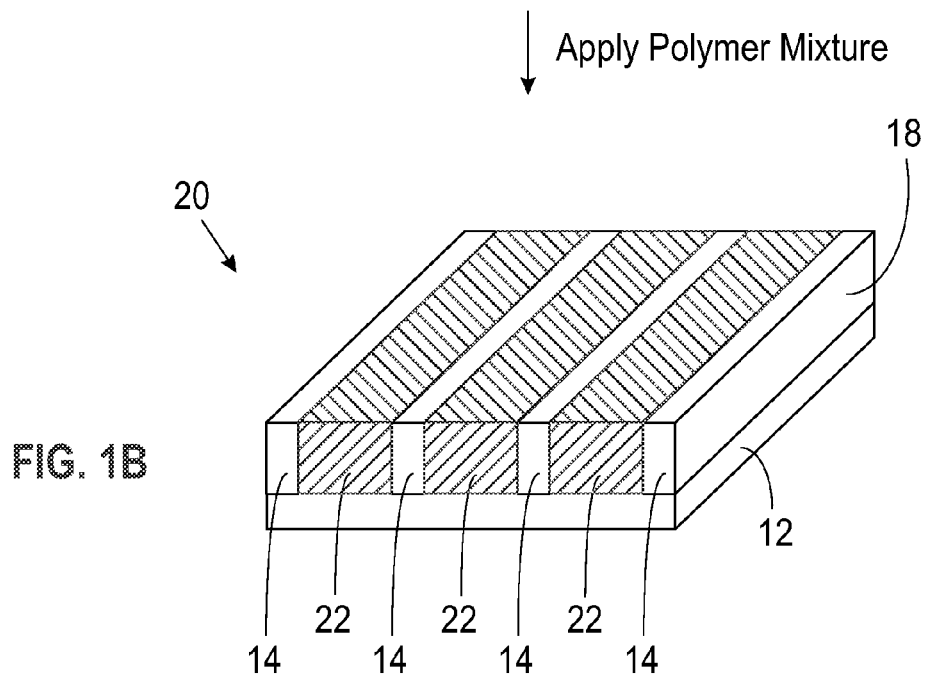
Figure 1C:
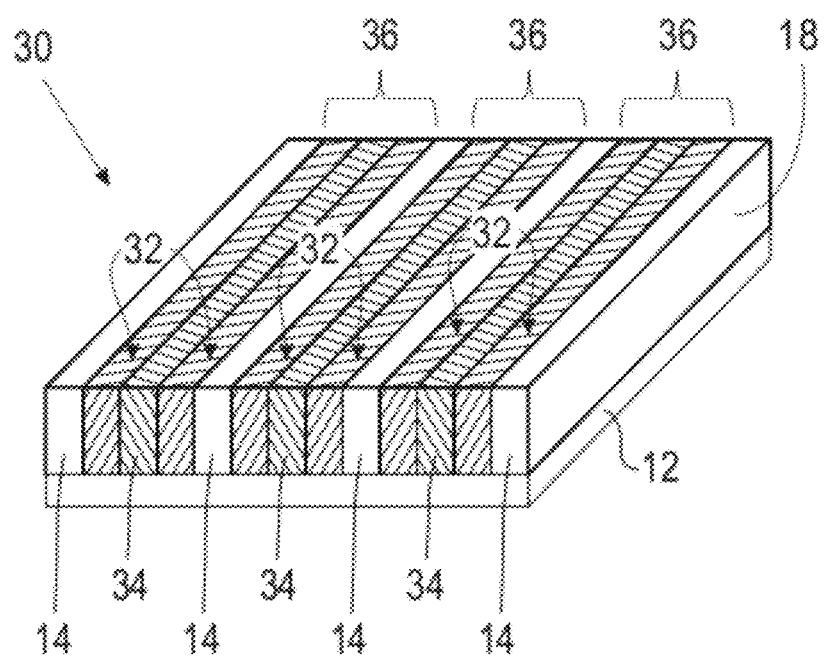

FIGS. 1B to 1C illustrate the process of forming a segregated structure comprising two or more polymer domains. A polymer mixture comprising a first polymer and a second polymer is disposed on pre-patterned structure 10, thereby forming a first structure 20 (FIG. 1B). First structure 20 comprises the disposed polymer mixture 22 (non-segregated first polymer and second polymer) substantially located in trench areas 16 of element 17. Segregation of the first polymer and the second polymer results in segregated structure 30 (FIG. 1C) which comprises first polymer domain 32 and second polymer domain 34, in this example arranged in an alternating line pattern 36 within trench area 16. The first polymer domain 32 comprises the first polymer, and the second polymer domain 34 comprises the second polymer.

The first polymer and the second polymer can segregate partially or completely during the process used to dispose the polymer mixture on pre-patterned structure 10 (e.g., during a coating process). Segregation can also be induced or accelerated by thermal annealing and/or by solvent vapor annealing the disposed polymer mixture. Thus, "segregating the first polymer and the second polymer" as used herein means allowing, inducing, and/or accelerating the segregation process to form a segregated structure 30 comprising a first polymer domain 32 and a second polymer domain 34. First polymer domain 32 comprises a first composition comprising more than 50 wt. % (weight percent) of the first polymer, based on total weight of the polymer components of the first composition. Second polymer domain 34 comprises a second composition comprising more than 50 wt. % of the second polymer, based on total weight of the polymer components of the second composition. The first composition and the second composition can independently comprise one or more additional components. First polymer domain 32 is also immiscible with second polymer domain 34. In this example, the first polymer has greater affinity for sidewalls 18 than the second polymer. Thus, the first polymer preferentially segregates toward sidewalls 18, forming first polymer domain 32 in contact with sidewalls 18. The second polymer preferentially segregates toward the center of trench areas 16, and has substantially no contact with sidewalls 18. First polymer domain 32 and/or second polymer domain 34 are lithographically patternable. In an embodiment, first polymer domain 32 and second polymer domain 34 are independently lithographically patternable. Element 17 can also be lithographically patternable, and more particularly, independently lithographically patternable.

A segregated structure can have more than two polymer domains, depending on the complexity of the disposed polymer mixture. Moreover, a polymer domain can comprise more than one polymer of the initial polymer mixture. That is, two or more polymers can potentially segregate together to form a polymer domain. In an embodiment, the polymer mixture comprises two immiscible polymers, a first polymer and a second polymer, which segregate to form respectively a first polymer domain and a second polymer domain.

Segregated structure 30 is used to illustrate three methods of generating topographical features derived by lithographic patterning of the first polymer domain 32 and/or the second polymer domain 34.

Figure 2A:
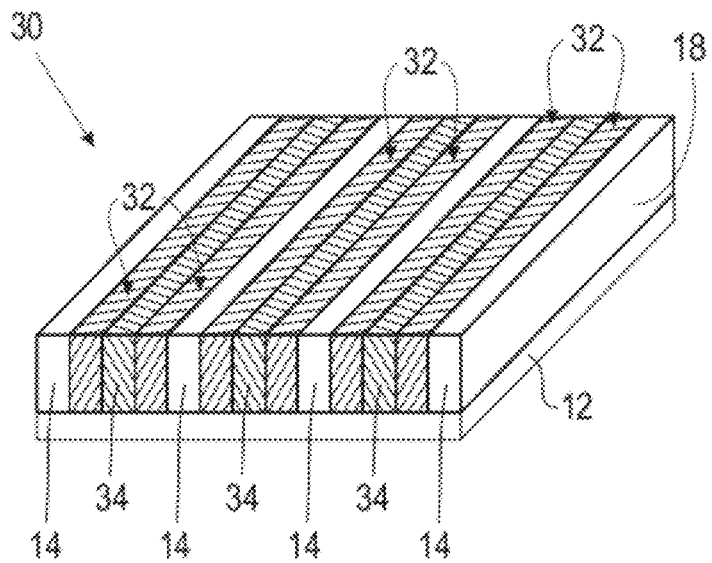
FIGS. 2A to 2D are schematic diagrams illustrating a first method of lithographically patterning one or more polymer domains to form topographical features, referred to as "patterning after segregation," and transferring the pattern formed by the topographical features to the support member.
Figure 2B:
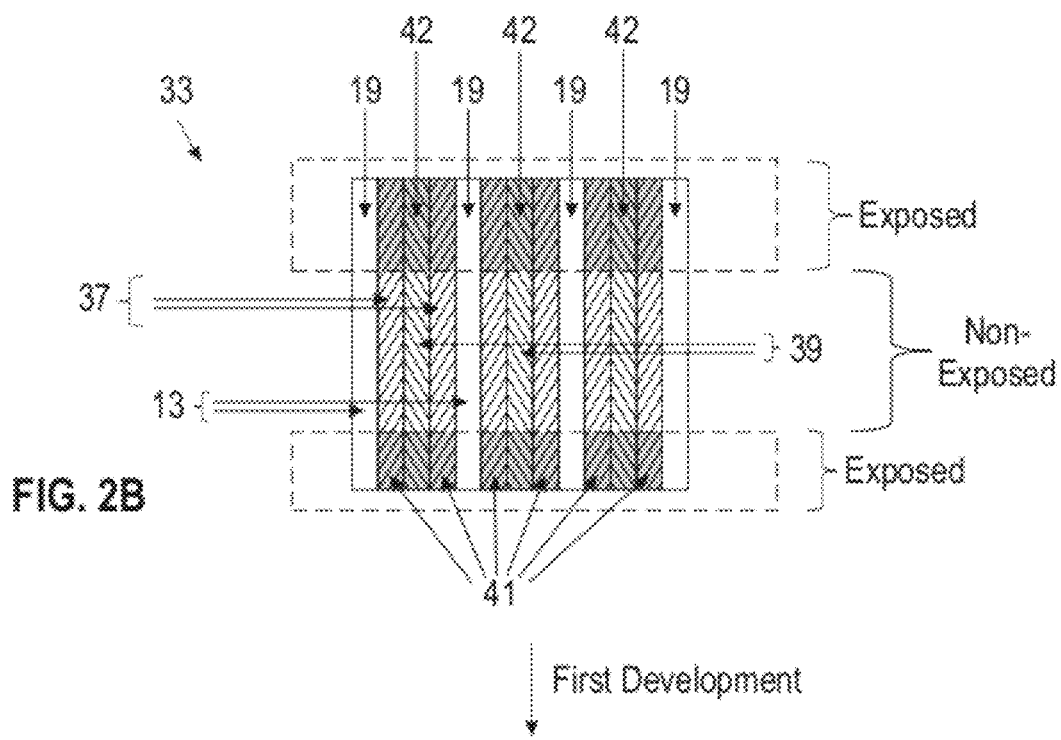
Figure 2C:
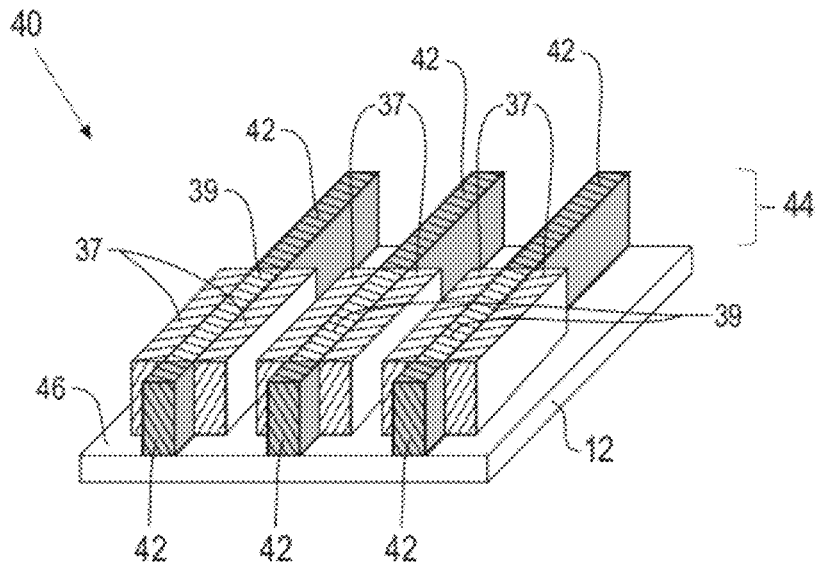

The first method, referred to in the examples below as "patterning after segregation," is illustrated in FIGS. 2A to 2D. The method comprises, patternwise exposing segregated structure 30 (FIG. 2A), thereby producing exposed structure 33 (FIG. 2B). The patternwise exposure can encompass the entire surface area occupied by a polymer domain or a portion thereof. FIG. 2B is an overhead view showing an exemplary e-beam bar pattern exposure given to segregated structure 30. Exposed structure 33 comprises exposed regions of element 19, non-exposed regions of element 13, exposed regions of first polymer domain 41, non-exposed regions of first polymer domain 37, exposed regions of second polymer domain 42, and non-exposed regions of second polymer domain 39 (FIG. 2B). Exposed structure 33 can be given an optional post-exposure bake (PEB) (not shown). In this example, patternwise exposure of segregated structure 30 allows imagewise development of the exposed regions of first polymer domain 41, which are selectively removed in a first post-exposure development process. The non-exposed regions of element 13 and the exposed regions of element 19 are also removed by the first post-exposure development process. The result is multi-layered structure 40 (FIG. 2C) comprising a first set of topographical features 44, which includes features comprising non-exposed regions of first polymer domain 37, features comprising non-exposed regions of the second polymer domain 39, and features comprising the exposed regions of second polymer domain 42. Surfaces 46 indicate the air interface of the support member 12. The first set of topographical features 44 forms a pattern that can optionally be transferred to the support member. First set of topographical features 44 can contain one or more features having the same or a different size, geometry, and/or orientation.

Figure 2D:
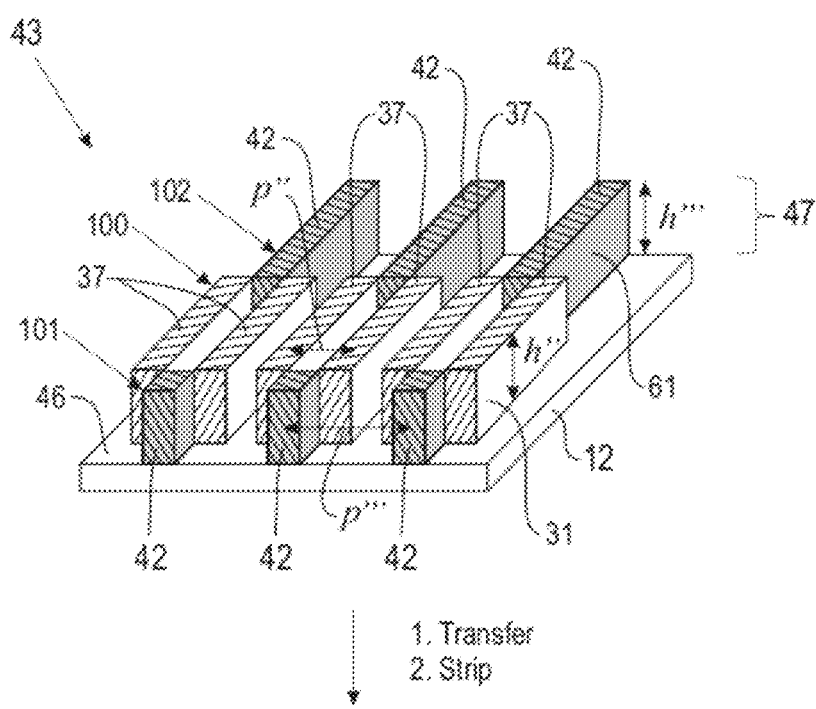

The above method can optionally further comprise a second post-exposure development as shown in FIG. 2D. In this example, the second post-exposure development selectively removes the non-exposed regions of second polymer domain 39, thereby forming a second multi-layered structure 43 comprising a second set of topographical features 47 (FIG. 2D), which includes first features 100 having sidewalls 31 of height h" comprising non-exposed regions of first polymer domain 37. Second set of topographical features 47 further comprises second features 101 and third features 102, each comprising exposed regions of second polymer domain 42, and each having sidewalls 61 of height h'".

The topographical features formed by lithographic patterning of the first polymer domain and/or the second polymer domain can independently have a height (e.g., h" and/or h'") of 5 nm to 500 nm, more particularly 10 nm to 250 nm. The topographical features can have any pitch (e.g., p" and pitch p'") suitable for the intended pattern of topographical features. In an embodiment, the topographical features formed by lithographically patterning a polymer domain have a pitch of 10 nm to 1 mm.

More specific non-limiting examples follow using the first method of lithographically patterning the first polymer domain and the second polymer domain.

In one example, lithographic patterning comprises i) patternwise exposing the segregated structure, thereby forming an exposed structure, ii) optionally baking the exposed structure; and iii) imagewise developing the exposed structure in one post-exposure development process, thereby forming topographical features, wherein the one post-exposure development process optionally removes the element. In an embodiment, the one post-exposure development process selectively removes exposed regions of the first polymer domain and the element.

In another example, patterning lithographically comprises i) patternwise exposing the segregated structure, thereby forming an exposed structure, ii) optionally baking the exposed structure, iii) selectively removing in a first post-exposure development process an exposed region of the first polymer domain, and iv) selectively removing in a second post-exposure development process non-exposed regions of the second polymer domain, thereby forming topographical features, wherein the first post-exposure development process or the second post-exposure development process optionally further removes the element.

Several additional embodiments of lithographically patterning the first polymer domain and the second polymer domain follow.

In one embodiment, the first post-exposure development process selectively removes exposed regions of the first polymer domain and the element, and the second post-exposure development process selectively removes non-exposed regions of the second polymer domain.

In another embodiment, the first post-exposure development process selectively removes non-exposed regions of the first polymer domain, and the second post-exposure development process selectively removes exposed regions of the second polymer domain, wherein the first post-exposure development process or the second post-exposure development process optionally removes the element.

In another embodiment, the first post-exposure development process selectively removes non-exposed regions of the first polymer domain, and the second post-exposure development process selectively removes non-exposed regions of the second polymer domain, wherein the first post-exposure development process or the second post-exposure development process optionally removes the element.

In another embodiment, the first post-exposure development process selectively removes the exposed regions of the first polymer domain, and the second post-exposure development process selectively removes the second polymer domain, wherein the first post-exposure development process or the second post-exposure development process optionally removes the element.

In another embodiment, the first post-exposure development process selectively removes non-exposed regions of the first polymer domain, and the second post-exposure development process selectively removes the second polymer domain, wherein the first post-exposure development process or the second post-exposure development process optionally removes the element.

In another embodiment, the first post-exposure development process selectively removes exposed regions of the first polymer domain and the element, and the second post-exposure development process selectively removes the second polymer domain.

Figure 2E:
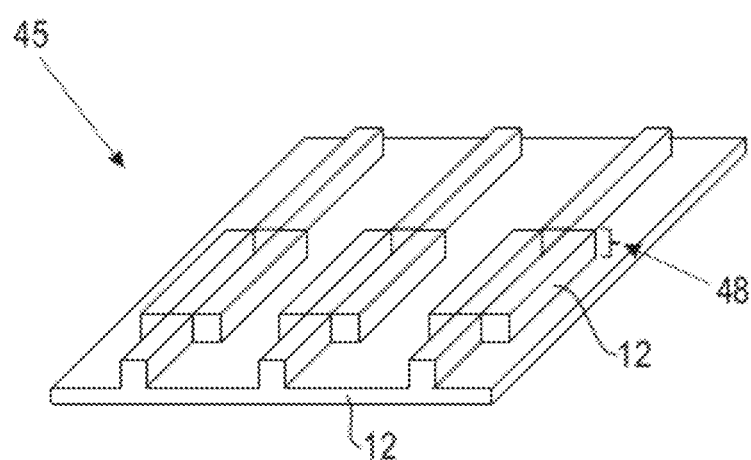
FIG. 2E is a perspective view of the support member after i) transferring to the support member the pattern of the topographical features of FIG. 2C and ii) stripping away the topographical features.

A pattern formed by the first set of topographical features 44 or the second set of topographical features 47 can optionally be transferred to the support member 12. This is illustrated using the pattern formed by second topographical features 47 (FIG. 2D). Selectively etching surfaces 46, followed by stripping second set of topographical features 47, produces structure 45 (FIG. 2E), comprising transferred pattern 48 in support member 12. The transferred pattern can include the pattern formed by features 14 of element 17, if desired.

Figure 3A:
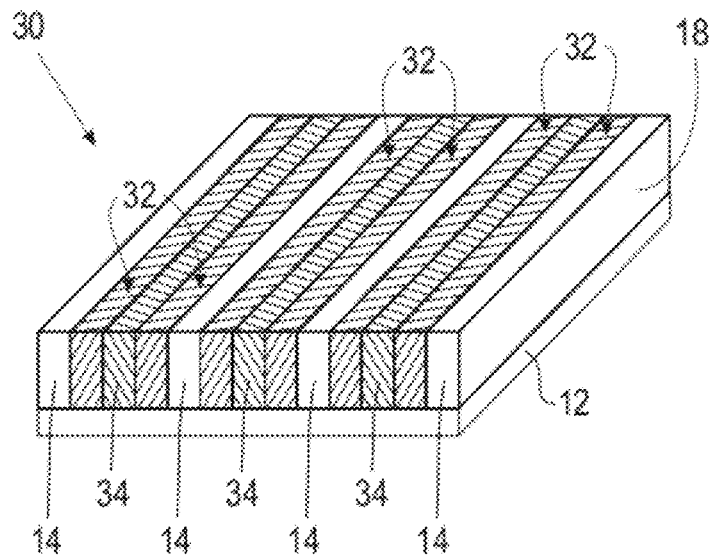
FIGS. 3A to 3E are schematic diagrams illustrating a second method of lithographically patterning one or more polymer domains to form topographical features, referred to as "patterning after first selective removal.
Figure 3B:
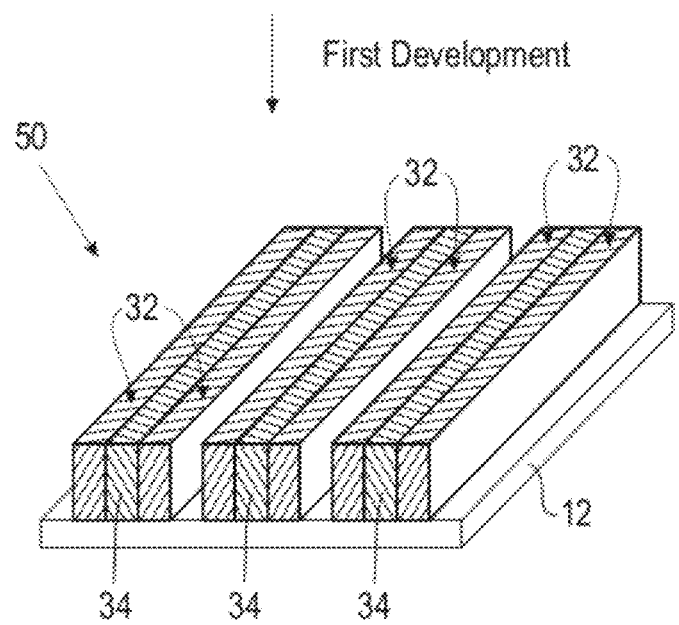
Figure 3C:
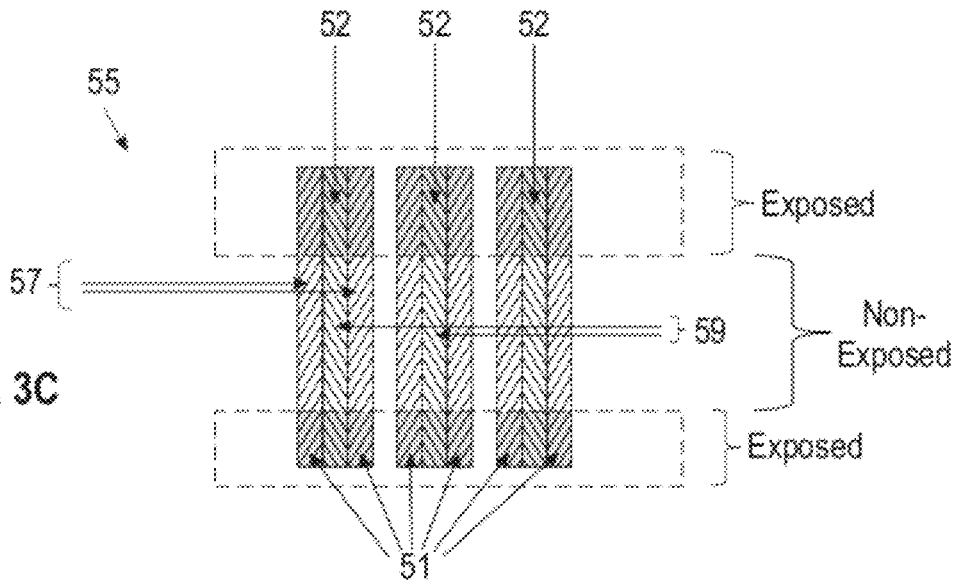
Figure 3D:
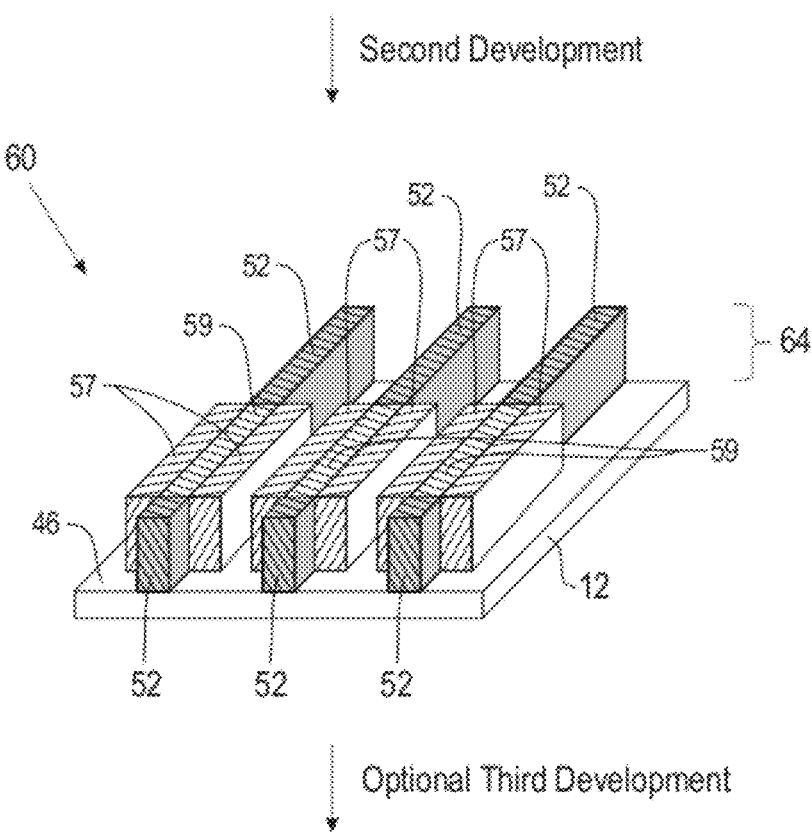

A second method, is exemplified in FIGS. 3A to 3C. In this method and the method that follows the segregated structure is developed one or more times prior to a first patternwise exposure following segregation of the polymer mixture, thereby producing a modified segregated structure. The modified segregated structure comprises at least the first polymer domain or the second polymer domain. The first polymer domain and/or the second polymer domain of the modified segregated structure is then lithographically patterned to form a set of topographical features. FIGS. 3A to 3C exemplify what is referred to in the examples section below as "patterning after first selective removal," wherein one development process is performed prior to lithographically patterning the first polymer domain and/or the second polymer domain. The one development process can remove the element and/or one or more of the polymer domains, providing that the resulting modified segregated structure comprises the first polymer domain and/or the second polymer domain. In this example, the one development process selectively removes element 17 (FIG. 1A) from segregated structure 30, thereby forming modified segregated structure 50 (FIG. 3B). The remaining polymer domain(s) of the modified segregated structure can then be lithographically patterned. FIG. 3C is an overhead view showing an exemplary e-beam bar pattern exposure given to modified segregated structure 50, producing exposed structure 55. Exposed structure 55 comprises non-exposed regions of first polymer domain 57, exposed regions of first polymer domain 51, non-exposed regions of second polymer domain 59, and exposed regions of second polymer domain 52. The exposed structure 50 is optionally baked (not shown). In this example, a first post-exposure development process selectively removes exposed regions of first polymer domain 51, thereby forming multi-layered structure 60 (FIG. 3D) comprising a set of topographical features 64. The set of topographical features 64 comprise features comprising non-exposed regions of first polymer domain 57, features comprising exposed regions of second polymer domain 52, and features comprising non-exposed regions of second polymer domain 59.

Figure 3E:
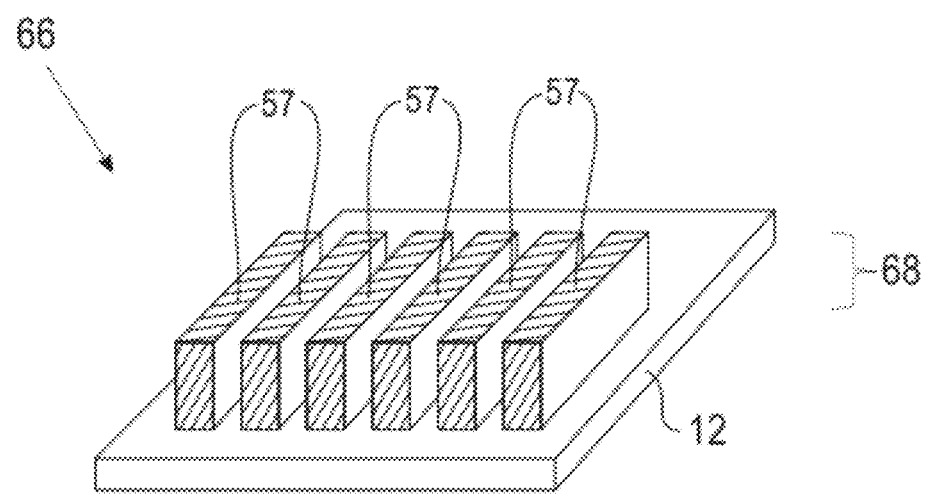

Additional patternwise exposures and/or development steps can be performed on the multi-layered structure 60. For example, developing multi-layered structure 60 with an optional third development can remove selectively exposed regions of second polymer domain 52 and non-exposed regions of the second polymer domain 59, producing second multi-layered structure 66 (FIG. 3E), which comprises a second set of topographical features 68 comprising features comprising non-exposed regions of first polymer domain 57. No restriction is placed on the number of patternwise exposures, the number of post-exposure development steps, or the order in which they are performed, providing the structure obtained by lithographic patterning of the first polymer domain and/or the second polymer domain comprises at least one feature comprising a lithographically patterned polymer domain. As previously described, the method can further optionally comprise transferring a pattern formed by the set of topographical features 64 or the second set of topographical features 68 to the support member. The pattern to be transferred can further include a pattern formed by features 14 of the element 17 or a modified element, which is formed by an exposure process, bake process, development process, and/or another chemical, thermal, and/or radiation treatment.

Figure 4A:
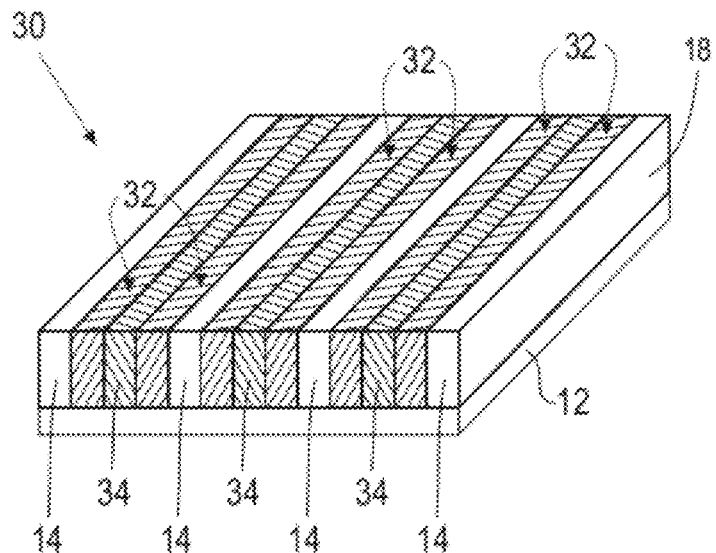
FIGS. 4A to 4E are schematic diagrams illustrating a third method of lithographically patterning one or more polymer domains to form a topographical pattern, referred to as "patterning on spacers after second selective removal.
Figure 4B:
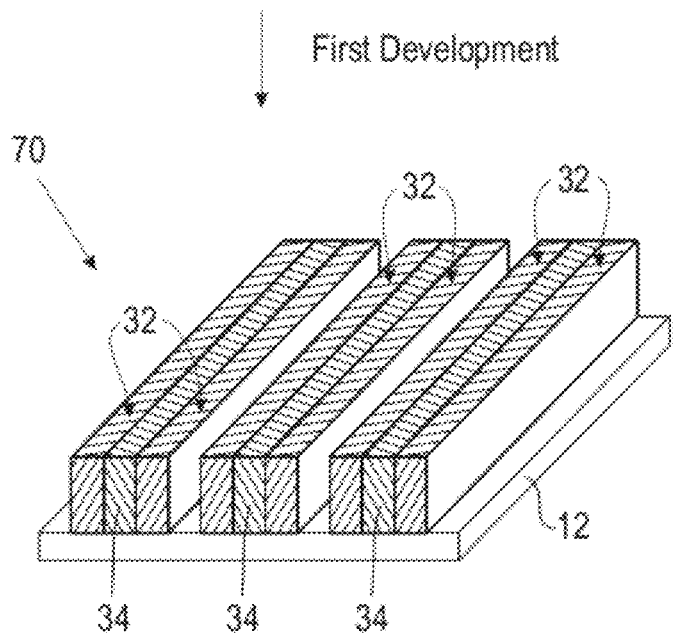
Figure 4C:
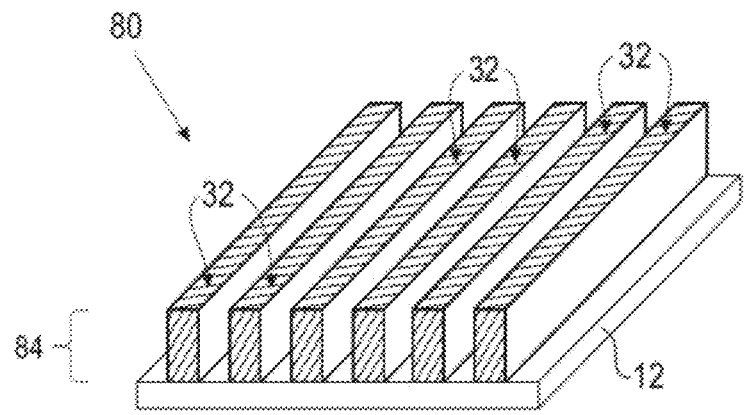
Figure 4D:
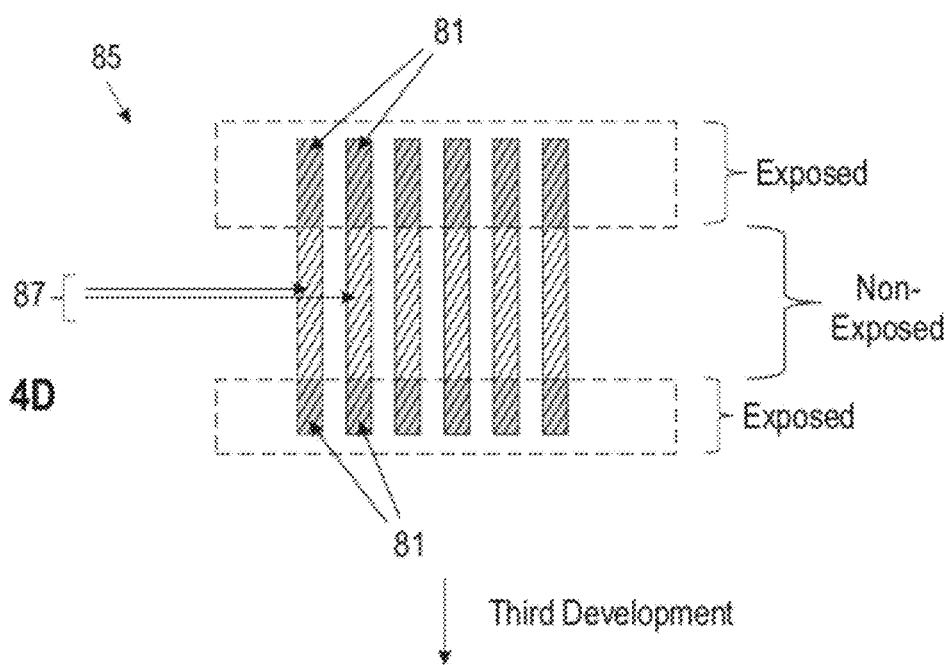
Figure 4E:
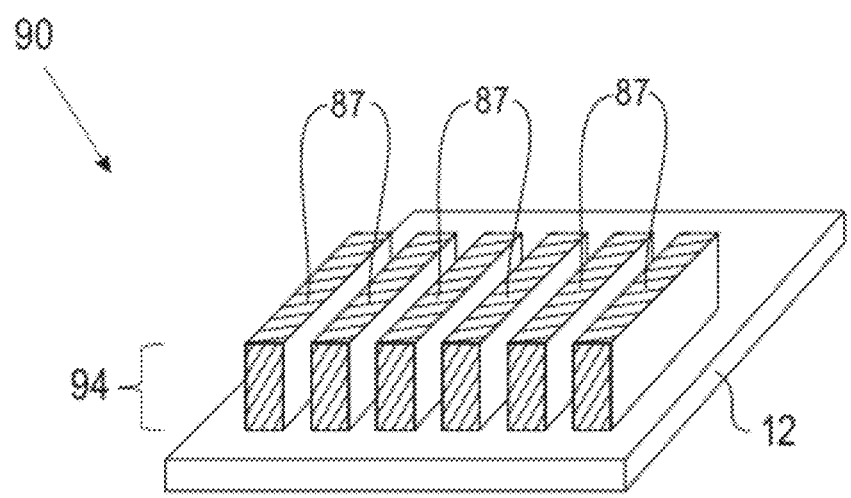

A third method, referred to in the examples section below as "patterning after second selective removal" is illustrated in FIGS. 4A to 4E. In this example, the segregated structure is developed in two development processes prior to the first patternwise exposure following segregation of the polymer mixture. The first development process selectively removes element 17 from the segregated structure 30 (FIG. 4A), thereby forming a first developed structure 70 (FIG. 4B). In a second development process, the second polymer domain 34 is selectively removed from the first developed structure 70, thereby forming a modified segregated structure 80 (FIG. 4C) comprising features 84 comprising the first polymer domain 32, which in this example form a line-space pattern. Features 84 of the modified segregated structure 80 can then be lithographically patterned. The modified segregated structure 80 is patternwise exposed using, for example, an e-beam bar pattern exposure as shown in the overhead view of FIG. 4D, thereby forming exposed structure 85. Exposed structure 85 comprises non-exposed regions of first polymer domain 87 and exposed regions of first polymer domain 81. Exposed structure 85 is optionally baked (not shown). A first post-exposure development selectively removes exposed regions of first polymer domain 81, thereby forming multi-layered structure 90 (FIG. 4E) comprising the set of topographical features 94 comprising features comprising non-exposed regions of first polymer domain 87. The pattern formed by the set of topographical features 94 can optionally be transferred to the support member as described above. The topographical pattern can comprise the element or a modified element as described above.

In an embodiment, the pre-patterned structure comprises a photoresist element for topographically guiding polymer segregation. The segregated structure, the modified segregated structure, and the multi-layer structure resulting from lithographic patterning can comprise the photoresist element, or a modified photoresist element. Alternatively, the segregated structure comprising the photoresist element can be developed in one or more development processes, selectively removing at least one of the photoresist element, the first polymer domain, and the second polymer domain, thereby forming a modified segregated structure. The modified segregated structure comprises at least one of the first polymer domain and the second polymer domain. In an embodiment, the segregated structure is developed in one development process, the one development process selectively removing the photoresist element, thereby forming the modified segregated structure. In another embodiment, the segregated structure is developed in a first development process utilizing an aqueous base developer, thereby forming a first developed structure, and the first developed structure is developed in a second development process utilizing an organic solvent developer, thereby forming the modified segregated structure, wherein the first development process or the second development process optionally removes the photoresist element. In another embodiment, the first development process selectively removes the photoresist element, and the second development process selectively removes the first polymer domain or the second polymer domain. In another embodiment, the first development process selectively removes the first polymer domain or the second polymer domain, and the second development process selectively removes the photoresist element.

The photoresist element, exposed regions of the photoresist element, non-exposed regions of the photoresist element, or a modified version of any of the foregoing, can optionally be removed in a post-exposure development process. In an embodiment, the exposed structure is imagewise developed in one post-exposure development process, thereby forming a multi-layered structure comprising topographical features comprising a lithographically patterned first polymer domain and/or lithographically patterned second polymer domain, wherein imagewise development optionally removes the photoresist element. In another embodiment, the exposed structure is imagewise developed using two post-exposure development processes, wherein a first post-exposure development process or a second post-exposure process optionally removes the photoresist element.

As the above examples indicate, multiple patterning exposures and/or multiple development steps (before or after the first patternwise exposure) can be performed in any number or in any order suitable for the intended topographical features. Depending on the number of different polymer domains of the segregated structure, and the intended topographical features, more than two development processes can be performed on the segregated structure prior to patterning lithographically. Moreover, depending on the number of different polymer domains of the segregated structure, and the intended topographical features, one or more patternwise exposures and one or more post-exposure development processes can be performed on the segregated structure or a modified segregated structure. That is, no restriction is placed on the number of patternwise exposures, the number of development steps, or the order in which they are performed, providing the topographical features include at least one feature comprising a lithographically patterned polymer domain.

Each development process can utilize different materials, solvents, conditions, and methods. Each exposure process can utilize different devices, wavelengths, exposure levels, dosages and other parameters as necessary to achieve the desired exposure effect. Exposed and non-exposed regions of the first polymer domain, exposed and non-exposed regions of the second polymer domain, and exposed and non-exposed regions of the element can be removed, imagewise or non-imagewise, in any order, and in any development step following segregation of the polymer mixture. In an embodiment, a method comprises developing the segregated structure twice before patterning lithographically, wherein a first development process utilizes an aqueous base solution and a second development process utilizes an organic solvent to form a modified segregated structure. In another embodiment, a first development process utilizes an organic solvent and a second development process utilizes aqueous base solution to form a modified segregated structure. In another embodiment, lithographic patterning utilizes an ultraviolet exposure at a wavelength from 450 nm to 120 nm. In another embodiment, lithographic patterning utilizes immersion lithography. In another embodiment, lithographic patterning utilizes an e-beam exposure. In another embodiment, lithographic patterning utilizes extreme ultraviolet exposure at a wavelength of 120 nm to 10 nm, more preferably 10 nm to 20 nm.

Polymer Mixture.

The polymer mixture comprises two or more polymers capable of segregating to form two or more polymer domains.

The two or more polymers can independently be homopolymers, random copolymers, graft copolymers, hyperbranched polymers, dendritic polymers, star polymers, or mixtures thereof.

Herein, two polymers are "immiscible" if they are capable of segregating into two compositionally different polymer domains under a given set of process conditions. Polymer segregation can depend on the composition of the polymers in the polymer mixture, the ratio of the polymers in the polymer mixture, the molecular weight of the individual polymers in the polymer mixture, and the presence of auxiliary components in the polymer mixture. Temperature, coating conditions, pre-patterned structure topography, and pre-patterned structure surface properties can also affect the segregation of the polymers.

Polymer additives can be used to control interfacial energy and segregation behavior. Polymer additives can comprise block, graft, homopolymer, and random copolymers. For example, if an immiscible polymer mixture comprises a homopolymer derived from monomer A, designated poly(A), and a homopolymer derived from monomer B, designated poly(B), then poly(A-b-B), poly(A-grafted-B), and/or poly(A-ran-B) can be used to adjust the interfacial energy between a domains of poly(A) and a domain of poly(B), where poly(A-b-B) denotes a block copolymer comprising a chain of poly(B) grown from a chain of poly(A) or vice versa, poly(A-grafted-B) denotes a polymer formed by chemically linking pre-formed poly(A) and pre-formed poly(B) using a reaction that is not a polymerization, and poly(A-ran-B) denotes a copolymer formed by random polymerization of a mixture of monomer A and monomer B. Poly(A-ran-B) is also referred as poly(A-co-B). Adding poly(A-b-B), poly(A-grafted-B), poly(A-ran-B), or combinations thereof, can reduce interfacial energy between the poly(A) and poly(B), altering the segregation behavior of the polymer mixture.

Alternatively, if a homopolymer derived from monomer C, designated poly(C), is miscible with, for example, poly(A), then poly(C-b-B), poly(C-grafted-B), and/or poly(C-ran-B) can be used to adjust the interfacial energy between a domains of poly(A) and a domain of poly(B). Similarly, if a homopolymer derived from monomer C, designated poly(C), is miscible with poly(A) and a homopolymer derived from monomer D, designated poly(C), is miscible with poly(B) then poly(C-b-D), poly(C-grafted-D), and/or poly(C-ran-D) can be used to adjust the interfacial energy between a domains of poly(A) and a domain of poly(B). In an embodiment, the two or more polymers of the polymer mixture are selected such that each polymer is immiscible with every other polymer in the polymer mixture.

While the examples described have been limited to homopolymers and homopolymer blocks for the sake of simplicity, it should be understood that the polymers and/or polymer blocks can comprise more than one type of monomer (i.e., copolymers). The use of additional monomers in the polymers and/or polymer blocks can be desirable to improve solubility in casting or developing solvents, phase segregation behavior, patterning performance (e.g., photospeed, resolution, contrast, developer solubility), etch resistance, and/or other properties.

In addition, the lateral dimension of a poly(A) domain and poly(B) domain can depend on the ratio of poly(A) and poly(B) and the additional components in the polymer mixture.

Polymer additives that are not block copolymers can be present in the polymer mixture in an amount of 0 wt. % to less than 50 wt. %, 0 wt. % to 40 wt. %, 0 wt. % to 20 wt. %, or more particularly, 0 wt. % to 5 wt. %, based on the total weight of solids in the polymer mixture (i.e., excluding solvent). A block copolymer additive can be present in the polymer mixture in an amount of 0 wt. % to 20 wt. %, 0 wt. % to 10 wt. %, or more particularly, 0 wt. % to 5 wt. %, based on the total weight of solids in the polymer mixture. In an embodiment, the polymer mixture contains no block copolymer additive.

Exemplary polymers for the polymer mixture include cellulose, novolac resins, cresol resins, acidic sulfonamide polymers, fluoroalcohol-based polymers, polysiloxanes, polymethylsilsesquioxanes, and polycarbosilanes. Other exemplary polymers include homopolymers, such as poly(acrylamide), poly(ethyleneimine), poly(acrylic acid), poly(2-ethyl-2-oxazoline), poly(ethyleneoxide), poly(vinyl alcohol), poly(hydroxystyrene), poly(styrene sulfonic acid), poly(vinyl phosphoric acid), poly(vinyl sulfonic acid), poly(2-sulfoethyl methacrylate), poly(2-sulfopropyldimethyl-3-methacrylamide), poly(1,1,1-trifluoro-2-(trifluoromethyl)-2-hydroxypentan-4-yl methacrylate), poly(2-ethyl-trifluoromethanesulfonamide methacrylate), poly(styrene) (PS), poly(hydroxyadamantyl methacrylate), poly(isobornyl methacrylate), poly(phenyl methacrylate), poly(vinyl naphthalene), poly(vinyl ferrocene), poly(acrylonitrile), poly(caprolactone), poly(lactide), poly(methyl methacrylate), poly(2-hydroxyethyl methacrylate), poly(gamma-butyrolactone methacrylate), poly(tetrahydrofuranyl methacrylate), poly(tetrahydropyranyl methacrylate), poly(allyl amine), poly(4-aminostyrene), poly(2-dimethylaminoethyl methacrylate), poly(N-methylvinylamine), poly(vinyl pyridine), poly(isoprene), poly(butadiene), poly(norbornene), poly(ethylene), poly(propylene), poly(2,2,2-trifluoroethyl methacrylate), poly(hexafluoroisopropyl methacrylate), poly(2,3,4,5,6-pentafluorostyrene), and substituted derivatives thereof.

In a preferred embodiment, the polymer mixture comprises a first polymer that is a (meth)acrylate polymer. The term "(meth)acrylate" means methacrylate or acrylate. More than 50% of the repeat units of a (meth)acrylate polymer comprise a carboxylic ester side chain group or carboxylic acid side chain group linked by the carbonyl group of the carboxylic ester or the carboxylic acid to a backbone ethylene fragment, as would be obtained by radical polymerization of (meth)acrylate monomers. The (meth)acrylate polymer can be a homopolymer, graft copolymer, hyperbranched polymer, dendritic polymer, or star polymers. In an embodiment, the (meth)acrylate polymer is a random copolymer.

The (meth)acrylate copolymer can comprise a first repeat unit comprising an ester side chain having one or more silicon atoms in accordance with Formula (1):

wherein $R^1$ is a hydrogen or a methyl group, and $R^2$ is a monovalent radical comprising one or more silicon atoms. The starred bonds indicate points of attachment to another backbone repeat unit.

Non-limiting exemplary R² groups include:

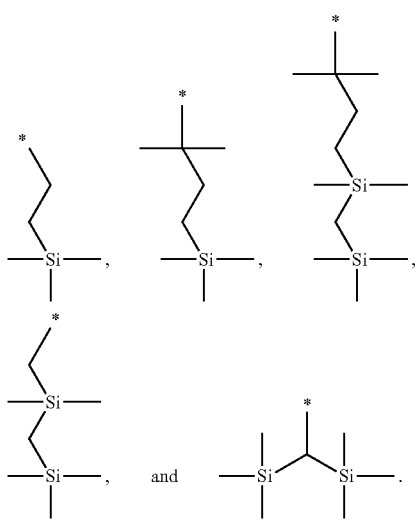

The starred bond indicates the point of attachment of the R² group to the ester oxygen of Formula (1). The foregoing R² groups can be used individually or in combination (e.g., copolymerization of (meth)acrylate monomers possessing different R² groups).

The first repeat units can be prepared by vinyl polymerization of a (meth)acrylate monomer, for example:

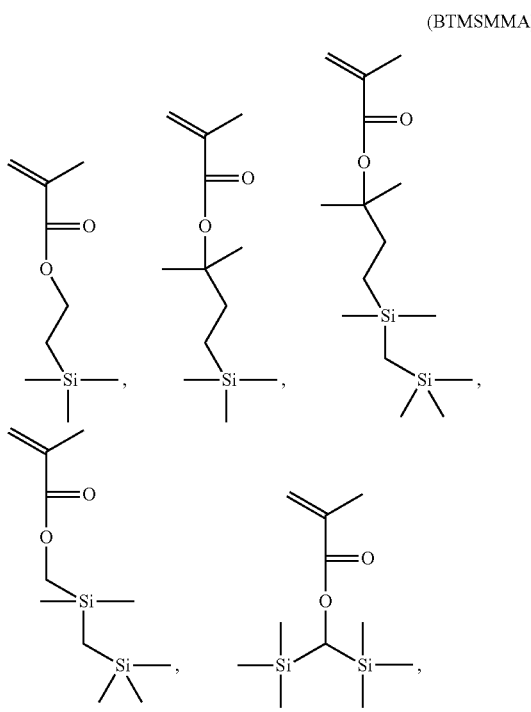

(BTMSMMA)

and acrylate versions thereof. The foregoing silicon monomers can be used individually or in combination.

The (meth)acrylate copolymer can comprise second repeat units comprising a side chain ester moiety comprising a lactone ring. Second repeat units are represented by Formula (2):

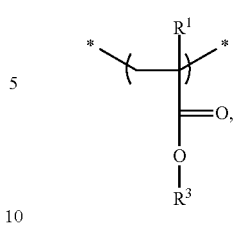

(2)

wherein $R^1$ is a hydrogen or a methyl group, and $R^3$ is a monovalent radical comprising one or more lactone rings. In an embodiment, the one or more lactone rings is selected from the group consisting of gamma-butyrolactones (5-membered rings), delta-valerolactones (6-membered rings), and epsilon-caprolactones. The foregoing lactone rings can be used individually or in combination.

Non-limiting exemplary $R^3$ groups include:

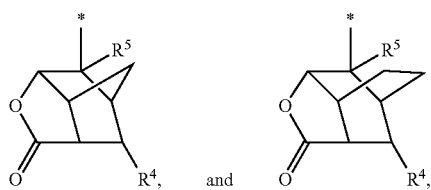

wherein $R^4$ is a monovalent radical selected from the group consisting of hydrogen, linear and branched alkyl groups of 1 to 4 carbons, linear and branched alkoxy groups of 1 to 4 carbons, and *—$CO_2R^6$, wherein $R^5$ and $R^6$ are monovalent radicals independently selected from the group consisting of hydrogen, and linear and branched alkyl groups comprising 1 to 4 carbons. The foregoing $R^3$ groups can be used individually or in combination.

Other non-limiting $R^3$ groups include:

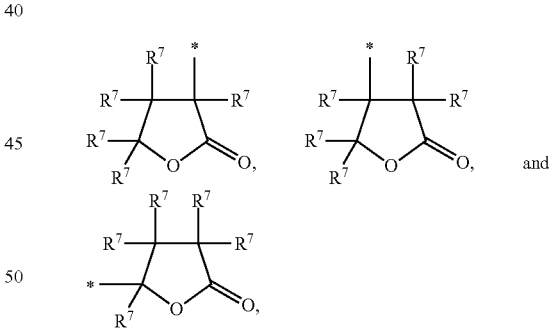

wherein each $R^7$ is a monovalent radical independently selected from the group consisting of hydrogen, linear and branched alkyl groups having 1 to 4 carbons, linear and branched alkoxy groups having 1 to 4 carbons, and linear and branched fluoroalkyl groups having 1 to 4 carbons. The foregoing $R^3$ groups can be used individually or in combination.

Examples of alkyl groups (linear and branched) having 1 to 4 carbon atoms include methyl group, ethyl group, n-propyl group, i-propyl group, n-butyl group, 2-methylpropyl group, 1-methylpropyl group, and t-butyl group. Examples of alkoxyl groups (linear and branched) having 1 to 4 carbon atoms include methoxyl group, ethoxyl group, n-propoxyl group, i-propoxyl group, n-butoxyl group, 2-methylpropoxyl group, 1-methylpropoxyl group, and t-butoxyl group. Fluoroalkyl groups (linear and branched) having 1 to 4 carbon atoms include the foregoing alkyl groups in which part or all of the hydrogen atoms are replaced with fluorine atoms.

Other non-limiting exemplary $R^3$ groups include:

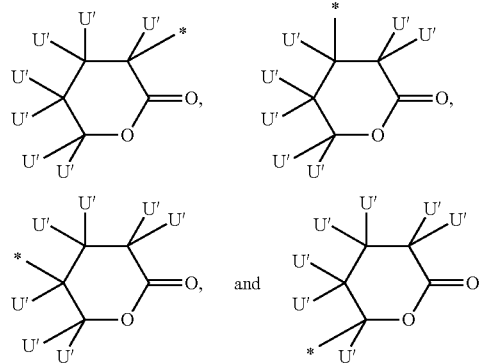

wherein each U' is a monovalent radical independently selected from the group consisting of hydrogen, linear and branched alkyl groups having 1 to 4 carbons, linear and branched alkoxy groups having 1 to 4 carbons, and linear and branched fluoroalkyl groups having 1 to 4 carbons.

More specific examples of the above $R^3$ groups include but are not limited to the following structures:

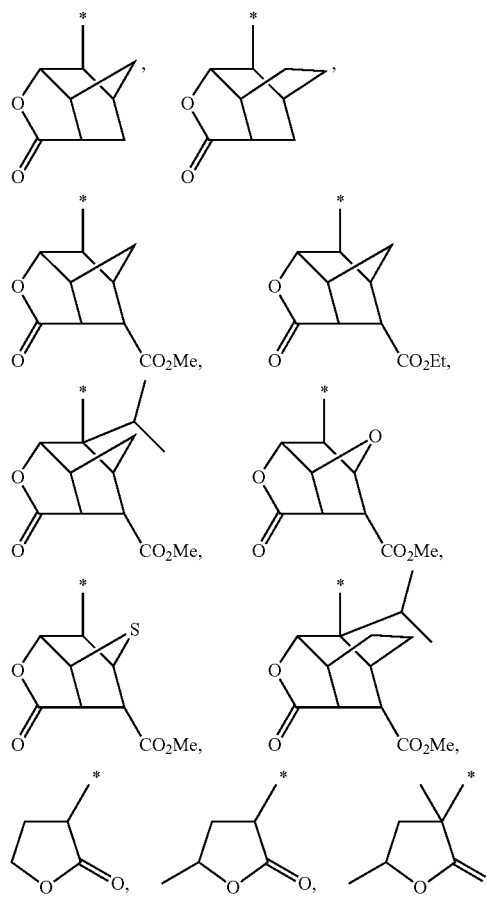

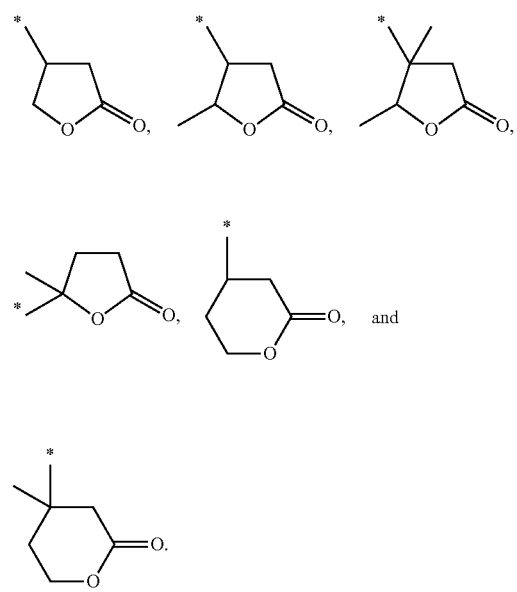

The foregoing $R^3$ groups can be used individually or in combination.

The second repeat units can be formed, for example, by vinyl polymerization of a (meth)acrylate monomer comprising a lactone ring, such as:

(NLM)

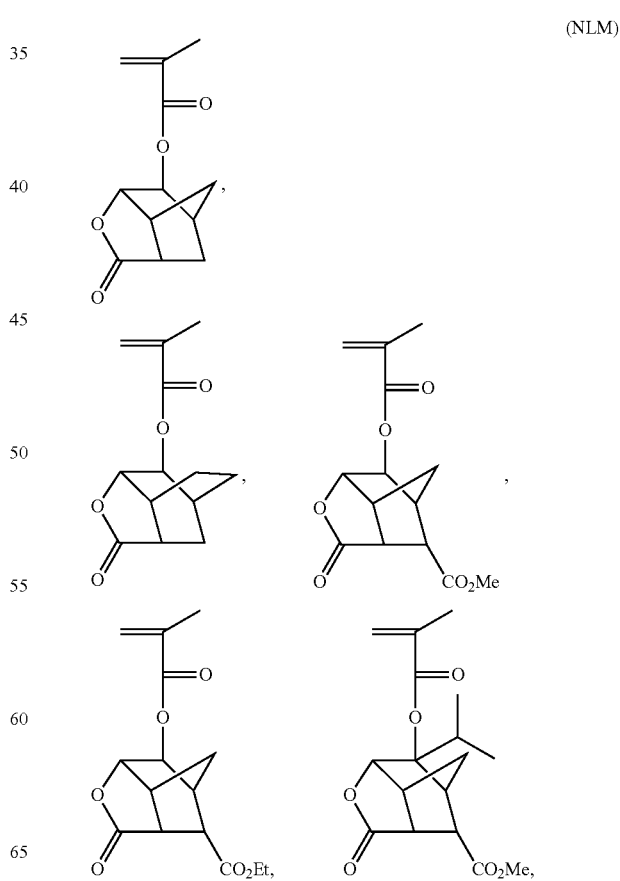

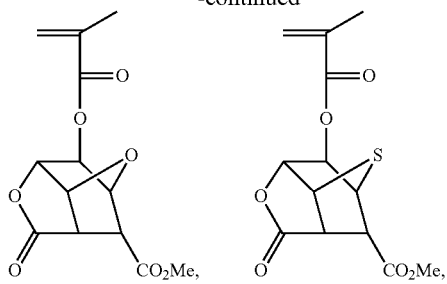
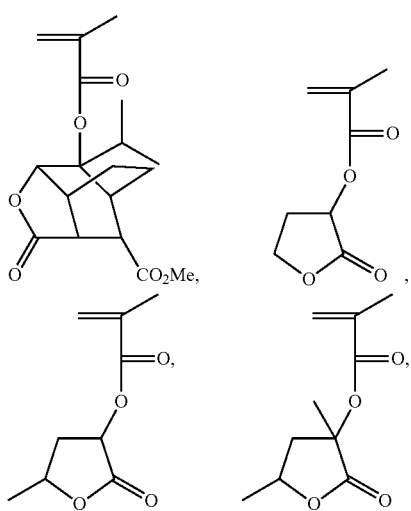
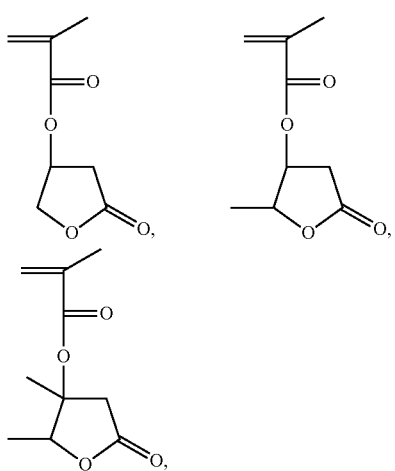
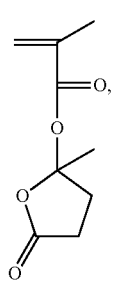

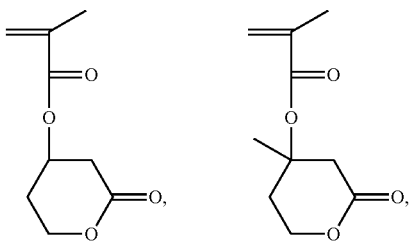

and acrylate versions thereof.

The (meth)acrylate copolymer can comprise mixtures of repeat units comprising different lactone containing side chains, and/or mixtures of repeat units comprising different silicon containing side chains, as would be obtained by radical polymerization of a mixture of lactone containing (meth)acrylate monomers of Formula (2) and/or silicon containing (meth)acrylate monomers of Formula (1).

The (meth)acrylate copolymers can comprise one or more additional repeat units derived from co-monomers other than (meth)acrylate comonomers. The additional repeat units can comprise a side chain comprising a functional group other than an ester, as would be obtained by radical copolymerization of vinyl acetate, butadiene, vinyl aromatic compounds (e.g., styrene), acrylamides, methacrylamides, vinyl ethers, and polycyclics having a polymerizable double bond. The side chain group of the additional repeat unit can comprise one or more silicon atoms, and/or a lactone ring. Example of additional repeat units include but are not limited to:

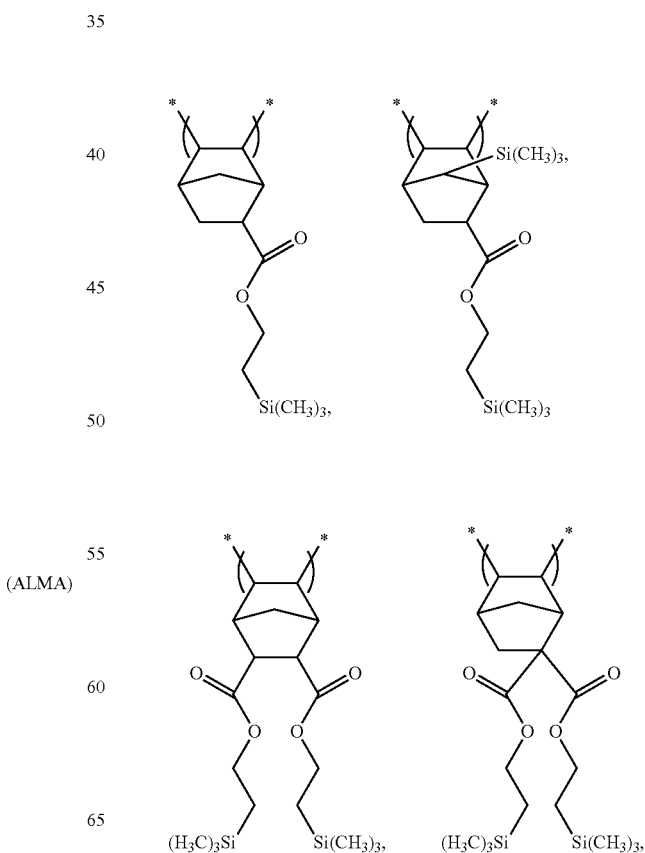

(ALMA)

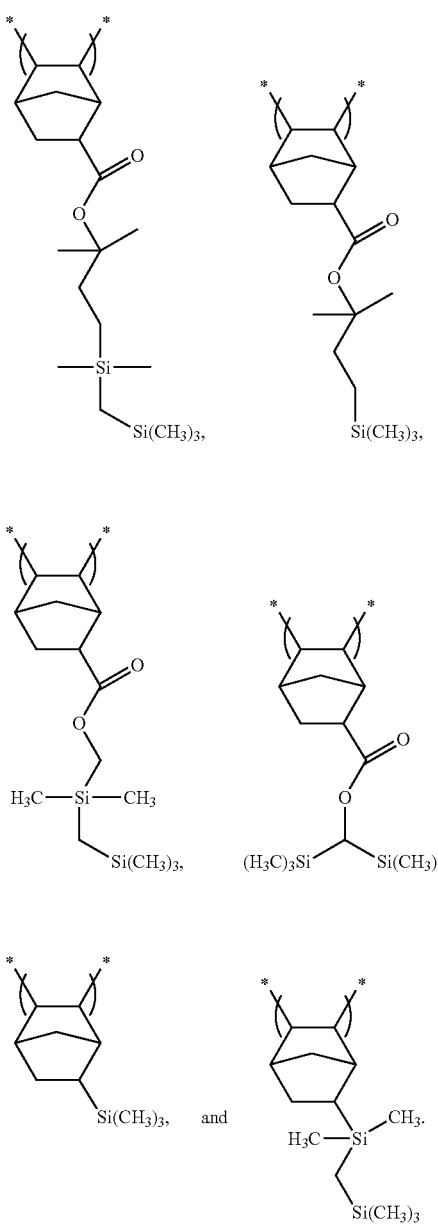
The above repeat units can be formed, for example, by respective radical polymerization of monomers:
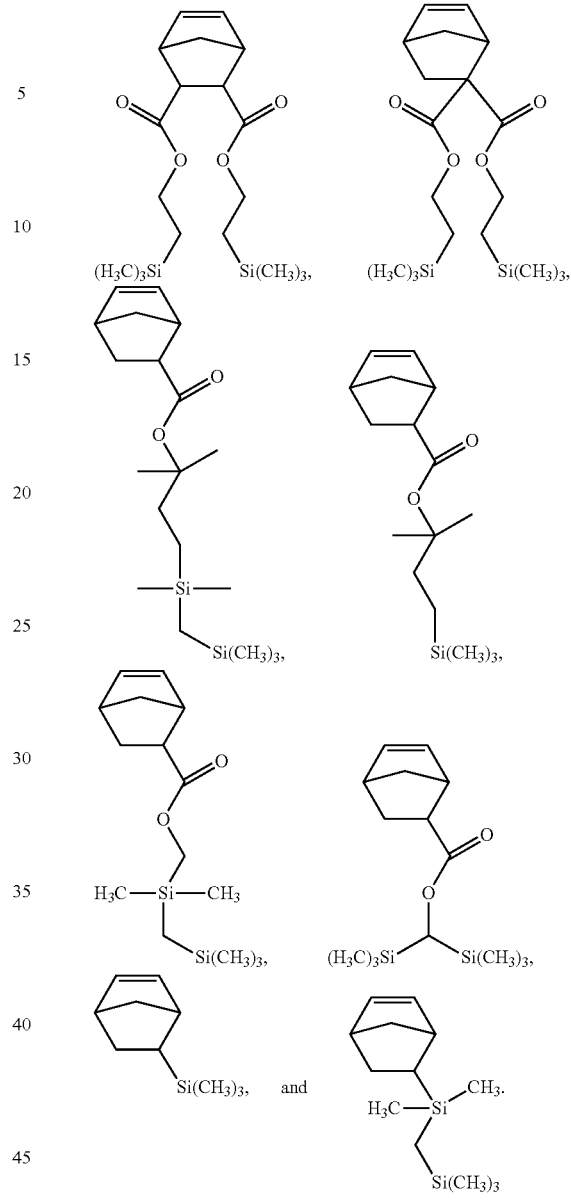
The foregoing monomers can be used individually or in combination.
In a preferred embodiment, the (meth)acrylate copolymer is a random copolymer comprising a first repeat unit having the structure:
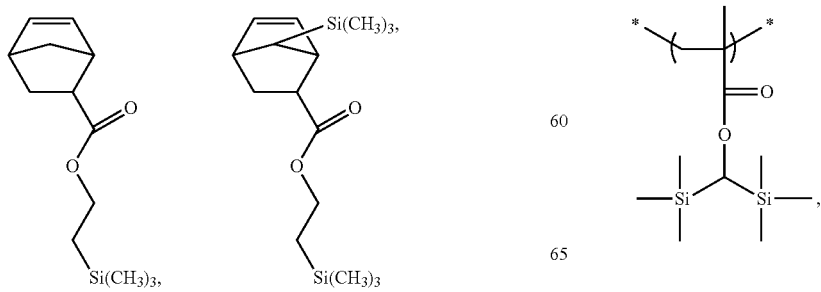
a second repeat unit having the structure:

and third repeat unit having the structure:

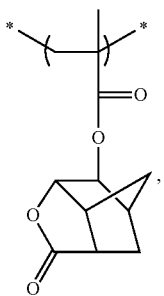

The first repeat units can be formed by radical polymerization of bis(trimethylsilyl)methyl methacrylate (BT-MSMMA):

(BTMSMMA)

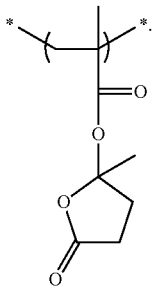

the second repeat units can be formed by radical polymerization of 5-methacryloyloxy-2,6-norbornanecarbolactone (NLM):

(NLM)

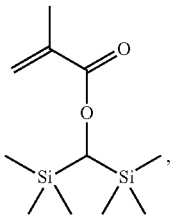

and the third repeat units can be formed by radical polymerization of gamma-methacryloyloxy-gamma-methyl-gamma-butyrolactone (ALMA):

(ALMA)

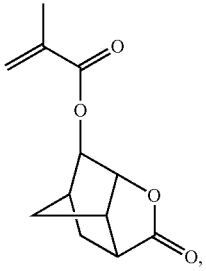

Additional monomers suitable for inclusion in the (meth) acrylate copolymers can be found in H. Ito "Chemical Amplification Resists for Microlithography," *Prog. Polym. Sci.* 2005, 172, 37-245.

The random copolymer can be prepared by copolymerizing a mixture comprising BTMSMMA, NLM, and ALMA using well established methods. BTMSMMA can be present in the polymerization mixture in an amount of 20 mole % to 40 mole %, 25 mole % to 35 mole %, or more particularly 28 mole % to 32 mole %, based on the total moles of the monomers. NLM can be present in the polymerization mixture in an amount of 10 mole % to 30 mole %, 15 mole % to 25 mole %, or more particularly 18 mole % to 22 mole %, based on the total moles of the monomers. ALMA can be present in the polymerization mixture in an amount of 40 mole % to 60 mole %, 45 mole % to 55 mole %, or more particularly 48 mole % to 50 mole %, based on the total moles of the monomers used in the polymerization mixture.

The polymer mixture further comprises a second polymer capable of phase segregating from the first polymer. In an embodiment, more than 50% of the repeat units of the second polymer comprise a side chain aromatic ring, which is attached to a backbone carbon, such as would be obtained by radical polymerization of styrene. In another embodiment, the second polymer is a homopolymer or copolymer of styrene or a substituted styrene. In another embodiment, the second polymer is poly(styrene).

The first polymer and/or the second polymer can be a silicon-containing polymer, which is obtained by the reaction of a precursor polymer comprising a nucleophilic group selected from the group consisting of alcohols, amines, thiols, and combinations thereof, with a hydrolyzable silane compound capable of reacting with the nucleophilic group. The hydrolyzable silane compound can be selected from compounds of the general Formula (3):

$$V^1_a Si(OV^2)_{4-a} \qquad (3),$$

wherein $V^1$ is a monovalent radical selected from the group consisting of fluorine atom, linear or branched alkyl groups having 1 to 5 carbon atoms, alkenyl groups having 2 to 6 carbon atoms, and alkylcarbonyloxy groups, $V^2$ represents a monovalent organic group, and a represents an integer from 1 to 3.

The hydrolyzable silane compound can be selected from compounds of the general Formula (4):

$$Si(OV^3)_4 \qquad (4),$$

wherein $V^3$ represents a monovalent organic group.

The hydrolyzable silane compound can be selected from compounds of the general Formula (5):

$$V^1_x(V^4O)_{3-x}Si-(V^7)_z-Si(OV^5)_{3-y}V^6_y \qquad (5),$$

wherein $V^1$ and $V^6$ individually represent a monovalent radical selected from the group consisting of a fluorine atom, alkylcarbonyloxy groups, and linear and branched alkyl groups having 1 to 5 carbon atoms, $V^4$ and $V^5$ individually represent a monovalent organic group, x and y individually represent a number from 0 to 2, and $V^7$ represents a divalent radical selected from the group consisting of oxygen atom, phenylene groups, and —$(CH_2)_m$— groups (wherein m represents an integer from 1 to 6), and z represents 0 or 1.

Non-limiting examples of compounds of the Formula (3) include methyltrimethoxysilane, methyltriethoxysilane, methyltri-n-propoxysilane, methyltriisopropoxysilane, methyltri-n-butoxysilane, methyltri-sec-butoxysilane, methyltri-t-butoxysilane, methyltriphenoxysilane, ethyltrimethoxysilane, ethyltriethoxysilane, ethyltri-n-propoxysilane, ethyltriisopropoxysilane, ethyltri-n-butoxysilane, ethyltri-sec-butoxysilane, ethyltri-t-butoxysilane, ethyltriphenoxysilane, n-propyltrimethoxysilane, n-propyltriethoxysilane, n-propyltri-n-propoxysilane, n-propyltriisopropoxysilane, n-propyltri-n-butoxysilane, n-propyltri-sec-butoxysilane, n-propyltri-t-butoxysilane, n-propyltriphenoxysilane, isopropyltrimethoxysilane, isopropyltriethoxysilane, isopropyltri-n-propoxysilane, isopropyltriisopropoxysilane, isopropyltri-n-butoxysilane, isopropyltri-sec-butoxysilane, isopropyltri-t-butoxysilane, isopropyltriphenoxysilane, n-butyltrimethoxysilane, n-butyltriethoxysilane, n-butyltri-n-propoxysilane, n-butyltriisopropoxysilane, n-butyltri-n-butoxysilane, n-butyltri-sec-butoxysilane, n-butyltri-t-butoxysilane, n-butyltriphenoxysilane, sec-butyltrimethoxysilane, sec-butylisotriethoxysilane, sec-butyltri-n-propoxysilane, sec-butyltriisopropoxysilane, sec-butyltri-n-butoxysilane, sec-butyltri-sec-butoxysilane, sec-butyltri-t-butoxysilane, sec-butyltriphenoxysilane, tert-butyltrimethoxysilane, tert-butyltriethoxysilane, tert-butyltri-n-propoxysilane, tert-butyltriisopropoxysilane, tert-butyltri-n-butoxysilane, tert-butyltri-sec-butoxysilane, tert-butyltri-t-butoxysilane, tert-butyltriphenoxysilane, dimethyldimethoxysilane, dimethyldiethoxy silane, dimethyl-di-n-propoxysilane, dimethyldiisopropoxysilane, dimethyl-di-n-butoxysilane, dimethyl-di-sec-butoxysilane, dimethyl-di-tert-butoxysilane, dimethyldiphenoxysilane, diethyldimethoxysilane, diethyldiethoxysilane, diethyl-di-n-propoxysilane, diethyldiisopropoxysilane, diethyl-di-n-butoxysilane, diethyldi-sec-butoxysilane, diethyl-di-tert-butoxysilane, diethyldiphenoxysilane, di-n-propyldimethoxysilane, di-n-propyldiethoxysilane, di-n-propyl-di-n-propoxysilane, di-n-propyldiisopropoxysilane, di-n-propyl-di-n-butoxysilane, di-n-propyl-di-sec-butoxysilane, di-n-propyl-di-tert-butoxysilane, di-n-propyl-di-phenoxysilane, diisopropyldimethoxysilane, diisopropyldiethoxysilane, diisopropyl-di-n-propoxysilane, diisopropyldiisopropoxysilane, diisopropyl-di-n-butoxysilane, diisopropyl-di-sec-butoxysilane, diisopropyl-di-tert-butoxysilane, diisopropyldiphenoxysilane, di-n-butyldimethoxysilane, di-n-butyldiethoxysilane, di-n-butyl-di-n-propoxysilane, di-n-butyldiisopropoxysilane, di-n-butyl-di-n-butoxysilane, di-n-butyl-di-sec-butoxysilane, di-n-butyl-di-tert-butoxysilane, di-n-butyl-di-phenoxysilane, di-sec-butyldimethoxysilane, di-sec-butyldiethoxysilane, di-sec-butyl-di-n-propoxysilane, di-sec-butyldiisopropoxysilane, di-sec-butyl-di-n-butoxysilane, di-sec-butyl-di-sec-butoxysilane, di-sec-butyl-di-tert-butoxysilane, di-sec-butyl-di-phenoxysilane, di-tert-butyldimethoxysilane, di-tert-butyldiethoxysilane, di-tert-butyldi-n-propoxysilane, di-tert-butyldiisopropoxysilane, di-tert-butyldi-n-butoxysilane, di-tert-butyldi-sec-butoxysilane, di-tert-butyl-di-tert-butoxysilane, di-tert-butyldi-phenoxysilane, vinyltrimethoxysilane, vinyltriethoxysilane, vinyltri-n-propoxysilane, vinyltri-iso-propoxysilane, vinyltri-n-butoxysilane, vinyltri-sec-butoxysilane, vinyltri-tert-butoxysilane, vinyltriphenoxysilane, allyltrimethoxysilane, allyltriethoxysilane, allyltri-n-propoxysilane, allyltri-iso-propoxysilane, allyltri-n-butoxysilane, allyltri-sec-butoxysilane, allyltri-tert-butoxysilane, and allyltriphenoxysilane. The foregoing materials can be used individually or in combination.

Non-limiting examples of the compounds of the Formula (4) include tetramethoxysilane, tetraethoxysilane, tetra-n-propoxysilane, tetra-iso-propoxysilane, tetra-n-butoxysilane, tetra-sec-butoxysilane, tetra-tert-butoxysilane, and tetraphenoxysilane. The foregoing materials can be used individually or in combination.

Non-limiting examples of compounds in which z is zero in the general Formula (5) include hexamethoxydisilane, hexaethoxydisilane, hexaphenoxydisilane, 1,1,1,2,2-pentamethoxy-2-methyldisilane, 1,1,1,2,2-pentaethoxy-2-methyldisilane, 1,1,1,2,2-pentaphenoxy-2-methyldisilane, 1,1,1,2,2-pentamethoxy-2-ethyldisilane, 1,1,1,2,2-pentaethoxy-2-ethyldisilane, 1,1,1,2,2-pentaphenoxy-2-ethyldisilane, 1,1,1,2,2-pentamethoxy-2-phenyldisilane, 1,1,1,2,2-pentaethoxy-2-phenyldisilane, 1,1,1,2,2-pentaphenoxy-2-phenyldisilane, 1,1,2,2-tetramethoxy-1,2-dimethyldisilane, 1,1,2,2-tetraethoxy-1,2-dimethyldisilane, 1,1,2,2-tetraphenoxy-1,2-dimethyldisilane, 1,1,2,2-tetramethoxy-1,2-diethyldisilane, 1,1,2,2-tetraethoxy-1,2-diethyldisilane, 1,1,2,2-tetraphenoxy-1,2-diethyldisilane, 1,1,2,2-tetramethoxy-1,2-diphenyldisilane, 1,1,2,2-tetraethoxy-1,2-diphenyldisilane, 1,1,2,2-tetraphenoxy-1,2-diphenyldisilane, 1,1,2-trimethoxy-1,2,2-trimethyldisilane, 1,1,2-triethoxy-1,2,2-trimethyldisilane, 1,1,2-triphenoxy-1,2,2-trimethyldisilane, 1,1,2-trimethoxy-1,2,2-triethyldisilane, 1,1,2-triethoxy-1,2,2-triethyldisilane, 1,1,2-triphenoxy-1,2,2-triethyldisilane, 1,1,2-trimethoxy-1,2,2-triphenyldisilane, 1,1,2-triethoxy-1,2,2-triphenyldisilane, 1,1,2-triphenoxy-1,2,2-triphenyldisilane, 1,2-dimethoxy-1,1,2,2-tetramethyldisilane, 1,2-diethoxy-1,1,2,2-tetramethyldisilane, 1,2-diphenoxy-1,1,2,2-tetramethyldisilane, 1,2-dimethoxy-1,1,2,2-tetraethyldisilane, 1,2-diethoxy-1,1,2,2-tetraethyldisilane, 1,2-diphenoxy-1,1,2,2-tetraethyldisilane, 1,2-dimethoxy-1,1,2,2-tetraphenyldisilane, 1,2-diethoxy-1,1,2,2-tetraphenyldisilane, and 1,2-diphenoxy-1,1,2,2-tetraphenyldisilane. The foregoing materials can be used individually or in combination.

Non-limiting examples of the compounds of the general Formula (5) in which z is 1 include bis(trimethoxysilyl)methane, bis(triethoxysilyl)methane, bis(tri-n-propoxysilyl)methane, bis(tri-iso-propoxysilyl)methane, bis(tri-n-butoxysilyl)methane, bis(tri-sec-butoxysilyl)methane, bis(tri-tert-butoxysilyl)methane, 1,2-bis(trimethoxysilyl)ethane, 1,2-bis(triethoxysilyl)ethane, 1,2-bis(tri-n-propoxysilyl)ethane, 1,2-bis(tri-iso-propoxysilyl)ethane, 1,2-bis(tri-n-butoxysilyl)ethane, 1,2-bis(tri-sec-butoxysilyl)ethane, 1,2-bis(tri-tert-butoxysilyl)ethane, 1-(dimethoxymethylsilyl)-1-(trimethoxysilyl)methane, 1-(diethoxymethylsilyl)-1-(triethoxysilyl)methane, 1-(di-n-propoxymethylsilyl)-1-(tri-n-propoxysilyl)methane, 1-(di-iso-propoxymethylsilyl)-1-(tri-iso-propoxysilyl)methane, 1-(di-n-butoxymethylsilyl)-1-(tri-n-butoxysilyl)methane, 1-(di-sec-butoxymethylsilyl)-1-(tri-sec-butoxysilyl)methane, 1-(di-tert-butoxymethylsilyl)-1-(tri-tert-butoxysilyl)methane, 1-(dimethoxymethylsilyl)-2-(trimethoxysilyl)ethane, 1-(diethoxymethylsilyl)-2-(triethoxysilyl)ethane, 1-(di-n-propoxymethylsilyl)-2-(tri-n-propoxysilyl)ethane, 1-(di-iso-propoxymethylsilyl)-2-(tri-iso-propoxysilyl)ethane, 1-(di-n-butoxymethylsilyl)-2-(tri-n-butoxysilyl)ethane, 1-(di-sec-butoxymethylsilyl)-2-(tri-sec-butoxysilyl)ethane, 1-(di-tert-butoxymethylsilyl)-2-(tri-tert-butoxysilyl)ethane, bis(dimethoxymethylsilyl)methane, bis(diethoxymethylsilyl)

methane, bis(di-n-propoxymethylsilyl)methane, bis(di-isopropoxymethylsilyl)methane, bis(di-n-butoxymethylsilyl)methane, bis(di-sec-butoxymethylsilyl)methane, bis(di-tert-butoxymethylsilyl)methane, 1,2-bis(dimethoxymethylsilyl)ethane, 1,2-bis(diethoxymethylsilyl)ethane, 1,2-bis(di-n-propoxymethylsilyl)ethane, 1,2-bis(di-iso-propoxymethylsilyl)ethane, 1,2-bis(di-n-butoxymethylsilyl)ethane, 1,2-bis(di-sec-butoxymethylsilyl)ethane, 1,2-bis(di-tert-butoxymethylsilyl)ethane, 1,2-bis(trimethoxysilyl)benzene, 1,2-bis(triethoxysilyl)benzene, 1,2-bis(tri-n-propoxysilyl)benzene, 1,2-bis(tri-iso-propoxysilyl)benzene, 1,2-bis(tri-n-butoxysilyl)benzene, 1,2-bis(tri-sec-butoxysilyl)benzene, 1,2-bis(tri-tert-butoxysilyl)benzene, 1,3-bis(trimethoxysilyl)benzene, 1,3-bis(triethoxysilyl)benzene, 1,3-bis(tri-n-propoxysilyl)benzene, 1,3-bis(tri-iso-propoxysilyl)benzene, 1,3-bis(tri-n-butoxysilyl)benzene, 1,3-bis(tri-sec-butoxysilyl)benzene, 1,3-bis(tri-tert-butoxysilyl)benzene, 1,4-bis(trimethoxysilyl)benzene, 1,4-bis(triethoxysilyl)benzene, 1,4-bis(tri-n-propoxysilyl)benzene, 1,4-bis(tri-iso-propoxysilyl)benzene, 1,4-bis(tri-n-butoxysilyl)benzene, 1,4-bis(tri-sec-butoxysilyl)benzene, and 1,4-bis(tri-tert-butoxysilyl)benzene. The foregoing materials can be used individually or in combination.

The first and/or second polymer of the polymer mixture can include optional repeat units derived from a variety of co-monomers selected based upon the exposure/development properties desired in a segregated polymer domain. For example, when monomers and co-monomers are polymerized to form a polymer capable of a negative tone response, crosslinking groups can be included as part of the co-monomer. A crosslinking group as defined herein involves a functionality, which, upon treatment with a catalyst, exposes an electrophilic center or centers capable of subsequent reaction with an intrinsic, polymeric nucleophile. This reaction induces a solubility change among the affected polymer chains rendering them insoluble in a basic developer. Examples of such co-monomers include: furfurylmethacrylate, tetrahydrofurfurylmethacrylate, 3-furfuryloxy-2-hydroxyprop-1-yl methacrylate, tetracyclo[5.2.1.0$^{2,7}$.0$^{4,6}$]-5-oxo-undecanyl-10-methacrylate, tetracyclo[5.2.1.0$^{2,7}$.0$^{4,6}$]-5-oxo-undecanyl-10-acrylate, glycidyl methacrylate, epoxydicyclopentadiene methacrylate, and 2-methacryloxy-6-hydroxymethylnaphthalene. Alternatively, for negative tone behavior, the optional co-monomer can contain a nucleophilic site, such as an alcohol. In such cases, a separate crosslinking agent can be added to the polymer mixture. Such a crosslinking agent can attach to the polymer of the segregated domain by reaction with the nucleophilic group during processing. Examples of such crosslinking agents include but are not limited to glycouril, melamine, epoxide, and vinyl ether, and combinations thereof. Examples of such nucleophilic co-monomers include: 2-methacryloyloxy-6-hydroxymethylnaphthalene, 6-methacryloyloxymethyl-2-naphthol, 2-hydroxyethylmethacrylate, 3-hydroxy-1-adamantylmethacrylate, 3-hydroxy-1-adamantylacrylate, 2-methacryloxy-5-hydroxymethylnorbornane, and 2-acryloyloxy-5-hydroxymethylnorbornane.

Similarly, optional co-monomers can be selected for positive tone behavior. Such monomers can be chosen from the group of monomers that contain acid labile moieties such as tertiary allyl carbonates, tertiary alkyl esters, tertiary alkyl ethers, acetals or ketals. Non-limiting examples of such acid labile optional co-monomers include the following: t-butyl (meth)acrylate, 1-methyl-cyclopentyl(meth)acrylate, 2-methyladamantan-2-yl(meth)acrylate, 2-ethyladamantan-2-yl (meth)acrylate, 2-n-propyladamantan-2-yl(meth)acrylate, 2-isopropyladamantan-2-yl(meth)acrylate, 1-(adamantan-1-yl)-1-methylethyl(meth)acrylate, 2-methylbicyclo[2.2.1]hept-2-yl(meth)acrylate, 2-ethylbicyclo[2.2.1]hept-2-yl(meth)acrylate, 8-methyltricyclo[5.2.1.0$^{2,6}$]dec-8-yl(meth)acrylate, 8-ethyltricyclo[5.2.1.0$^{2,6}$]dec-8-yl(meth)acrylate, 4-methyltetracyclo[6.2.1.1$^{3,6}$.0$^{2,7}$]dodec-4-yl(meth)acrylate, 4-ethyltetracyclo[6.2.1.1$^{3,6}$.0$^{2,7}$]dodec-4-yl(meth)acrylate, 1-(tetracyclo[6.2.1.1$^{3,6}$.0$^{2,7}$]dodec-4-yl)-1-methylethyl(meth)acrylate, and 1,1-dicyclohexylethyl(meth)acrylate. The foregoing materials can be used individually or in combination.

The first polymer and/or the second polymer can possess properties suitable for use as a chemically amplified material when exposed to electron beam, x-ray, extreme ultraviolet, and/or other wavelengths of photon radiation. Chemical amplification can be achieved or accelerated by a post exposure bake ("PEB").

The first and/or second polymers of the polymer mixture can be prepared, for example, by polymerizing a mixture of monomers in an appropriate solvent in the presence of a chain transfer agent, as required, using a radical polymerization initiator such as hydroperoxide, dialkyl peroxide, diacyl peroxide, or azo compound.

Examples of solvents that can be used for the polymerization include cycloalkanes such as cyclohexane, cycloheptane, cyclooctane, decalin, and norbornane; cyclic ethers such as tetrahydrofuran and 1,4-dioxane; saturated carboxylic acid esters such as ethyl acetate, n-butyl acetate, i-butyl acetate, methyl propionate, and propylene glycol monomethyl ether acetate; alkyllactones such as γ-butyrolactone; alkylketones such as 2-butanone, 2-heptanone, and methyl isobutyl ketone; cycloalkylketones such as cyclohexanone; and alcohols such as 2-propanol and propylene glycol monomethyl ether. These solvents can be used either individually or in combination.

The polymerization temperature is usually from 40° C. to 120° C., and more particularly from 50° C. to 100° C. The reaction time is usually from 1 to 48 hours, and more particularly from 1 to 24 hours. After cooling the reaction to room temperature, the polymer can be isolated by precipitation into an excess volume, for example twenty-fold, of an appropriate non-solvent. The polymer can be isolated by filtration, washed with the non-solvent and dried to a constant weight under vacuum. Alternatively, the polymer can be isolated by liquid-liquid extraction to remove non-reacted monomer and other by-products.

The first and/or second polymer preferably contains impurities such as halogens, metals, residual monomers, and oligomer components in a specific amount less than 0.1 wt. % based on total weight of the polymer, when measured by HPLC. In particular, the content of free metallic species is preferably less than 100 ppm and more preferably less than 1 ppm. This not only further improves sensitivity, resolution, process stability, pattern profile, and the like, but also enables provision of a radiation-sensitive resin composition having minimal foreign particle contamination in the solution, and showing minimal change in sensitivity over time.

The first polymer and second polymer can have a molecular weight between about 500 to about 500,000 daltons, preferably between about 1,000 to about 100,000 daltons, most preferably between about 5,000 to about 50,000.

More specifically, the weight average molecular weight (Mw) of the first polymer can be 300 to 100000 g/mol, more particularly 500 to 50000 g/mol, and even more particularly 500 to 40000 g/mol. The weight average molecular weight (Mw) of the second polymer can be 300 to 100000 g/mol, more particularly 500 to 50000 g/mol, and even more particularly 500 to 40000 g/mol.

The glass transition temperature (Tg) of the first polymer can be −100° C. to 300° C., more particularly −50° C. to 250° C., and even more particularly −50° C. to 180° C. The glass transition temperature (Tg) of the second polymer can be −100° C. to 300° C., more particularly −50° C. to 250° C., and even more particularly −50° C. to 180° C.

The polymer mixture can further comprise performance enhancing additives, including but not limited to photoacid generators, acid amplifiers, surfactants, base quenchers, photodestructible bases, nanoparticles, polymer-bound metallic compounds, inorganic compounds, crosslinking agents, photobase generators, adhesion promoters, dissolution inhibitors, dissolution accelerators, and defoaming agents. In general, these additives, when used, comprise less than about 10 wt. % of the polymer mixture, and most preferably less than about 1 wt. % of the polymer mixture, based on total weight of the polymer mixture excluding any solvent.

The photoacid generators (PAGs) are capable of producing or generating an amount of acid (such as 1 mole of acid per mole of PAG, for example) upon exposure to a dose of electromagnetic radiation, such as visible, ultraviolet (UV) and extreme ultraviolet (EUV), for example. Exemplary photoacid generators are onium salts, such as an iodonium salt, sulfonium salt, diazonium salt. Other photoacid generators include succinimide derivatives, and aromatic sulfonic acid esters of N-hydroxyamides, imides. More particular photoacid generators include 4-(1-butoxynaphthyl)tetrahydrothiophenium nonafluorobutanesulfonate, triphenyl sulfonium nonafluorobutanesulfonate (TPSN), (trifluoromethylsulfonyloxy)-bicyclo[2.2.1]hept-5-ene-2,3-dicarboximide (MDT), t-butylphenyl diphenyl sulfonium perfluorobutanesulfonate, 4-(1-butoxynaphthyl)tetrahydrothiophenium perfluorooctanesulfonate, triphenyl sulfonium perfluorooctanesulfonate, t-butylphenyl diphenyl sulfonium perfluorooctanesulfonate, di(t-butylphenyl) iodonium perfluorobutane sulfonate, di(t-butylphenyl) iodonium perfluorohexane sulfonate, di(t-butylphenyl)iodonium perfluoroethylcyclohexane sulfonate, di(t-butylphenyl)iodonium camphorsulfonate, N-hydroxy-naphthalimide dodecane sulfonate (DDSN), and perfluorobutylsulfonyloxybicylo[2.2.1]-hept-5-ene-2,3-dicarboximide (MDT). The photoacid generators can be used singly or as a mixture of two or more.

Surfactants can be used to improve coating uniformity, and can include ionic, non-ionic, monomeric, oligomeric, polymeric species, which can be used individually or in combination. Examples of possible surfactants include fluorine-containing surfactants such as the FLUORAD series available from 3M Company in St. Paul, Minn., and siloxane-containing surfactants such as the SILWET series available from Union Carbide Corporation in Danbury, Conn.

The polymer mixture can further comprise a base quencher for controlling acid diffusion. A wide variety of compounds with varying basicity can be used as stabilizers and acid-diffusion controlling additives, including nitrogenous compounds such as aliphatic primary, secondary, and tertiary amines, cyclic amines such as piperidines, pyrimidines, morpholines, aromatic heterocycles such as pyridines, pyrimidines, purines, imines such as diazabicycloundecene, guanidines, imides, amides, and others. Ammonium salts can also be used, including ammonium, primary, secondary, tertiary, and quaternary alkyl- and arylammonium salts of alkoxides including hydroxide, phenolates, carboxylates, aryl and alkyl sulfonates, sulfonamides, and others. Other cationic nitrogenous compounds including pyridinium salts and salts of other heterocyclic nitrogenous compounds with anions such as alkoxides including hydroxide, phenolates, carboxylates, aryl and alkyl sulfonates, sulfonamides, and the like, can also be employed. More particular base quenchers include: tetra alkyl ammonium hydroxides, acetyltrimethyl ammonium hydroxide, dimethylamino pyridine, 7-diethylamino-4-methyl coumarin (Coumarin 1), tertiary amines, sterically hindered diamine and guanidine bases such as 1,8-bis(dimethylamino)naphthalene (PROTON SPONGE), berberine, or polymeric amines such as in the PLURONIC or TETRONIC series commercially available from BASF. The base quenchers can be used singly or in combination.

Nanoparticles include materials such as inorganic oxides (alumina, titania, halfnia, etc.), inorganic nitrides, inorganic carbide, or metals (gold, etc.). A nanoparticle as used herein is a particle on the order of 1 nanometer (nm) to 100 nm in dimension. Non-limiting examples of nanoparticles include nanorods, nanosheets, nanospheres, nanocylinders, nanocubes, nanofilaments, nanolamellae, and the like having solid composition and a minimal structural dimension in a range from about 1 nm to about 100 nm.

Polymer-bound metallic compounds include organometallic compounds, such as ferrocene, which can impart high oxygen etch resistance to the polymer domain in which the metal compound are dissolved.

Inorganic compounds include organosilicates or organosilicon/organogermanium compounds. The relative properties of the polymers can be tuned by incorporating an inorganic material such as an organosilicate, which can complex with one of the polymers of the polymer mixture. The complex can dramatically increase the oxygen plasma etch resistance of the polymer. Alternatively, as described above, one or more of the segregating polymers can contain elements such as silicon in a repeat unit, thereby providing high oxygen etch resistance, as with the methacrylate monomer BTMSMMA.

Casting Solution.

The polymer mixture (e.g., first and second polymers, acid generator, base quencher, and/or auxiliary components) can be dissolved in a solvent to form a casting solution using conventional methods known to those skilled in the art. Once all components are dissolved and distributed in the solution, the solution can be filtered and optionally treated with, for example, ion exchanging media, so as to remove undesired components such as trace acids, bases or metals. Exemplary solvents include ethers, glycol ethers, aromatic hydrocarbons, ketones, esters, ethyl lactate, gamma-butyrolactone (GBL), cyclohexanone, ethoxyethylpropionate (EEP), a combination of EEP and GBL, and propylene glycol methyl ether acetate (PGMEA). The embodiments described herein are not limited to the selection of any particular solvent or additives, providing the solvent and any optional additives do not adversely affect the photoresist pattern, the underlying layers of the support member, and/or segregation of the polymer mixture. Preferred solvents can be removed by heat and/or vacuum treatment under conditions that also promote segregation of the polymer mixture. In an embodiment, the solvent is PGMEA.

The casting solution has a solids content of about 1 wt. % to 30 wt. %, and more particularly 1 wt. % to 5 wt. % based on total weight of the casting solution. The segregating polymers of the polymer mixture are present in the casting solution in about equal amounts by weight. In an embodiment, the first polymer and the second polymer are present in a ratio of 40:60 to 60:40 by weight, and more preferably 45:55 to 55:45 by weight:

Applying the polymer mixture to the pre-patterned structure is not limited to any particular technique. In an embodiment, applying the polymer mixture comprises casting a solution of the polymer mixture dissolved in a solvent on a pre-patterned structure, and removing the solvent from the casted solution. The applied polymer mixture has the form of a thin film, which is substantially located in the trench areas of photoresist pattern. Casting can be accomplished by spin coating the solution at a spin speed of about 1 rpm to about 10,000 rpm at room temperature. Other casting methods can be employed, such as dip-coating, spray-coating, or combinations thereof. The casted polymer mixture can be thermally annealed and/or baked in one or more steps and at one or more temperatures in order to remove the casting solvent and/or induce/accelerate segregation of the polymer mixture. Thermal annealing is generally performed at a temperature above the glass transition temperature of each of the polymers in the polymer mixture, such as 80° C. to 300° C. for 10 sec to 1 hour. Alternatively, the casted film can be vapor annealed, such as by annealing the casted film under organic solvent vapor at or above room temperature (about 25° C.) from about 10 hours to about 15 hours, for example.

The thickness of the applied polymer mixture is about 5 nanometers (nm) to about 500 nm after all or substantially all of the casting solvent has been removed.

Support Member.

A support member, as used herein, is a physical body (e.g., a layer or a laminate, a material, and the like) onto which materials (such as polymers, polymeric materials, photoresists, metals, oxides, dielectrics, etc.) can be deposited or adhered.

Exemplary support member materials include semiconducting materials, insulating materials, conductive materials, or any combination thereof. The support member can comprise one or more layers. Semiconducting materials include Si, SiGe, SiGeC, SiC, GaAs, InAs, InP and other III/V or II/VI compound semiconductors. A support member can comprise, for example, a silicon wafer or process wafer such as that produced in various steps of a semiconductor manufacturing process, such as an integrated semiconductor wafer. A layered support member can comprise, for example, Si/SiGe, Si/SiC, silicon-on-insulators (SOIs) or silicon germanium-on-insulators (SGOIs). A support member can comprise a dielectric layer, a barrier layer for copper such as SiC, a metal layer such as copper, a hafnium dioxide layer, a silicon layer, a silicon oxide layer, a silicon nitride layer, a silicon oxynitride (SiON) layer, or combinations thereof. A support member can comprise an insulating material such as an organic insulator, an inorganic insulator, or a combination thereof, including multi-layers thereof. A support member can comprise a conductive material, for example, polycrystalline silicon (polySi), an elemental metal, alloys of elemental metals, a metal silicide, a metal nitride, or combinations thereof, including multi-layers thereof. A support member can comprise ion implanted areas, such as ion implanted source/drain areas having P-type or N-type diffusions active to the surface of the support member.

The support member can include a combination of a semiconducting material and an insulating material, a combination of a semiconducting material and a conductive material or a combination of a semiconducting material, an insulating material and a conductive material. An example of a support member that includes a combination of the above is an interconnect structure.

The support member can comprise holes, posts, islands, lines, and/or trenches that can be isolated or nested, whose surfaces can contact the applied polymer mixture and guide segregation.

Additional materials (such as a RELACS-type material) can be used to modify the pre-patterned structure surface areas, including the surface of the support member, that can contact the polymer mixture. The additional materials can be deposited onto the sidewalls to adjust the chemical properties of the sidewall such that they will have an increased or decreased affinity for one or more of the polymers in the polymer mixture. For example, a polar chemical shrink material can be used to increase the polarity of the sidewalls to favor interactions with the more polar polymer of the polymer mixture. In another example, a more hydrophobic shrink material can be deposited on the sidewalls to favor interactions with a non-polar polymer of the polymer mixture. In another example, shrink materials having functional groups can be deposited on the sidewalls to increase the affinity of a specific polymer by ionic bonding and/or hydrogen bonding interactions.

The support member can comprise an antireflection sub-structure comprising one or more layers. The anti-reflection sub-structure can comprise an organic and/or inorganic material. For example, the anti-reflection sub-structure can comprise i) a dielectric layer that has a substantially zero absorption, the dielectric layer comprising $Al_2O_3$, $SiO_2$, $TiO_2$, $Ta_2O_5$, $Cr_2O_3$, or $Si_3N_4$; and ii) a radiation absorbing layer comprising Ta, Ti, Cr, Al, Ni, or Ir. In another example, the anti-reflection sub-structure can comprise a crosslinked polymer layer. In another example, the anti-reflection sub-structure can comprise an amorphous carbon layer. In another example, the anti-reflection sub-structure can comprise an oxide or nitride material. In another example, the anti-reflection sub-structure can consist of a two layer structure comprising an organic layer and an inorganic layer. The absorbing layer can reside beneath a feature of the photoresist element, contacting the element (e.g., photoresist material) and the polymer mixture.

Exposure and Development of Segregated Domains.

The disclosed methods can comprise one or more patternwise exposure steps using electron beam, x-ray, ion beam, extreme ultraviolet radiation, and/or other wavelengths of photon radiation. A preferred photon source emits ultraviolet radiation of wavelength 193 nm, 157 nm, or less. Another preferred source emits extreme ultraviolet radiation of wavelength 13.5 nm or less.

The exposed areas of the segregated structure can be developed by, for example, immersion, puddle development, or other processes known to those skilled in the art. A development process selectively removes exposed regions of one or more of the polymer domains, non-exposed regions of one or more of the polymer domains, exposed regions of the element, non-exposed regions of the element, or combinations thereof. Exemplary development processes include solution processes such as development in an aqueous base solution, which can contain a surfactant. Exemplary bases include alkali metal hydroxide, ammonium hydroxide, tetramethylammonium hydroxide (TMAH) or other organic bases. Solvent development processes employ a rinse with an organic solvent, such as cyclohexane, benzene, toluene, mesitylene, ethylene glycol, butanediol, dimethyl ether, diethyl ether, methyl ethyl ether, acetone, methyl ethyl ketone, methyl amyl ketone, anisole, n-butyl acetate, and similar solvents. Alternatively, the development process can be a plasma etching process, which selectively removes exposed or non-exposed regions of a segregated polymer domain and/or photoresist substructure.

The first and/or second polymer domains can exhibit negative tone behavior, meaning the exposed regions of the first and/or second polymer domains are rendered less soluble than the exposed areas in a developer, which is typically an aqueous alkali developer or an organic solvent. The decrease in solubility is reflected in a reduced dissolution rate of the exposed material in the developer. In particular, it is desirable for there to be a substantial difference in the dissolution rate of the exposed and non-exposed regions. Thus, the dissolution rate of the polymer domain in the exposed regions can be non-zero, yet still exhibit acceptable negative tone behavior. Thus, the polymeric matrix of a negative tone domain contains an inherently soluble material that is transformed into an insoluble material by means of the exposure and/or by a catalytic mechanism initiated by the exposure, such as a radiation-generated strong acid. The nature of the catalytic mechanism can include crosslinking reactions that convert the polymer chains of the first and/or second polymer domains into an insoluble network. Alternatively, the mechanism can involve the chemical transformation of solubilizing functionalities of the parent polymer into insoluble functionalities.

Alternatively the first and/or second polymer domains can exhibit positive tone behavior, meaning the exposed regions of the first and/or second polymer domains are rendered more soluble in a developer. Positive tone materials typically comprise a polymer matrix that is essentially a protected form of a material that is intrinsically soluble in the developer, but is rendered insoluble by the blocking or protecting groups. These blocking or protecting groups can be catalytically acid labile functionalities. The protecting group can be removed to generate a developer-soluble material by the action of a strong acid catalyst. This can be accomplished by imagewise exposure to the appropriate radiation and the subsequent generation of acid by the radiation-sensitive components of the photoresist formulation, for example a photoacid generator (PAG), a material that is specifically designed to decompose to form strong acid upon exposure to the appropriate radiation. The degree of protection can be chosen to most effectively modulate the dissolution characteristics of the polymer in developer (e.g., aqueous alkali), such that non-exposed cast films of the material are insoluble and exposed areas are rendered soluble by deprotection of the aforementioned acid labile groups.

In an embodiment, one polymer of the polymer mixture has positive tone behavior when exposed and developed after segregation, and a second polymer of the polymer mixture has negative tone behavior when exposed and developed after segregation. In another embodiment, one polymer domain of a segregated structure or a modified segregated structure has positive tone behavior when exposed and developed after segregation, and a second polymer domain of the segregated structure or the modified segregated structure has negative tone behavior when exposed and developed after segregation.

After exposure, a thermal treatment (post exposure bake, PEB) can be applied to afford sufficient deprotection of the protecting groups in one or more of the polymers. The PEB can be performed at a temperature of about 80° C. to about 120° C. for a period of about 10 seconds to about 120 seconds. A preferred PEB is at about 100° C. for 60 seconds.

Upon treatment with developer, the regions that have been rendered soluble can be dissolved away leaving topographical features comprising one or more of the polymer domains and optionally the element of the pre-patterned structure. The developed image can then be rinsed with water to remove excess developer and dried. The topographical features, optionally the element, can then be used as an etch mask for subsequent pattern transfer into the underlying support member. Transferring a pattern formed by the topographical features to the support member can include but is not limited to, a process comprising a reactive ion etch, and stripping the topographical features derived from the polymer domains from the support member, for example, using a stripping solvent.

INDUSTRIAL APPLICABILITY

The disclosed methods are particularly useful as radiation-sensitive materials employed in the manufacture of electronic parts, especially semiconductor devices, or in the manufacture of photolithography masks using optical, electron beam, ion beam or x-ray radiation. Moreover, the methods can be employed for patterning printed circuit boards or photolithographic masks (i.e., photomasks), micromachining, the fabrication of microfluidic cells, or other related practices that require the definition of high resolution patterns having a feature pitch of 50 nm to 250 nm, and more particularly 80 nm to 150 nm.

Processes employing double patterning and sidewall image transfer techniques, when used to create patterns with dimensions and/or pitches smaller than that of an initial pattern produced by optical lithography, are very costly and process intensive. Often, they require multiple patterning, deposition, or etch steps. Polymer segregation techniques, which involve primarily casting and baking steps, can be performed within a single track tool. This track-only process would advantageously lower process costs and increase throughput. In addition, double patterning and sidewall image transfer techniques only allow for the fabrication of patterns which are simple interpolations of the initial pattern. As a result, additional block out or cut masks must be used to trim the resultant features and create more complex patterns. In current practice, this requires coating the support member with an additional photopatternable material (and other materials such as organic planarizing layers, anti-reflection coatings, etc.) prior to photopatterning using the block out or cut mask. The photoresist pattern must then be transferred into the underlying features by a series of etch processes. This requires the wafer to be transferred out of the lithography track tool to various etch tools. This overall process is long, complicated, and expensive.

By combining i) polymer segregation of a polymer blend comprising at least one lithographically patternable polymer, which imparts control of the lateral dimension of the segregated polymer domains, with ii) patternwise exposures that discriminate between domains and provide geometric shaping in two dimensions, the disclosed methods provide a pathway for generating complex patterns of topographical features having lower critical dimensions than previous methods that rely on polymer segregation alone. The disclosed methods do not require the deposition of additional photoresist (and other) materials. The disclosed methods also minimize the number of etch processes required to transfer the final pattern. The disclosed methods also overcome disadvantages of conventional processes such as thermal reflow, RELACS, or SAFIER, which have detrimental dependencies on pattern geometry (density and pitch), process conditions (baking time and temperature) and/or resist chemistry, which limit the critical dimension capability of these approaches.

The following examples illustrate the practice of the disclosed methods.

EXAMPLES

Materials used in the following examples are listed in Table 1.

TABLE 1

| ABBREVIATION | DESCRIPTION | SUPPLIER |
|---|---|---|
| PS | Poly(styrene), Mw = 22 k | Polymer Source |
| PBNA | Poly(bis[trimethylsilyl]methyl methacrylate-co-5-methacryloyloxy-2,6-norbornanecarbolactone-co-gamma-methacryloxy-gamma-methyl-gamma-butyrolactone) random copolymer, 30:20:50 mole %, weight average molecular weight (Mw) = 6092 g/mol, PDI = 1.65 | IBM |
| TPSN | Triphenylsulfonium nonafluorobutanesulfonate | JSR |
| BTMSMMA | bis[trimethylsilyl] methyl methacrylate | IBM |
| NLM | 5-methacryloyloxy-2,6-norbornane carbolactone | JSR |
| ALMA | gamma-methacryloxy-gamma-methyl-gamma-butyrolactone | IBM |
| ARX2928 | Positive-Tone Photoresist | JSR |
| ARC29A | Anti-reflective Coating | Brewer Science |
| TMAH | Tetramethylammonium hydroxide (0.26N aqueous solution) | Fujifilm |

Polymer Materials Used in the Examples.

The polystyrene (PS) used in the examples below has a weight average molecular weight (Mw) of 22 kg/mol. In the example below performed at high dose e-beam exposure, PS exhibits negative tone behavior (non-exposed regions of PS are selectively removed by development with an organic solvent such as cyclohexane).

Preparation of poly(bis[trimethylsilyl]methyl methacrylate-co-5-methacryloyloxy-2,6-norbornanecarbolactone-co-gamma-methacryloxy-gamma-methyl-gamma-butyrolactone] (PBNA)

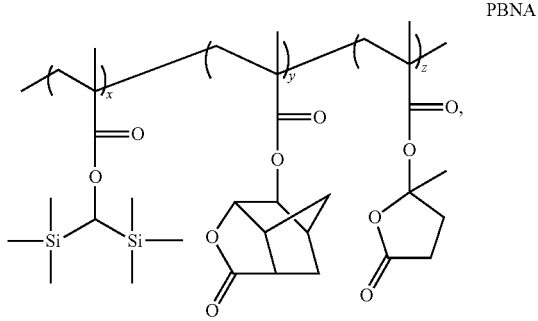

PBNA x:y:z=30:20:50 mole %

BTMSMMA (2.44 g, 0.01 mole), NLM (1.11 g, 0.005 mole), ALMA (1.84 g, 0.01 mole) and 16 grams of tetrahydrofuran were placed in a round bottom flask equipped with a condenser and a nitrogen inlet. 2,2'-Azobisisobutyronitrile (AIBN), (0.164 g, 0.001 mole) and 1-dodecanethiol (0.151 g, 0.00075 mole) were added to this solution and stirred until dissolved. Then, the solution was degassed using four vacuum/nitrogen purges. The contents were then heated to reflux for 18 hours. Afterwards, the solution was added drop wise into hexanes (400 ml). The precipitated polymer was filtered (frit), washed twice with hexanes (100 ml) and dried under vacuum at 60° C. Yield: 3.50 grams. Tg=115° C., Composition according to Inv. Gated $^{13}C$ NMR: x:y:z=30:20:50 mole %. In the examples below, PBNA exhibits positive tone behavior (exposed regions of PBNA are removed with an aqueous base developer).

The PBNA solution in propylene glycol methyl ether acetate (PGMEA) is composed of 95.86 wt. % of (PBNA), 3.82 wt. % of triphenylsulfonium nonafluorobutanesulfonate (TPSN), and 0.32 wt % of 2-phenyl benzimidazole based on total weight of the solution. A PBNA of 30:20:50 mole % with a weight average molecular weight (Mw) of 6092 g/mol and polydispersity index (PDI) of 1.65 is used in this experiment. The chemical structure of TPSN is shown below.

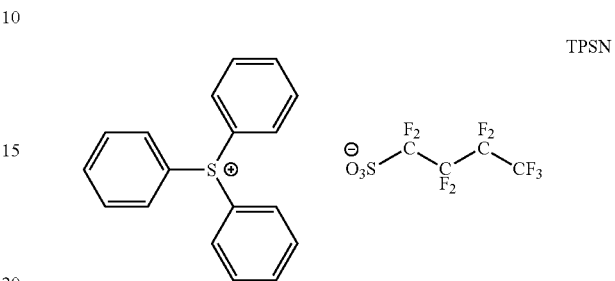

TPSN

Preparation of BTMSMMA.

Bis(trimethylsilyl)chloromethane (14.68 g, 0.075 mole), sodium methacrylate (8.96 g, 0.0825 mole), Adogen 464 (1.7 g), and phenothiazine (0.05 g) were placed in a round bottom flask equipped with a condenser, mechanical stirrer and a nitrogen inlet. The flask was charged with acetonitrile (200 mL) and heated to reflux while stirring. After 4 days, the mixture was filtered to remove the solid and the solvent was removed in a rotary evaporator. Fractional distillation under reduced pressure gave 10.9 g (60% yield) of a clear liquid at 46-48° C. at 0.5 mm pressure.

Preparation of ALMA.

Alpha-angelicalactone (29.54 g, 0.03 mole), methacrylic acid (20.66 g, 0.24 mole), p-toluenesulfonic acid monohydrate (200 mg), and phenothiazine (100 mg) were placed in a round bottom flask equipped with a condenser, mechanical stirrer and a nitrogen inlet. The contents were stirred at room temperature. Within 5 minutes, the reaction became exothermic. The flask was immersed in an ice-bath and stirred for 30 minutes. Afterwards, the ice-bath was removed and stirred at room temperature for 1 hour. The solution was diluted with 150 mL of ethyl ether and treated with 1 mL ammonium hydroxide (28% ammonia in water). Some precipitation occurred. The solution was filtered through a fluted filter paper and washed with 2×150 ml saturated sodium bicarbonate solution followed by 1×50 ml brine, and dried over anhydrous magnesium sulfate for about an hour. The solvent was removed on a rotary evaporator and distilled under reduced pressure to yield 22.2 g of the product which was collected between 83° C. and 93° C., at 0.2 mm pressure.

Preparation of Pre-Patterned Structures.

Pre-patterned structures were prepared using 193 nm lithography using silicon wafer support members having a layer of ARX2928 (JSR) photoresist disposed on a 780 angstrom thick anti-reflection layer of ARC29A (Brewer Science). The resulting photoresist line-space pattern had a half-pitch of 110 nm and a film thickness of 80 nm. This initial structure was then flood exposed using broad band ultraviolet (UV) radiation at a dose of 100 mJ/cm², and then baked at 115° C. for 60 sec, and at 170° C. for 300 sec. This treatment switches the polarity of the photoresist (i.e., deprotects the photoresist), rendering the photoresist line pattern insoluble in PGMEA, and soluble in TMAH developer. The resulting pre-patterned structure was used for the following examples. The UV exposed and baked photoresist line pattern of the pre-patterned structure is the element that topographically guides polymer segregation. Polymer segregation occurs substantially in a lateral direction (i.e., parallel) relative to the plane of the underlying support member surface.

Preparation of Segregated Structure.

A 1 wt. % PGMEA solution of PBNA and PS (polystyrene, Mn=22,000), 50:50 by weight, was prepared from using the above PBNA solution and PS polymer. The PGMEA solution was spin casted on the above prepared pre-patterned structure at 3000 rpm for 30 sec, and then baked at 100° C./60 sec, to generate a segregated structure. PBNA segregated toward the sidewall of the photoresist line features, and PS segregated to the center of the trench. This segregated structure was used in Examples 1A, 1B, 2A, 2B, and 3 below. A schematic overhead view of the segregated structure is shown in FIG. 5A (for Example 1A), which corresponds to the perspective view of FIG. 1C. In FIG. 5A, photoresist feature 14 comprises deprotected ARX2928, first polymer domain 32 comprises PBNA, second polymer domain 34 comprises PS, and support member 12 comprises a silicon wafer coated with ARC29A. The ARC29A coating (not shown) is disposed between the silicon wafer and the segregated polymer layer.

In the following demonstrations, lithographic patterning was carried out using e-beam exposure for the sake of convenience. Direct write e-beam lithography allows for the simple and rapid formation of arbitrary patterns with small dimensions without having to design and fabricate photomasks, for example. In addition, e-beam lithography tools are relatively inexpensive and widely available compared to other high resolution lithographic exposure tools used for 193 nm immersion lithography and extreme ultraviolet lithography. Although these demonstrations were carried out using e-beam lithography, it is to be understood that this choice of exposure technology should in no way be construed as to limit the scope of the invention or impart any recommendation as to the most preferred embodiment of the invention.

Example 1A

Patterning after Segregation, Low E-Beam Dosage

Figure 5C:
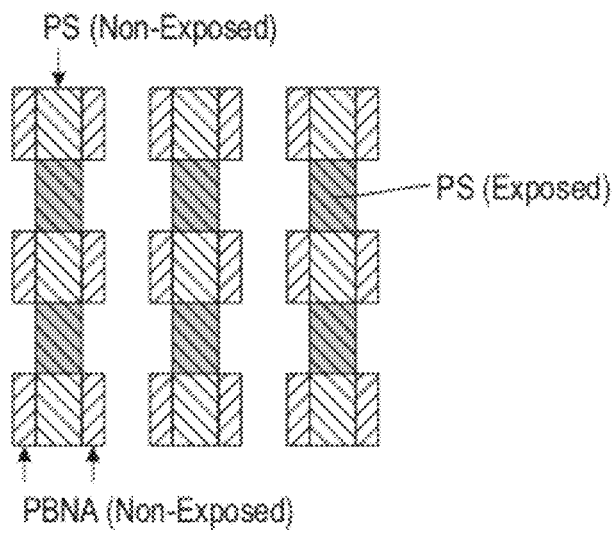
Figure 5D:
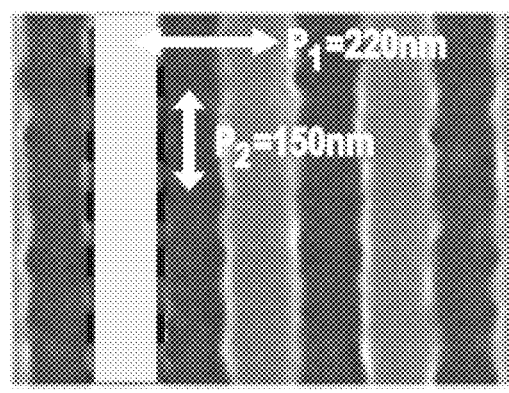
FIG. 5D is a scanning electron micrograph (SEM) of the pattern topographical features formed in Example 1A, which corresponds to the schematic overhead view in FIG. 5C.

FIGS. 5A to 5C are schematic overhead views of in each development step, starting from the segregated structure prepared above. The segregated structure (FIG. 5A) was given a bar pattern exposure to electron beam (E-beam) following segregation. In the exposure step, the segregated structure of FIG. 5A was written with 100 keV electron beam at a dose of 1000 microCoulombs/cm$^2$, indicated by transparent horizontal bars (FIG. 5B). The PS domain was not crosslinked by the electron beam exposure. Following the electron beam exposure, the sample was baked at 100° C. for 60 sec, deprotecting the regions of exposed PBNA domain. The exposed and baked sample was developed in a one post-exposure development process (aqueous TMAH developer) for 30 sec. The photoresist pattern (deprotected ARX2928) and regions of exposed PBNA domain were removed by TMAH development, resulting in the topographical pattern of FIG. 5C. The scanning electron micrograph (SEM) image in FIG. 5D corresponds to the schematic overhead view of FIG. 5C. FIG. 5D shows remaining PS stripes bordered by PBNA dashed lines. The pitch (horizontal distance) between PS stripes is 220 nm which is defined by the ARX2928 photoresist line pattern. The pitch (vertical distance) between the PBNA dashed lines is 150 nm, which is defined by the electron beam exposure.

Example 1B

Patterning after Segregation, High E-Beam Dosage

Figure 6C:
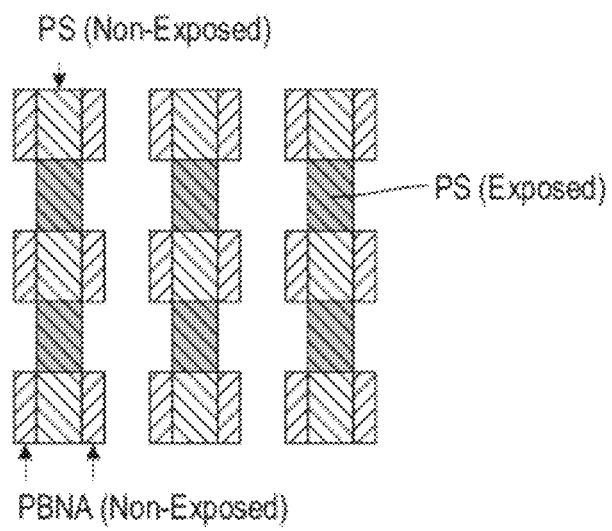
Figure 6D:
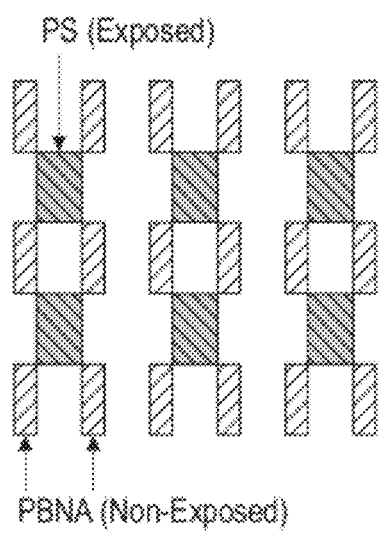
Figure 6E:
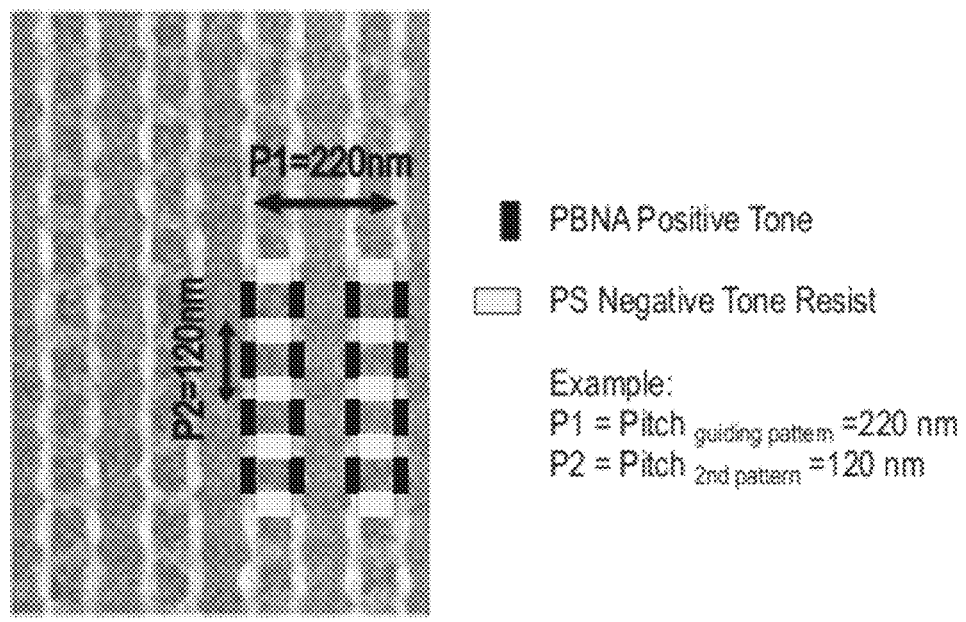
FIG. 6E is a scanning electron micrograph of the pattern of topographical features formed in Example 1B, which corresponds to the schematic overhead view in FIG. 6D.

FIGS. 6A to 6D are schematic overhead views of the patterns formed in this example, starting from the segregated structure prepared above. The segregated structure (FIG. 6A) was exposed by electron beam in the step following segregation. In the exposure step, the segregated structure (FIG. 6A) was written with 100 keV electron beam at a dose of 1400 microCoulombs/cm$^2$, indicated by the transparent horizontal bars in FIG. 6B. A high dose of electron beam crosslinks the PS domain. The exposed sample was baked at 100° C. for 60 sec, deprotecting the regions of exposed PBNA domain. The sample was then given a first post-exposure development in TMAH developer for 30 sec, forming the topographical pattern of FIG. 6C. The ARX2928 photoresist pattern (deprotected ARX2928) and deprotected exposed PBNA domain were removed by the TMAH development. After the TMAH development, the sample was given a second post-exposure development in cyclohexane, which selectively removed regions of non-exposed (non-crosslinked) PS domain, resulting in the topographical pattern of FIG. 6D. FIG. 6E is an SEM image of the sample corresponding to the topographical pattern of FIG. 6D. The SEM image shows a pattern of exposed PS segments and non-exposed PBNA dashed lines. The horizontal distance between PS segments is 220 nm, which is defined by photoresist pattern. The vertical distance between PS segments is 120 nm, which is defined by electron beam lithography. The horizontal distance between PBNA dashed lines is about 110 nm, which is defined by photoresist pattern and segregation of polymer mixture. The vertical distance between PBNA dashed lines is 150 nm, which is defined by electron beam exposure.

Example 2A

Patterning after First Selective Removal. One Development Step after Exposure

Figure 7A:
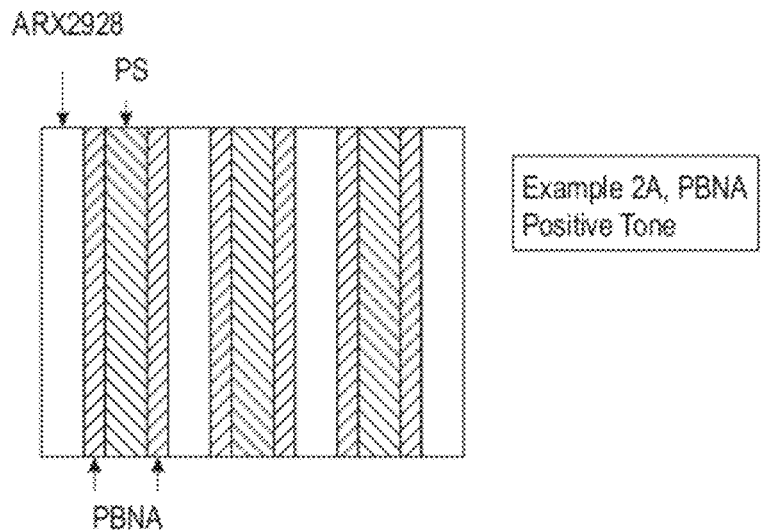
FIGS. 7A to 7D are schematic overhead views of the structures formed in Example 2A, an example of "patterning after first selective removal.
Figure 7B:
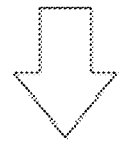
Figure 7B:
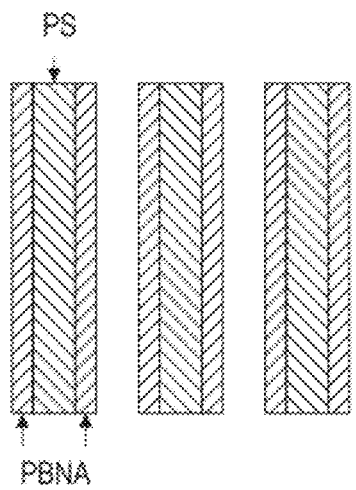
Figure 7B:
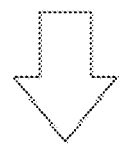
Figure 7C:
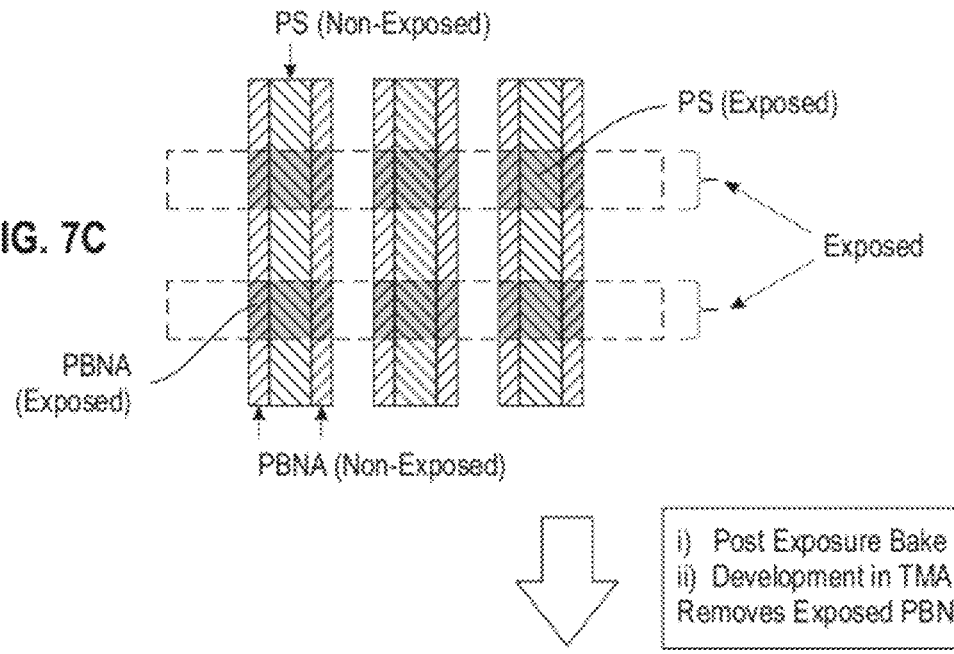
Figure 7D:
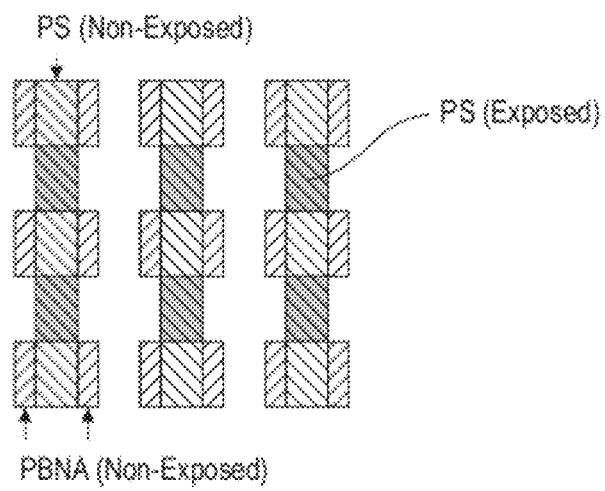
Figure 7E:
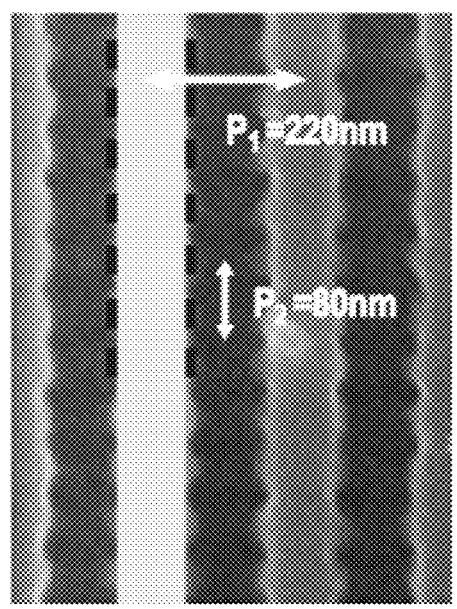
FIG. 7E is a scanning electron micrograph of the topographical pattern formed in Example 2A, which corresponds to the schematic overhead view in FIG. 7D.

FIGS. 7A to 7D are schematic overhead views of the patterns formed in this example, starting from the segregated structure prepared above. The segregated structure (FIG. 7A) was given a first development in TMAH developer in the step following segregation. The first development selectively removed the deprotected ARX2928 photoresist line pattern, forming the modified segregated structure of FIG. 7B. The modified segregated structure was then patternwise exposed to e-beam. In the exposure step, the sample was written with 100 keV electron beam at a dose of 1000 microCoulombs/cm$^2$, indicated by transparent horizontal bars (FIG. 7C). The PS was not crosslinked by this dosage. The exposed sample was then baked at 100° C. for 60 sec, deprotecting the regions of exposed PBNA. The exposed and baked sample was given a first post-exposure development in TMAH developer for 30 sec. The regions of exposed PBNA were removed by the TMAH development, resulting in the topographical pattern shown in FIG. 7D. The SEM image in FIG. 7E corresponds to the pattern of FIG. 7D. The SEM shows a PS stripe bordered by non-exposed PBNA dashed lines. The horizontal distance between PS stripes is 220 nm, which is defined by the photoresist pattern. The pitch (vertical distance) between the PBNA dashed lines is 80 nm, which is defined by the electron beam exposure.

Example 2B

Figure 8A:
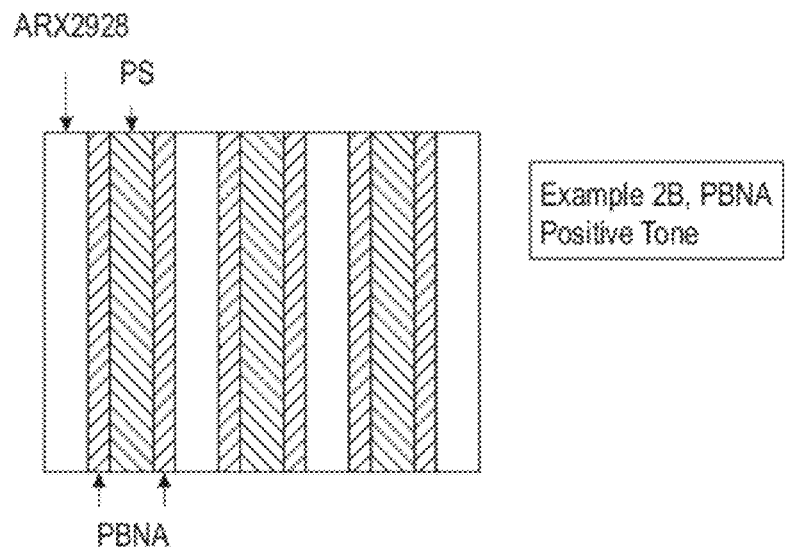
FIGS. 8A to 8E are schematic overhead views of the structures formed in Example 2B, another example of "patterning after first selective removal.
Figure 8A:
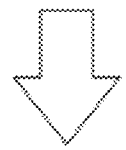
Figure 8B:
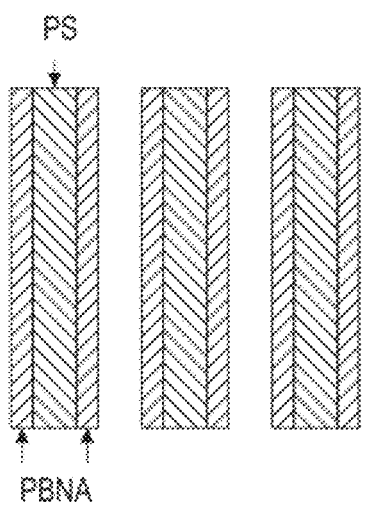
Figure 8B:
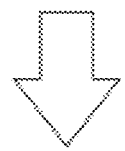
Figure 8C:
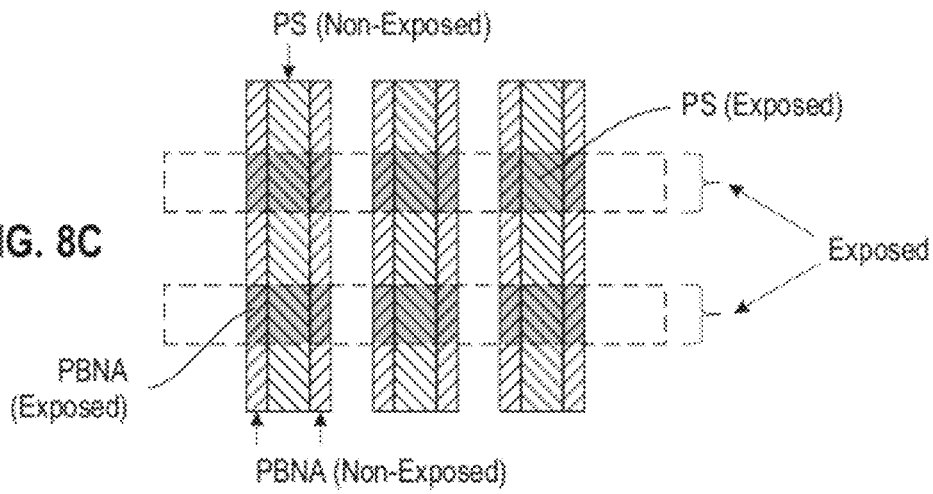
Figure 8D:
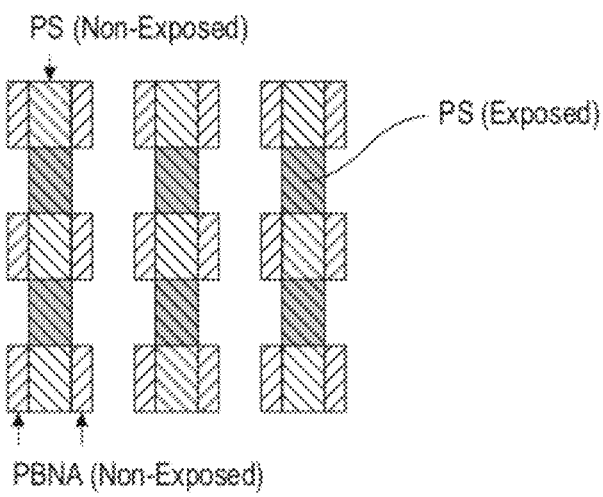
Figure 8E:
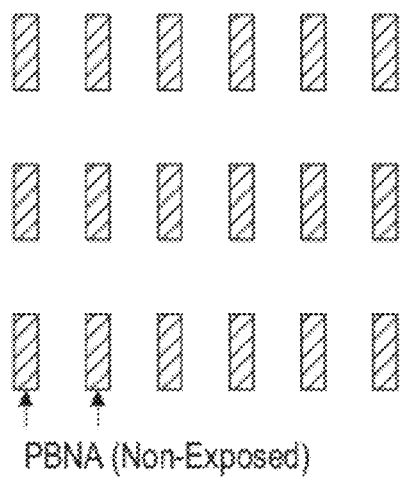
Figure 8F:
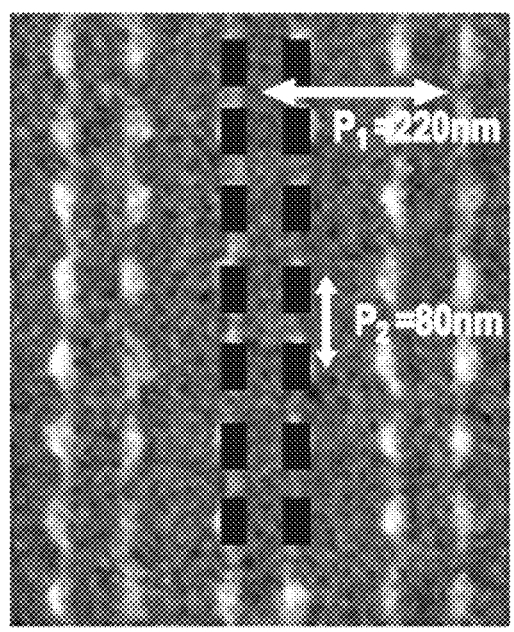
FIG. 8F is a scanning electron micrograph of the second pattern of topographical features formed in Example 2B, which corresponds to the schematic overhead view in FIG. 8E.

Patterning after First Selective Removal. Two Development Steps after Exposure FIGS. 8A to 8E are schematic overhead views of the patterns formed in this example, starting from the segregated structure prepared above. The segregated structure (FIG. 8A) was given a first development in TMAH in the step following segregation. The first development selectively removes the ARX2928 photoresist line pattern to form the modified segregated structure in FIG. 8B. The exposure process was applied to the modified segregated structure after the first selective removal step. In the exposure step, the sample was written with 100 keV electron beam at a dose of 1000 microCoulombs/cm$^2$, indicated by transparent horizontal bars (FIG. 8C). The exposed sample was then baked at 100° C. for 60 sec, and given a first post-exposure development in TMAH developer for 30 sec. The deprotected regions of exposed PBNA were removed by the TMAH development, forming a first topographical pattern of FIG. 8D. The sample was then given a second post-exposure development with cyclohexane, which selectively removed the exposed and non-exposed PS domain to form a second topographical pattern shown in FIG. 8E. FIG. 8F is an SEM image of the sample, which corresponds to the second topographical pattern of FIG. 8E. The SEM shows a pattern of non-exposed PBNA dashed lines. The horizontal distance between the PBNA dashed lines is about 110 nm, which is defined by photoresist line pattern and the segregation of polymer mixture. The vertical distance between PBNA dashed lines is about 100 nm, which is defined by electron beam exposure.

Example 3

Patterning on Spacers after Second Selective Removal

Figure 9C:
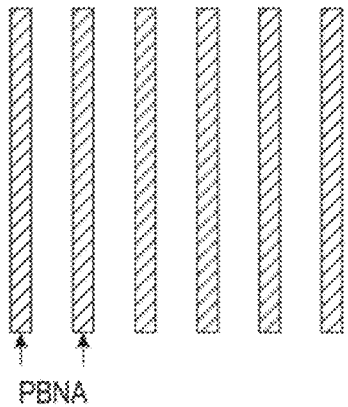
Figure 9C:
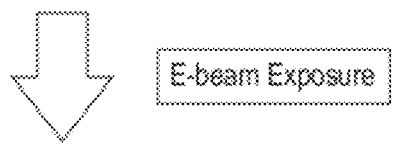
Figure 9D:
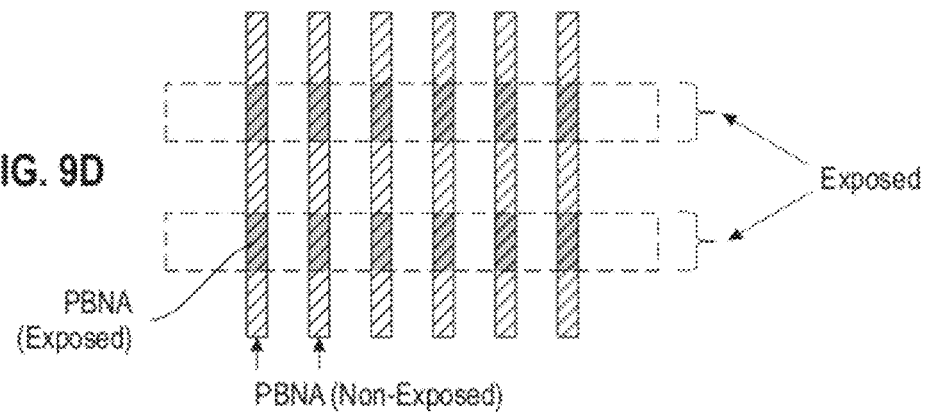
Figure 9D:
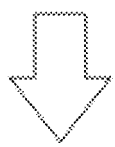
Figure 9E:
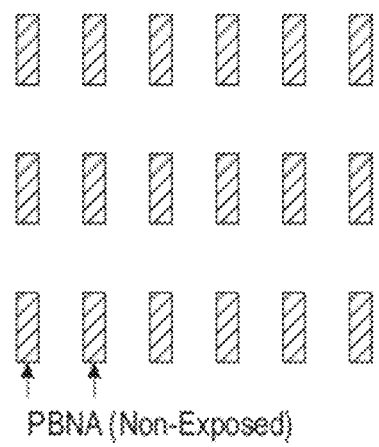
Figure 9F:
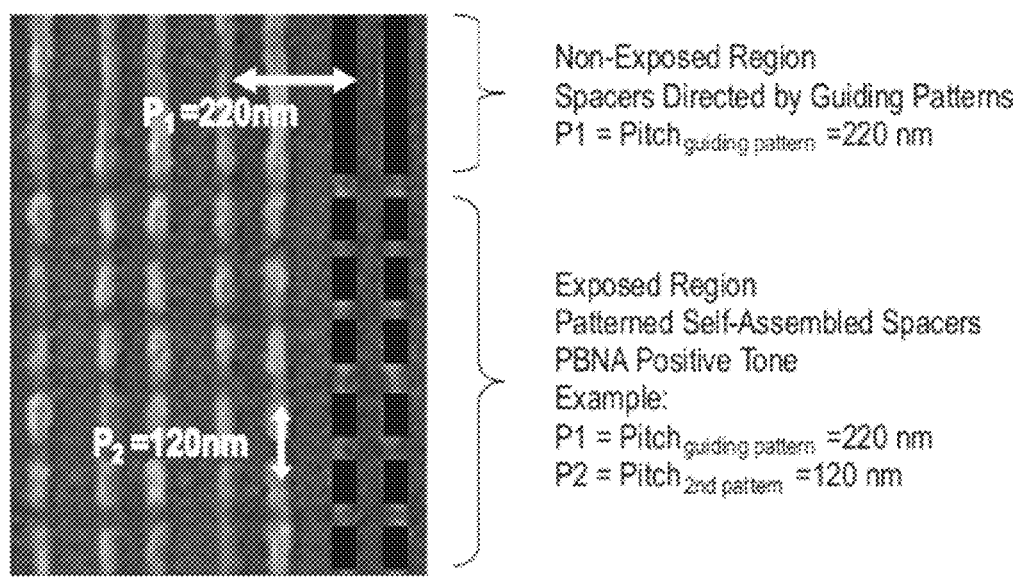
FIG. 9F is a scanning electron micrograph of the pattern of topographical features formed in Example 3, which corresponds to the schematic overhead view of FIG. 9E. The SEM additionally shows a portion of the PBNA line-space pattern that was outside the exposed region of the sample.

FIGS. 9A to 9E are schematic overhead views of the patterns formed in this example, starting from the segregated structure prepared above. The segregated structure (FIG. 9A) was given a first development in TMAH in the step following segregation, which selectively removed the ARX2928 photoresist line pattern to form the pattern of FIG. 9B. The first developed structure was then developed in cyclohexane. This second development selectively removed the PS domain, resulting in the modified segregated structure of FIG. 9C having a spacer pattern of PBNA. The modified segregated structure was then exposed. In the exposure step, the sample was written with 100 keV electron beam at a dose of 1000 microCoulombs/cm$^2$, indicated by transparent horizontal bars (FIG. 9D). The exposed sample was baked at 100° C. for 60 sec, deprotecting the regions of exposed PBNA. The exposed structure was then given a post-exposure development in TMAH developer for 30 sec. The regions of exposed PBNA domain were removed by the TMAH development, resulting in the topographical pattern of FIG. 9E. FIG. 9F is an SEM image of the sample corresponding to FIG. 9E. The upper region in the SEM image in FIG. 9 is not exposed by electron beam and shows self-segregated PBNA spacers (long lines). The lower region in the SEM image shows an array of exposed PBNA dashed lines. The horizontal distance between PBNA is about 110 nm, which is defined by photoresist pattern and segregation of the polymer mixture. The vertical distance between PBNA segments is 120 nm, which is defined by the electron beam exposure.

In the above non-limiting examples, the lithographic patterning process was applied to the entire polymer coated face of the segregated structure. The structure obtained after lithographic patterning could comprise the following five different materials: i) the photoresist element, ii) exposed first polymer domain, iii) non-exposed first polymer domain, iv) exposed second polymer domain, or v) non-exposed second polymer domain. Given that each of these five materials can either be present or not present after the patterning process, then up to 32 (2^5) theoretical compositional variations of topographical features are possible using the above patterning process. Some of these combinations (e.g., retaining all of the five listed materials, or none of the five listed materials) can be less desirable when the methods are applied to the entire coated face of the segregated structure. However, retaining all of the five materials or none of the five materials in a local area of the final patterned structure can be desirable, for example, as a block-out process, similar to a block-out photoresist that selectively masks or unmasks areas of a support member (e.g., silicon wafer). Such schemes can be useful in the fabrication of lithographically large features, and might not necessarily involve formation of lithographically fine features. Thus, the final patterned structure can comprise areas that have none or all of the five listed materials, while other areas contain different combinations of the five listed materials.

Table 2 lists possible exposure/development process permutations of the methods of forming topographical patterns using the segregated structure of Examples 1A, 1B, 2A, 2B, and 3. The following conditions limit the number of permutations: i) the segregated structure has two polymer domains, a first polymer domain and a second polymer domain, ii) the segregated structure has a photoresist element that is not lithographically patterned but can be selectively removed in a development process, iii) each permutation utilizes one patternwise exposure, iv) each permutation can independently have 0 to 2 development processes prior to the patternwise exposure, iv) each permutation can independently have 1 to 2 development processes after the patternwise exposure, and v) a given development process removes all or none of the exposed regions and/or the non-exposed regions of a polymer domain. The selectively removed components in each development process are listed in Table 2 below the development process. A blank cell under a development process indicates the development process is omitted. The components are defined in the following legend. The permutation corresponding to each of the examples 1A, 1B, 2A, 2B, and 3 is also indicated next to the permutation number.

R=Photoresist element
1=First polymer domain (before patternwise exposure)
1e=Exposed first polymer domain
1u=Non-exposed first polymer domain
2=Second polymer domain (before patternwise exposure)
2e=Exposed second polymer domain
2u=Non-exposed second polymer domain
1p=Indicates positive tone behavior of the first polymer domain. Material removed from exposed (e) region.
1n=Indicates negative tone behavior of first polymer domain. Material removed from non-exposed (u) region.
2p=Indicates positive tone behavior of second polymer domain. Material removed from exposed (e) region.
2n=Indicates negative tone behavior of second polymer domain. Material removed from non-exposed (u) region.

TABLE 2

| Permutation # (Example) | Development Processes Before Patternwise Exposure | | Development Processes After Patternwise Exposure | | Patterned Structure Contains | Positive/ Negative Tone Behavior |
|---|---|---|---|---|---|---|
| | 1st Process Removes | 2nd Process Removes | 1st Process Removes | 2nd Process Removes | | |
| 1  |   |   | 1e          |          | R, 1u, 2e, 2u | 1p     |
| 2  |   |   | 1u          |          | R, 1e, 2e, 2u | 1n     |
| 3  |   |   | 2e          |          | R, 1e, 1u, 2u | 2p     |
| 4  |   |   | 2u          |          | R, 1e, 1u, 2e | 2n     |
| 5  |   |   | 1e, 2e      |          | R, 1u, 2u     | 1p, 2p |
| 6  |   |   | 1u, 2e      |          | R, 1e, 2u     | 1n, 2p |
| 7  |   |   | 1e, 2u      |          | R, 1u, 2e     | 1p, 2n |
| 8  |   |   | 1u, 2u      |          | R, 1e, 2e     | 1n, 2n |
| 9  |   |   | 2e, 2u, 1e  |          | R, 1u         | 1p     |
| 10 |   |   | 2e, 2u, 1u  |          | R, 1e         | 1n     |
| 11 |   |   | 1e          | 2e, 2u   | R, 1u         | 1p     |
| 12 |   |   | 1u          | 2e, 2u   | R, 1e         | 1n     |
| 13 | 2 |   | 1e          |          | R, 1u         | 1p     |
| 14 | 2 |   | 1u          |          | R, 1e         | 1n     |
| 17 |   |   | 2e          | 1e, 1u   | R, 2u         | 2p     |
| 18 |   |   | 2u          | 1e, 1u   | R, 2e         | 2n     |
| 19 | 1 |   | 2e          |          | R, 2u         | 2p     |
| 20 | 1 |   | 2u          |          | R, 2e         | 2n     |
| 21 |   |   | 1e          | 2u       | R, 1u, 2e     | 1p, 2n |
| 22 |   |   | 1e          | 2e       | R, 1u, 2u     | 1p, 2p |
| 23 |   |   | 1u          | 2u       | R, 1e, 2e     | 1n, 2n |
| 24 |   |   | 1u          | 2e       | R, 1e, 2u     | 1n, 2p |
| 25 |   |   | 2e          | 1u       | R, 1e, 2u     | 1n, 2p |
| 26 |   |   | 2e          | 1e       | R, 1u, 2u     | 1p, 2p |
| 27 |   |   | 2u          | 1u       | R, 1e, 2e     | 1n, 2n |
| 28 |   |   | 2u          | 1e       | R, 1u, 2e     | 1p, 2n |
| 29 |   |   | 1e          | R        | 1u, 2e, 2u    | 1p     |
| 30 |   |   | 1u          | R        | 1e, 2e, 2u    | 1n     |
| 31 |   |   | 2e          | R        | 1e, 1u, 2u    | 2p     |
| 32 |   |   | 2u          | R        | 1e, 1u, 2e    | 2n     |
| 33 |   |   | 1e, 2e      | R        | 1u, 2u        | 1p, 2p |
| 34 |   |   | 1u, 2e      | R        | 1e, 2u        | 1n, 2p |
| 35 |   |   | 1e, 2u      | R        | 1u, 2e        | 1p, 2n |
| 36 |   |   | 1u, 2u      | R        | 1e, 2e        | 1n, 2n |
| 37 |   |   | 1e          | 2u, R    | 1u, 2e        | 1p, 2n |
| 38 |   |   | 1e          | 2e, R    | 1u, 2u        | 1p, 2p |
| 39 |   |   | 1u          | 2u, R    | 1e, 2e        | 1n, 2n |
| 40 |   |   | 1u          | 2e, R    | 1e, 2u        | 1n, 2p |
| 41 |   |   | 2e          | 1u, R    | 1e, 2u        | 1n, 2p |
| 42 |   |   | 2e          | 1e, R    | 1u, 2u        | 1p, 2p |
| 43 |   |   | 2u          | 1u, R    | 1e, 2e        | 1n, 2n |
| 44 |   |   | 2u          | 1e, R    | 1u, 2e        | 1p, 2n |
| 45 |   |   | 2e, 2u, 1e  | R        | 1u            | 1p     |
| 46 |   |   | 2e, 2u, 1u  | R        | 1e            | 1n     |
| 47 |   |   | 1e          | 2e, 2u, R | 1u           | 1p     |
| 48 |   |   | 1u          | 2e, 2u, R | 1e           | 1n     |
| 49 | 2 |   | 1e          | R        | 1u            | 1p     |
| 50 | 2 |   | 1u          | R        | 1e            | 1n     |
| 51 |   |   | 1e, 1u, 2e  | R        | 2u            | 2p     |
| 52 |   |   | 1e, 1u, 2u  | R        | 2e            | 2n     |
| 53 |   |   | 2e          | 1e, 1u, R | 2u           | 2p     |
| 54 |   |   | 2u          | 1e, 1u, R | 2e           | 2n     |
| 55 | 1 |   | 2e          | R        | 2u            | 2p     |
| 56 | 1 |   | 2u          | R        | 2e            | 2n     |
| 57 (Ex. 1A) |   |   | 1e, R     |          | 1u, 2e, 2u    | 1p     |
| 58 |   |   | 1u, R       |          | 1e, 2e, 2u    | 1n     |
| 59 |   |   | 2e, R       |          | 1e, 1u, 2u    | 2p     |
| 60 |   |   | 2u, R       |          | 1e, 1u, 2e    | 2n     |
| 61 |   |   | 1e, 2e, R   |          | 1u, 2u        | 1p, 2p |
| 62 |   |   | 1u, 2e, R   |          | 1e, 2u        | 1n, 2p |
| 63 |   |   | 1e, 2u, R   |          | 1u, 2e        | 1p, 2n |
| 64 |   |   | 1u, 2u, R   |          | 1e, 2e        | 1n, 2n |
| 65 (Ex. 1B) |   |   | 1e, R     | 2u       | 1u, 2e        | 1p, 2n |
| 66 |   |   | 1e, R       | 2e       | 1u, 2u        | 1p, 2p |
| 67 |   |   | 1u, R       | 2u       | 1e, 2e        | 1n, 2n |
| 68 |   |   | 1u, R       | 2e       | 1e, 2u        | 1n, 2p |
| 69 |   |   | 2e, R       | 1u       | 1e, 2u        | 1n, 2p |
| 70 |   |   | 2e, R       | 1e       | 1u, 2u        | 1p, 2p |
| 71 |   |   | 2u, R       | 1u       | 1e, 2e        | 1n, 2n |
| 72 |   |   | 2u, R       | 1e       | 1u, 2e        | 1p, 2n |
| 73 |   |   | 2e, 2u, 1e, R |        | 1u            | 1p     |
| 74 |   |   | 2e, 2u, 1u, R |        | 1e            | 1n     |
| 75 |   |   | 1e, R       | 2e, 2u   | 1u            | 1p     |

TABLE 2-continued

| Permutation # (Example) | Development Processes Before Patternwise Exposure | | Development Processes After Patternwise Exposure | | Patterned Structure Contains | Positive/ Negative Tone Behavior |
|---|---|---|---|---|---|---|
| | 1st Process Removes | 2nd Process Removes | 1st Process Removes | 2nd Process Removes | | |
| 76 | | | 1u, R | 2e, 2u | 1e | 1n |
| 77 | 2 | | 1e, R | | 1u | 1p |
| 78 | 2 | | 1u, R | | 1e | 1n |
| 79 | | | 1e, 1u, 2e, R | | 2u | 2p |
| 80 | | | 1e, 1u, 2u, R | | 2e | 2n |
| 81 | | | 2e, R | 1e, 1u | 2u | 2p |
| 82 | | | 2u, R | 1e, 1u | 2e | 2n |
| 83 | 1 | | 2e, R | | 2u | 2p |
| 84 | 1 | | 2u, R | | 2e | 2n |
| 85 (Ex. 2A) | R | | 1e | | 1u, 2e, 2u | 1p |
| 86 | R | | 1u | | 1e, 2e, 2u | 1n |
| 87 | R | | 2e | | 1e, 1u, 2u | 2p |
| 88 | R | | 2u | | 1e, 1u, 2e | 2n |
| 89 | R | | 1e, 2e | | 1u, 2u | 1p, 2p |
| 90 | R | | 1u, 2e | | 1e, 2u | 1n, 2p |
| 91 | R | | 1e, 2u | | 1u, 2e | 1p, 2n |
| 92 | R | | 1u, 2u | | 1e, 2e | 1n, 2n |
| 93 | R | | 1e | 2u | 1u, 2e | 1p, 2n |
| 94 | R | | 1e | 2e | 1u, 2u | 1p, 2p |
| 95 | R | | 1u | 2u | 1e, 2e | 1n, 2n |
| 96 | R | | 1u | 2e | 1e, 2u | 1n, 2p |
| 97 | R | | 2e | 1u | 1e, 2u | 1n, 2p |
| 98 | R | | 2e | 1e | 1u, 2u | 1p, 2p |
| 99 | R | | 2u | 1u | 1e, 2e | 1n, 2n |
| 100 | R | | 2u | 1e | 1u, 2e | 1p, 2n |
| 101 | R | | 2e, 2u, 1e | | 1u | 1p |
| 102 | R | | 2e, 2u, 1u | | 1e | 1n |
| 103 (Ex. 2B) | R | | 1e | 2e, 2u | 1u | 1p |
| 104 | R | | 1u | 2e, 2u | 1e | 1n |
| 105 | 2, R | | 1e | | 1u | 1p |
| 106 | 2, R | | 1u | | 1e | 1n |
| 107 | R | | 1e, 1u, 2e | | 2u | 2p |
| 108 | R | | 1e, 1u, 2u | | 2e | 2n |
| 109 | R | | 2e | 1e, 1u | 2u | 2p |
| 110 | R | | 2u | 1e, 1u | 2e | 2n |
| 111 | 1, R | | 2e | | 2u | 2p |
| 112 | 1, R | | 2u | | 2e | 2n |
| 113 | R | 1 | 2e | | 2u | 2p |
| 114 | R | 1 | 2u | | 2e | 2n |
| 115 (Ex. 3) | R | 2 | 1e | | 1u | 1p |
| 116 | R | 2 | 1u | | 1e | 1n |
| 117 | 1 | R | 2e | | 2u | 2p |
| 118 | 1 | R | 2u | | 2e | 2n |
| 119 | 2 | R | 1e | | 1u | 1p |
| 120 | 2 | R | 1u | | 1e | 1n |

As an example of how to read Table 2, permutation 45 utilizes no development process before the patternwise exposure. The first development process following the patternwise exposure (and optional post-exposure bake), selectively removes the exposed regions and the non-exposed regions of second polymer domain (2e, 2u) and the exposed regions of first polymer domain (1e). A second development process after exposure selectively removes the photoresist element (R). The final patterned structure contains topographical features comprising non-exposed regions of first polymer domain (1u). The first polymer domain in this permutation exhibits positive tone behavior (1p).

Each permutation of Table 2 represents a particular embodiment of the above described methods. In each of the permutations at least one of the two polymer domains formed by segregation of the polymer mixture is lithographically patternable. Table 2 also shows that a given pattern of topographical features can potentially be formed by one or more of the permutations, depending on the number of development steps before and after exposure, the susceptibility of any of the listed components to a given development process, the positive tone or negative tone behavior of each of the polymer domains, and the lithographic patternability of the first and/or the second polymer domain under a given set of exposure and development conditions.

Additional permutations are possible, for example, by allowing the photoresist element to be lithographically patternable. Moreover, additional permutations are possible by allowing for partial development of the exposed and/or the non-exposed regions of the first polymer domain, the second polymer domain, and/or the photoresist element. Topographical features having the same composition but different thickness (i.e., height above the support member), introduces additional complexity to the final patterned structure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/ or components, but do not preclude the presence or addition of one or more other features, integers, steps, operations, elements, components, and/or groups thereof. When a range is used to express a possible value using two numerical limits X and Y (e.g., a concentration of X ppm to Y ppm), unless otherwise stated the value can be X, Y, or any number between X and Y.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and their practical application, and to enable others of ordinary skill in the art to understand the invention.

What is claimed is:

1. A method, comprising:
   providing a pre-patterned structure comprising i) a support member having a surface and ii) an element for topographically guiding segregation of a polymer mixture including a first polymer and a second polymer, the element comprising a feature having a sidewall adjoined to the surface;
   disposing the polymer mixture on the pre-patterned structure, wherein the disposed polymer mixture has contact with the sidewall and the surface;
   segregating, in a plane parallel to the surface, the first polymer and the second polymer, thereby forming a segregated structure comprising a first polymer domain and a second polymer domain; and
   lithographically patterning the first polymer domain and/or the second polymer domain, thereby forming topographical features comprising at least one of i) a first feature comprising a lithographically patterned first polymer domain and ii) a second feature comprising a lithographically patterned second polymer domain.

2. The method of claim 1, wherein said lithographically patterning does not remove the element.

3. The method of claim 1, wherein said lithographically patterning removes the element.

4. The method of claim 1, wherein the first polymer and the second polymer are immiscible with respect to each other.

5. The method of claim 1, further comprising, prior to said lithographically patterning, selectively removing from the segregated structure at least one of the element, the first polymer domain, and the second polymer domain, thereby forming a modified segregated structure, wherein the modified segregated structure comprises the first polymer domain and/or the second polymer domain.

6. The method of claim 1, further comprising transferring a pattern formed by the topographical features to the support member.

7. The method of claim 1, wherein the element for topographically guiding segregation comprises a photoresist.

8. The method of claim 1, wherein the sidewall comprises a first material, wherein a selective chemical affinity of the first polymer for the first material is greater than a selective chemical affinity of the second polymer for the first material.

9. The method of claim 8, wherein the first polymer domain of the segregated structure is in contact with the sidewall, and the second polymer domain of the segregated structure has substantially no contact with the sidewall.

10. The method of claim 1, wherein the element comprises a grating, the grating comprising line features that are substantially parallel to each other.

11. The method of claim 1, wherein said lithographically patterning comprises i) patternwise exposing the segregated structure, thereby forming an exposed structure, ii) optionally baking the exposed structure, and iii) imagewise developing the exposed structure in one post-exposure development process, thereby forming the topographical features.

12. The method of claim 11, wherein the one post-exposure development process selectively removes exposed regions of the first polymer domain and the element, thereby producing the topographical features.

13. The method of claim 1, wherein said lithographically patterning comprises i) patternwise exposing the segregated structure, thereby forming an exposed structure, ii) optionally baking the exposed structure, iii) selectively removing in a first post-exposure development process exposed regions of the first polymer domain, and iv) selectively removing in a second post-exposure development process non-exposed regions of the second polymer domain, thereby forming the topographical features.

14. The method of claim 13, wherein the first post-exposure development process selectively removes exposed regions of the first polymer domain or non-exposed regions of the first polymer domain, and the second post-exposure development process selectively removes exposed regions of the second polymer domain and non-exposed regions of the second polymer domain.

15. The method of claim 1, wherein said lithographically patterning comprises patternwise exposing the segregated structure using electron beam or photon irradiation.

16. The method of claim 1, wherein the first polymer is a (meth)acrylate polymer.

17. The method of claim 16, wherein the (meth)acrylate polymer is a copolymer comprising a first repeat unit of the Formula (1):

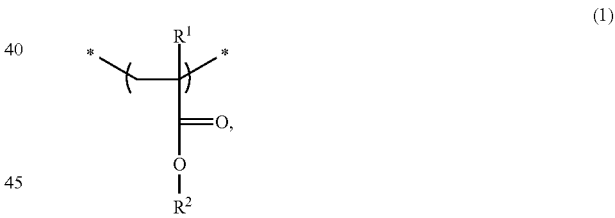

wherein $R^1$ is a hydrogen or a methyl group, and $R^2$ is a monovalent radical comprising one or more silicon atoms.

18. The method of claim 17, wherein $R^2$ is selected from the group consisting of

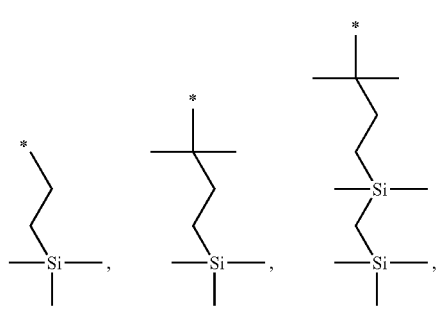

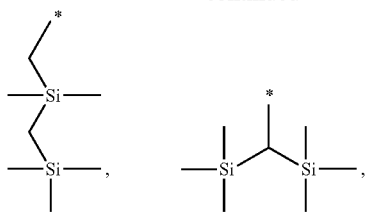

and combinations thereof.

19. The method of claim 16, wherein the (meth)acrylate copolymer comprises a second repeat unit of the Formula (2):

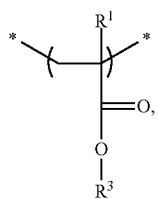

(2)

wherein $R^1$ is a hydrogen or a methyl group, and $R^3$ is a monovalent radical comprising one or more lactone rings.

20. The method of claim 19, wherein the one or more lactone rings is selected from the group consisting of gamma-butyrolactones, delta-valerolactones, and epsilon-caprolactones.

21. The method of claim 19, wherein $R^3$ is selected from the group consisting of:

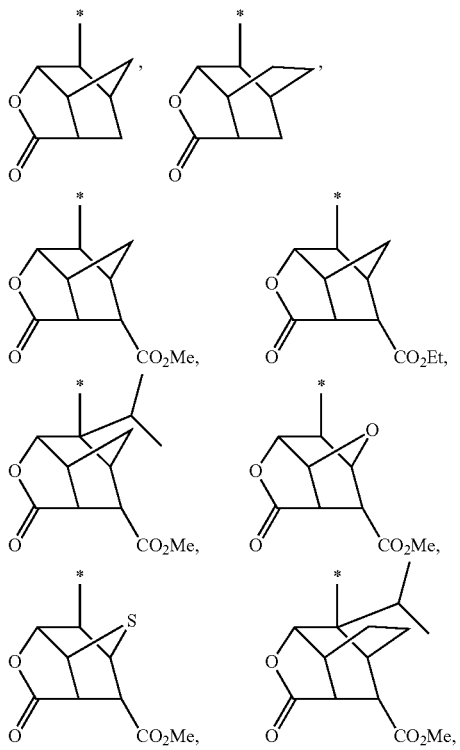

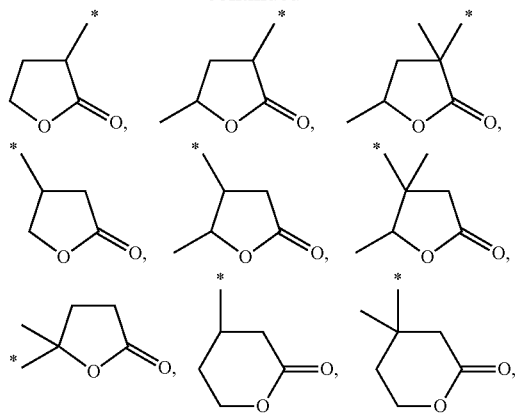

and combinations thereof.

22. The method of claim 1, wherein the first polymer is a random copolymer comprising a first repeat unit having the structure

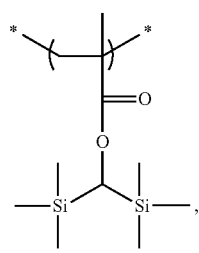

a second repeat unit having the structure

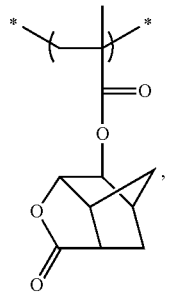

and a third repeat unit having the structure

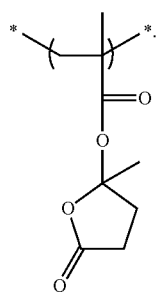

23. The method of claim 1, wherein more than 50% of repeat units of the second polymer comprise a side chain aromatic ring attached to a backbone carbon.

24. The method of claim 1, wherein the second polymer is poly(styrene).

25. The method of claim 1, wherein the polymer mixture comprises a photoacid generator.

26. A method, comprising:
providing a pre-patterned structure comprising i) a support member having a surface and ii) a photoresist element for topographically guiding segregation of a polymer mixture, the polymer mixture comprising a first polymer and a second polymer, wherein a) the photoresist element is disposed on a portion of the support member, b) the photoresist element comprises a feature having a sidewall, and c) the sidewall adjoins the surface;
disposing the polymer mixture on the pre-patterned structure, wherein the polymer mixture has contact with the sidewall and the surface;
segregating, in a plane parallel to the surface, the first polymer and the second polymer, thereby forming a segregated structure comprising a first polymer domain and a second polymer domain;
selectively removing at least one of the photoresist element, the first polymer domain, and the second polymer domain, thereby forming a modified segregated structure, wherein the modified segregated structure comprises the first polymer domain and/or the second polymer domain; and
lithographically patterning the first polymer domain and/or the second polymer domain, thereby forming topographical features comprising at least one of i) a first feature comprising a lithographically patterned first polymer domain and ii) a second feature comprising a lithographically patterned second polymer domain.

27. The method of claim 26, wherein said selectively removing comprises one development process that removes the photoresist element.

28. The method of claim 26, wherein said selectively removing comprises developing the segregated structure in a first development process utilizing an aqueous base developer, thereby forming a first developed structure, and developing the first developed structure in a second development process utilizing an organic solvent developer, thereby forming the modified segregated structure.

29. The method of claim 28, wherein the first development process selectively removes the photoresist element, and the second development process selectively removes the first polymer domain or the second polymer domain.

30. The method of claim 28, wherein the first development process selectively removes the first polymer domain or the second polymer domain, and the second development process selectively removes the photoresist element.

31. The method of claim 26, wherein said lithographically patterning comprises i) patternwise exposing the modified segregated structure, thereby producing an exposed structure, ii) optionally baking the exposed structure, and iii) imagewise developing the exposed structure in one post-exposure development process, thereby forming the topographical features.

32. The method of claim 26, wherein said lithographically patterning comprises i) patternwise exposing the modified segregated structure, thereby producing an exposed structure, ii) optionally baking the exposed structure, and iii) imagewise developing the exposed structure using two post-exposure development processes, thereby forming the topographical features.

33. The method of claim 26, wherein said selectively removing does not remove the photoresist element, and said lithographically patterning does not remove the photoresist element.

34. A method, comprising:
disposing on a pre-patterned structure a polymer mixture comprising a first polymer and a second polymer, wherein the pre-patterned structure comprises i) a support member having a surface and ii) a photoresist element for topographically guiding segregation of the polymer mixture, wherein a) the element is disposed on a portion of the support member, b) the element comprises a feature having a sidewall, c) the sidewall is adjoined to the surface, d) the sidewall comprises a first material, and e) a selective chemical affinity of the first polymer for the first material is greater than a selective chemical affinity of the second polymer for the first material;
segregating in a plane parallel to the surface the first polymer and the second polymer, thereby forming a segregated structure, wherein i) the segregated structure comprises a first polymer domain and a second polymer domain, ii) the sidewall contacts the first polymer domain, and iii) the sidewall has substantially no contact with the second polymer domain;
selectively removing the photoresist element;
lithographically patterning the first polymer domain and/or the second polymer domain, thereby forming topographical features comprising at least one of i) a first feature comprising a lithographically patterned first polymer domain and ii) a second feature comprising a lithographically patterned second polymer domain; and
transferring a pattern formed by the topographical features to the support member.

35. A method, comprising:
disposing on a pre-patterned structure a polymer mixture comprising a first polymer and a second polymer, wherein the pre-patterned structure comprises i) a support member having a surface and ii) a photoresist element for topographically guiding segregation of the polymer mixture, wherein a) the element is disposed on a portion of the support member, b) the element comprises a feature having a sidewall, c) the sidewall is adjoined to the surface, d) the sidewall comprises a first material, and e) a selective chemical affinity of the first polymer for the first material is greater than a selective chemical affinity of the second polymer for the first material;
segregating, in a plane parallel to the surface, the first polymer and the second polymer, thereby forming a segregated structure, wherein i) the segregated structure comprises a first polymer domain and a second polymer domain, ii) the sidewall contacts the first polymer domain, and iii) the sidewall has substantially no contact with the second polymer domain;
selectively removing in a first development process the photoresist element;
selectively removing in a second development process the first polymer domain or the second polymer domain;
lithographically patterning the first polymer domain and/or the second polymer domain, thereby forming topographical features comprising at least one of i) a first feature comprising a lithographically patterned first polymer domain and ii) a second feature comprising a lithographically patterned second polymer domain; and
transferring a pattern formed by the topographical features to the support member.

36. A method, comprising:

disposing on a pre-patterned structure a polymer mixture comprising a first polymer and a second polymer, wherein the pre-patterned structure comprises i) a support member having a surface and ii) a photoresist element for topographically guiding segregation of the polymer mixture, wherein a) the element is disposed on a portion of the support member, b) the element comprises a feature having a sidewall, c) the sidewall is adjoined to the surface, d) the sidewall comprises a first material, and e) a selective chemical affinity of the first polymer for the first material is greater than a selective chemical affinity of the second polymer for the first material;

segregating, in a plane parallel to the surface, the first polymer and the second polymer, thereby forming a segregated structure, wherein i) the segregated structure comprises a first polymer domain and a second polymer domain, ii) the sidewall contacts the first polymer domain, and iii) the sidewall has substantially no contact with the second polymer domain;

selectively removing in a first development process the first polymer domain or the second polymer domain;

selectively removing in a second development process the photoresist element;

lithographically patterning the first polymer domain and/or the second polymer domain, thereby forming topographical features comprising at least one of i) a first feature comprising a lithographically patterned first polymer domain and ii) a second feature comprising a lithographically patterned second polymer domain; and transferring a pattern formed by the topographical features to the support member.

* * * * *